United States Patent
Yamazaki et al.

(10) Patent No.: US 10,372,274 B2
(45) Date of Patent: Aug. 6, 2019

(54) SEMICONDUCTOR DEVICE AND TOUCH PANEL

(71) Applicant: Semiconductor Energy Laboratory Co., Ltd., Atsugi-shi, Kanagawa-ken (JP)

(72) Inventors: Shunpei Yamazaki, Tokyo (JP); Hajime Kimura, Kanagawa (JP); Masami Jintyou, Tochigi (JP); Yasuharu Hosaka, Tochigi (JP); Naoto Goto, Tochigi (JP); Takahiro Iguchi, Tochigi (JP); Daisuke Kurosaki, Tochigi (JP); Junichi Koezuka, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 558 days.

(21) Appl. No.: 15/091,295

(22) Filed: Apr. 5, 2016

(65) Prior Publication Data

US 2016/0299601 A1 Oct. 13, 2016

(30) Foreign Application Priority Data

Apr. 13, 2015 (JP) .................................. 2015-081455

(51) Int. Cl.
*G06F 3/044* (2006.01)
*H01L 27/12* (2006.01)
(Continued)

(52) U.S. Cl.
CPC ............ *G06F 3/044* (2013.01); *G06F 3/0412* (2013.01); *H01L 27/124* (2013.01);
(Continued)

(58) Field of Classification Search
CPC ........... G06F 2203/04103; G06F 3/044; G06F 3/0412; H01L 27/1225; H01L 27/1255; H01L 27/323; H01L 29/24; H01L 29/78606; H01L 29/7869; H01L 29/78696
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.

(Continued)

*Primary Examiner* — LaTanya Bibbins
(74) *Attorney, Agent, or Firm* — Fish & Richardson P.C.

(57) ABSTRACT

A touch panel including an oxide semiconductor film having conductivity is provided. The touch panel includes a transistor, a second insulating film, and a touch sensor. The transistor includes a gate electrode; a gate insulating film; a first oxide semiconductor film; a source electrode and a drain electrode; a first insulating film; and a second oxide semiconductor film. The second insulating film is over the second oxide semiconductor film so that the second oxide semiconductor film is positioned between the first insulating film and the second insulating film. The touch sensor includes a first electrode and a second electrode. One of the first and second electrodes includes the second oxide semiconductor film.

19 Claims, 45 Drawing Sheets

(51) Int. Cl.
  *H01L 29/786* (2006.01)
  *H01L 29/24* (2006.01)
  *H01L 27/32* (2006.01)
  *G06F 3/041* (2006.01)
  *H01L 29/66* (2006.01)

(52) U.S. Cl.
  CPC ...... *H01L 27/1222* (2013.01); *H01L 27/1225* (2013.01); *H01L 27/1255* (2013.01); *H01L 27/323* (2013.01); *H01L 29/24* (2013.01); *H01L 29/66969* (2013.01); *H01L 29/7869* (2013.01); *H01L 29/78696* (2013.01); *G06F 2203/04103* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,859,521 B2 | 12/2010 | Hotelling et al. |
| 7,910,490 B2 | 3/2011 | Akimoto et al. |
| 7,920,129 B2 | 4/2011 | Hotelling et al. |
| 7,932,521 B2 | 4/2011 | Akimoto et al. |
| 7,995,041 B2 | 8/2011 | Chang |
| 8,217,913 B2 | 7/2012 | Hotelling et al. |
| 8,274,077 B2 | 9/2012 | Akimoto et al. |
| 8,363,027 B2 | 1/2013 | Hotelling et al. |
| 8,466,463 B2 | 6/2013 | Akimoto et al. |
| 8,502,799 B2 | 8/2013 | Hotelling et al. |
| 8,629,069 B2 | 1/2014 | Akimoto et al. |
| 8,669,550 B2 | 3/2014 | Akimoto et al. |
| 8,786,557 B2 | 7/2014 | Noguchi et al. |
| 8,790,959 B2 | 7/2014 | Akimoto et al. |
| 8,796,069 B2 | 8/2014 | Akimoto et al. |
| 9,099,562 B2 | 8/2015 | Akimoto et al. |
| 9,134,560 B2 | 9/2015 | Hotelling et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2012/0181533 A1* | 7/2012 | Yoo ..................... H01L 27/1248 257/43 |
| 2012/0299883 A1* | 11/2012 | Sumida ............... H01L 51/5275 345/204 |
| 2013/0270552 A1* | 10/2013 | Yamazaki ........... H01L 29/7869 257/43 |
| 2014/0055412 A1 | 2/2014 | Teramoto |
| 2014/0063368 A1 | 3/2014 | Yamazaki et al. |
| 2014/0267159 A1 | 9/2014 | Miyazaki et al. |
| 2015/0242041 A1* | 8/2015 | Sugita .................... G06F 3/044 345/174 |
| 2015/0248182 A1* | 9/2015 | Hsu ........................ G06F 3/041 345/174 |
| 2015/0255518 A1 | 9/2015 | Watanabe et al. |
| 2015/0301422 A1 | 10/2015 | Miyake et al. |
| 2015/0311260 A1 | 10/2015 | Senda et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |

(56) References Cited

FOREIGN PATENT DOCUMENTS

| | | |
|---|---|---|
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2009-244958 A | 10/2009 |
| JP | 2011-197685 A | 10/2011 |
| JP | 2014-044537 A | 3/2014 |
| JP | 2014-178847 A | 9/2014 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technial Digest of International Electron Devices Meeting, Dec. 5, 2005, pp 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn-O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters) , Sep. 13, 2004, vol. 85, No. 11, 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW'02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Pastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using AMorphous In—Ga—Zn-Oxide TFTs,", IDS '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

(56) References Cited

OTHER PUBLICATIONS

Park.S et al., "Challenge to Future Displays: Transparent AM-OLED Driven by Peald Grown ZnO TFT,", IMID '07 Digest, 2007, pp. 1249-1252.
Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.
Osada.T et al., "Development of Driver-Integrated Panel Using Amorphous In—Ga—Zn-Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivation Layer,", SID Digest '09 : SID International Sumposium Digest of Technical Papers, May 31, 2009, pp. 284-287.
Miyasaka.M, "Suftla Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applicatons,", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures over 100° C.,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters), 2005, vol. 87, pp. 122102-1-122102-3.
Oba.F et al., "Defect energetics in ZnO: A hybrid Hartree-Fock density functional study,", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW'08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317, ECS.
Clark.S et al., "First Principles Methods Using Castep,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

* cited by examiner electron beam is incident
in direction parallel
to sample surface electron beam is incident
in direction perpendicular
to sample surface

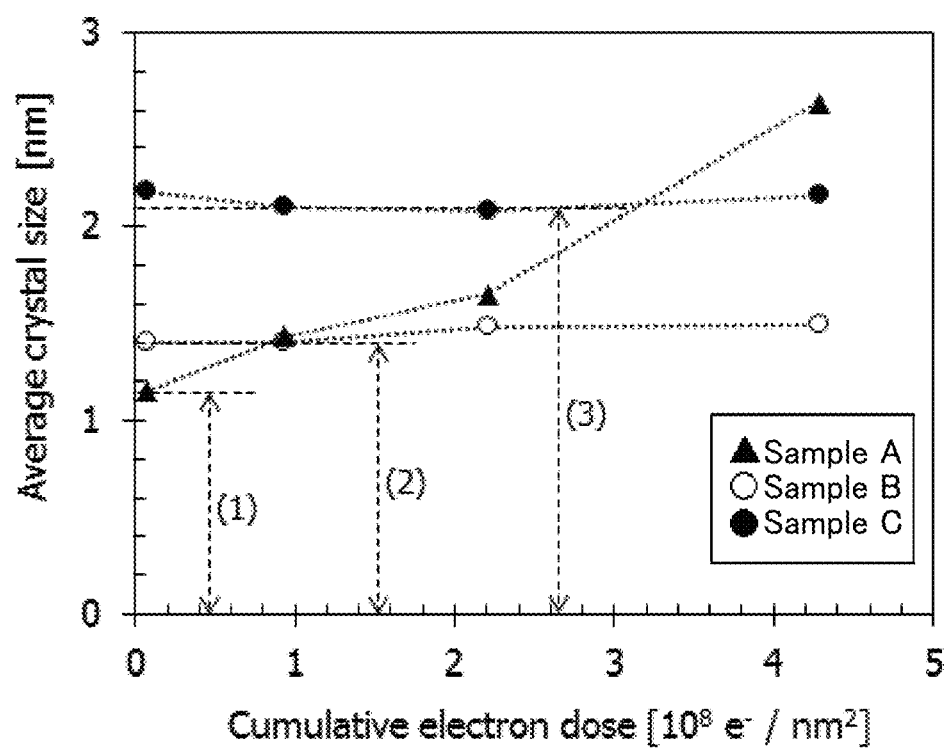

crystal structure of InMZnO$_4$

← cleavage plane

} particles

← cleavage plane

} particles

← cleavage plane

● In
◐ M or Zn
○ O

SEMICONDUCTOR DEVICE AND TOUCH PANEL

BACKGROUND OF THE INVENTION

1. Field of the Invention

One embodiment of the present invention relates to a semiconductor device. One embodiment of the present invention relates to a touch panel. One embodiment of the present invention relates to a display device. One embodiment of the present invention relates to an input/output device. One embodiment of the present invention relates to an input device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an input device, an input/output device, an electro-optical device, a power generation device (including a thin film solar cell, an organic thin film solar cell, and the like), and an electronic device may each include a semiconductor device.

2. Description of the Related Art

Transistors used for most flat panel displays typified by a liquid crystal display device and a light-emitting display device are formed using silicon semiconductors such as amorphous silicon, single crystal silicon, and polycrystalline silicon provided over glass substrates. Further, such a transistor employing such a silicon semiconductor is used in integrated circuits (ICs) and the like.

In recent years, attention has been drawn to a technique in which, instead of a silicon semiconductor, a metal oxide exhibiting semiconductor characteristics is used in transistors. Note that in this specification, a metal oxide exhibiting semiconductor characteristics is referred to as an oxide semiconductor. For example, such a technique is disclosed that a transistor is manufactured using zinc oxide or an In—Ga—Zn-based oxide as an oxide semiconductor and the transistor is used as a switching element or the like in a pixel of a display device (see Patent Documents 1 and 2). Various touch sensors have been developed (see Patent Documents 3 to 7).

REFERENCE

[Patent Document 1] Japanese Published Patent Application No. 2007-123861
[Patent Document 2] Japanese Published Patent Application No. 2007-96055
[Patent Document 3] Japanese Published Patent Application No. 2011-197685
[Patent Document 4] Japanese Published Patent Application No. 2014-44537
[Patent Document 5] Japanese Published Patent Application No. 2014-178847
[Patent Document 6] U.S. Pat. No. 7,920,129
[Patent Document 7] Japanese Published Patent Application No. 2009-244958

SUMMARY OF THE INVENTION

An object of one embodiment of the present invention is to provide a touch panel including an oxide semiconductor film having conductivity. Another object is to provide a touch panel having a simple structure. Another object is to provide a novel input device. Another object is to provide a novel input/output device.

One embodiment of the present invention is a semiconductor device including a transistor, a second insulating film, and a touch sensor. The transistor includes a gate electrode; a gate insulating film in contact with the gate electrode; a first oxide semiconductor film that is in contact with the gate insulating film and overlaps with the gate electrode; a source electrode and a drain electrode that are electrically connected to the first oxide semiconductor film; a first insulating film over the first oxide semiconductor film, the source electrode, and the drain electrode; and a second oxide semiconductor film that is over the first insulating film and overlaps with the first oxide semiconductor film. The second insulating film is over the second oxide semiconductor film so that the second oxide semiconductor film is positioned between the first insulating film and the second insulating film. The touch sensor includes a first electrode and a second electrode. One of the first and second electrodes includes a third oxide semiconductor film. The second oxide semiconductor film and the third oxide semiconductor film are formed in the same layer.

In the above semiconductor device, the thickness of each of the second oxide semiconductor film and the third oxide semiconductor film is preferably greater than or equal to 30 nm and less than or equal to 70 nm.

According to another embodiment of the present invention, in the above semiconductor device, the first oxide semiconductor film, the second oxide semiconductor film, and the third oxide semiconductor film are each an In-M-Zn oxide (M is Al, Ti, Ga, Y, Zr, La, Ce, Nd, Sn, or Hf).

According to another embodiment of the present invention, in the above semiconductor device, the first insulating film includes oxygen and the second insulating film includes hydrogen.

According to another embodiment of the present invention, the above semiconductor device further includes a capacitor that includes the second insulating film between a pair of electrodes. The capacitor transmits visible light, and one of the pair of electrodes of the capacitor includes the third oxide semiconductor film.

According to another embodiment of the present invention, in the above semiconductor device, the first and second electrodes each include the third oxide semiconductor film.

Another embodiment of the present invention is a touch panel including the above semiconductor device, a conductive film, and a liquid crystal element. The conductive film serves as a pixel electrode. The third oxide semiconductor film serves as a common electrode. The other of the pair of electrodes of the capacitor includes the conductive film.

Another embodiment of the present invention is a touch panel including the above semiconductor device and a light-emitting element. The light-emitting element includes a lower electrode, an upper electrode, and an EL layer positioned between the lower electrode and the upper electrode.

According to another embodiment of the present invention, in the above touch panel, the first and second electrodes each include the third oxide semiconductor film.

According to another embodiment of the present invention, in the above touch panel, the other of the first and second electrodes serves as the upper electrode.

Another embodiment of the present invention is an electronic device including the above semiconductor device, and a switch, a speaker, a display portion, or a housing.

Another embodiment of the present invention is an electronic device including the above touch panel, and a switch, a speaker, a display portion, or a housing.

According to one embodiment of the present invention, a touch panel including an oxide semiconductor film having conductivity, a touch panel having a simple structure, a novel input device, or a novel input/output device can be provided.

BRIEF DESCRIPTION OF THE DRAWINGS

FIG. 34 shows a change in crystal parts of an In—Ga—Zn oxide due to electron irradiation.

DETAILED DESCRIPTION OF THE INVENTION

Figure 1A:
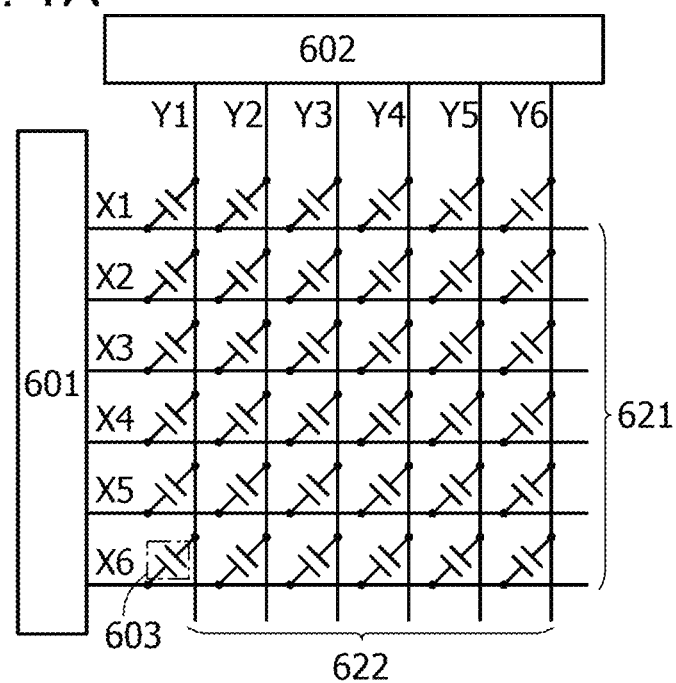
FIGS. 1A and 1B are a block diagram and a timing chart of a touch sensor of one embodiment.

Embodiments are described in detail with reference to the drawings. Note that the present invention is not limited to the description below, and it is easily understood by those skilled in the art that the mode and details can be variously changed without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and the description of such portions is not repeated. Furthermore, the same hatching pattern is applied to portions having similar functions, and the portions are not especially denoted by reference numerals in some cases.

Note that in each drawing referred to in this specification, the size, the layer thickness, or the region of each component is exaggerated for clarity in some cases. Therefore, embodiments of the present invention are not limited to such a scale.

In this specification and the like, ordinal numbers such as "first" and "second" are used in order to avoid confusion among components and do not limit the components numerically.

Note that the terms "film" and "layer" can be interchanged with each other in some cases. For example, in some cases, the term "conductive film" can be used instead of the term "conductive layer," and the term "insulating film" can be used instead of the term "insulating layer."

In this specification and the like, a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification and the like can be called an "insulator" in some cases. Similarly, an "insulator" in this specification and the like can be called a "semiconductor" in some cases.

In this specification and the like, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification and the like can be called a "conductor" in some cases. Similarly, a "conductor" in this specification and the like can be called a "semiconductor" in some cases.

Note that functions of a "source" and a "drain" of a transistor are sometimes replaced with each other when a transistor of opposite polarity is used or when the direction of current flowing is changed in circuit operation, for example. Therefore, the terms "source" and "drain" can be used to denote the drain and the source, respectively, in this specification.

In this specification and the like, patterning is assumed to be performed by a photolithography process. Note that the patterning is not limited to a photolithography process and processes other than the photolithography process can be employed. Further, a mask formed in the photolithography process is removed after etching treatment.

Embodiment 1

This embodiment describes driving methods, modes, structure examples of a touch sensor or a touch panel of one embodiment of the present invention and structure examples of a semiconductor device of one embodiment of the present invention with reference to drawings.

Example of Sensing Method of Sensor

FIG. 1A is a block diagram illustrating the structure of a mutual capacitive touch sensor. FIG. 1A illustrates a pulse voltage output circuit 601 and a current sensing circuit 602. In FIG. 1A, as an example, six wirings X1 to X6 represent electrodes 621 to which a pulse voltage is applied, and six wirings Y1 to Y6 represent electrodes 622 that sense changes in current. The number of such electrodes is not limited to those illustrated in this example. FIG. 1A also illustrates a capacitor 603 that is formed with the electrodes 621 and 622 overlapping with each other or being provided close to each other. Note that the functions of the electrodes 621 and 622 can be interchanged with each other.

The pulse voltage output circuit 601 is, for example, a circuit for sequentially applying a pulse voltage to the wirings X1 to X6. By applying a pulse voltage to the wirings X1 to X6, an electric field is generated between the electrodes 621 and 622 of the capacitors 603. With a pulse voltage, current flows through the capacitor 603. An electric field generated between the electrodes 621 and 622 is changed by being blocked, for example, when a finger or a stylus touches the touch sensor. That is, for example, by touch with a finger or a stylus, the capacitance of the capacitor 603 is changed. By utilizing the change in capacitance caused by touch with a finger or a stylus as described above, the approach or contact of an object can be detected.

The current sensing circuit 602 is a circuit for sensing changes in current flowing through the wirings Y1 to Y6 that are caused by the changes in capacitance of the capacitors 603. No change in the current values of the wirings Y1 to Y6 is sensed when there is no approach or contact of an object, whereas a decrease in the current value is sensed when capacitance is decreased owing to the approach or contact of an object. In order to sense a change in current, the total amount of current may be sensed. In that case, an integrator circuit or the like may be used to sense the total amount of current. Alternatively, the peak value of current may be sensed. In that case, current may be converted into voltage, and the peak value of voltage may be sensed.

Figure 1B:
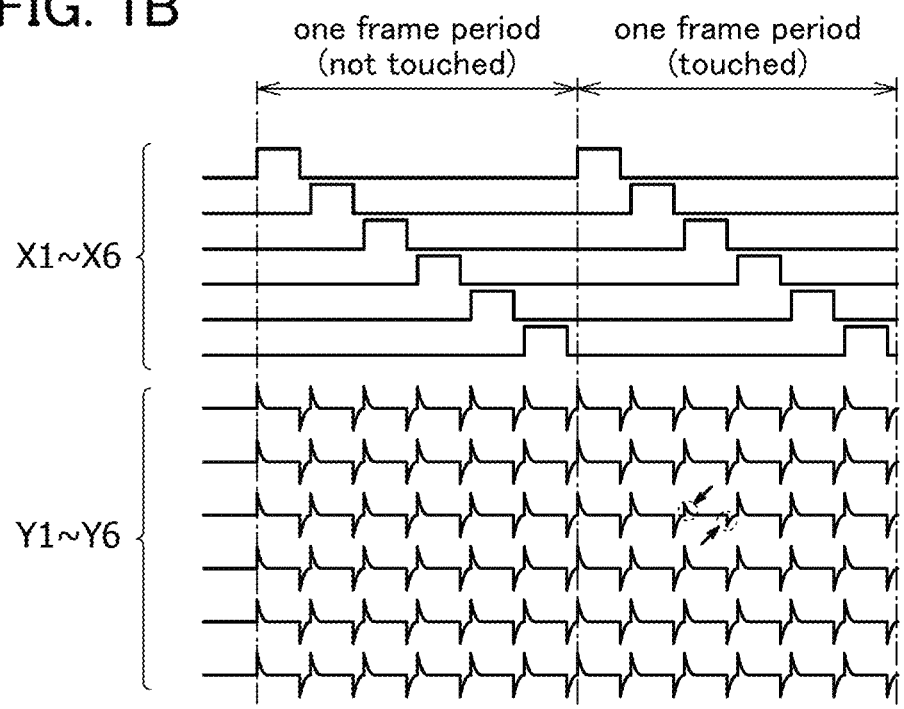

FIG. 1B is a timing chart showing input and output waveforms of the mutual capacitive touch sensor illustrated in FIG. 1A. In FIG. 1B, detection of an object is performed in all the rows and columns in one frame period. FIG. 1B shows a period during which an object is not detected (not touched) and a period during which an object is detected (touched). Sensed current values of the wirings Y1 to Y6 are shown as waveforms of voltage values. Note that a display panel performs display operation. The timing of the display operation in the display panel is preferably in synchronization with the timing of the sensing operation in the touch sensor. FIG. 1B shows an example in which these timings are not in synchronization.

A pulse voltage is sequentially applied to the wirings X1 to X6, and the waveforms of the wirings Y1 to Y6 change in accordance with the pulse voltage. When there is no approach or contact of an object, the waveforms of the wirings Y1 to Y6 change in accordance with changes in the voltages of the wirings X1 to X6. In contrast, the current value is decreased at the point of approach or contact of an object; accordingly, the waveform of the voltage value also changes.

By sensing a change in capacitance in this manner, the approach or contact of an object can be detected. Even when an object such as a finger or a stylus does not touch but only approaches a touch sensor or a touch panel, a signal may be sensed in some cases.

It is preferable that, as an example, the pulse voltage output circuit 601 and the current sensing circuit 602 be formed in one IC. For example, the IC is preferably mounted on a touch panel or a substrate in a housing of an electronic device. In the case where the touch panel has flexibility, parasitic capacitance might be increased in a bent portion of the touch panel, and the influence of noise might be increased. In view of this, it is preferable to use an IC to which a driving method less influenced by noise is applied. For example, it is preferable to use an IC to which a driving method capable of increasing a signal-noise ratio (S/N ratio) is applied.

Although FIG. 1A illustrates, as a touch sensor, the structure of a passive matrix touch sensor in which only the capacitor 603 is provided at the intersection of wirings, an active matrix touch sensor including a transistor and a capacitor may also be used.

Structure Example of In-Cell Touch Panel

An example in which at least one of electrodes included in a touch sensor is formed over a substrate provided with a display element, a transistor, and the like (hereinafter also referred to as an element substrate) is described below.

A structure example of a touch panel incorporating a touch sensor into a display portion including a plurality of pixels (i.e., an in-cell touch panel) is described below. An example in which a liquid crystal element is used as a display element provided in the pixel is described. However, one embodiment of the present invention is not limited thereto, and any of various display elements can be used.

Figure 2A:
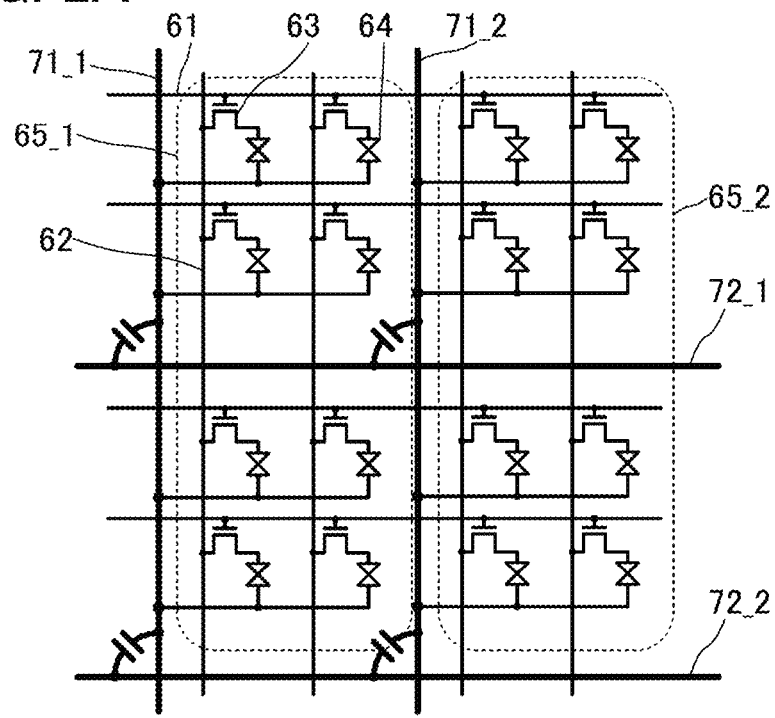
FIGS. 2A and 2B each illustrate pixels provided with a touch sensor of one embodiment.

FIG. 2A is an equivalent circuit diagram of part of a pixel circuit provided in a display portion of a touch panel in this structure example.

Each pixel includes at least a transistor 63 and a liquid crystal element 64. Each pixel further includes a storage capacitor in some cases. A gate of the transistor 63 is electrically connected to a wiring 61, and one of a source and a drain of the transistor 63 is electrically connected to a wiring 62.

The pixel circuit includes a plurality of wirings extending in the X direction (e.g., a wiring 72_1 and a wiring 72_2) and a plurality of wirings extending in the Y direction (e.g., a wiring 71_1 and a wiring 71_2). They are provided to intersect with each other, and capacitance is formed therebetween. The wirings 71_1 and 71_2 can be formed at the same time as one electrode of the liquid crystal element 64 by processing one conductive film. The wirings 72 can be provided over a substrate facing the element substrate (hereinafter referred to as a counter substrate). The wirings 72 may be provided over the element substrate.

For example, among the pixels provided in the pixel circuit, electrodes on one side of liquid crystal elements 64 of some pixels adjacent to each other are electrically connected to each other to form one block. For example, a plurality of linear blocks extending in the Y direction (e.g., a block 65_1 and a block 65_2) are formed here. Although only part of the pixel circuit is illustrated in FIG. 2A, these blocks are repeatedly arranged in the X direction.

With the above structure, the one electrode of the liquid crystal element in the pixel circuit can also serve as an electrode included in a touch sensor. In FIG. 2A, the wirings 71_1 and 71_2 each serve as the electrode included in the touch sensor as well as the one electrode of the liquid crystal element. In contrast, the wirings 72_1 and 72_2 each serve only as an electrode included in the touch sensor. In this manner, the structure of the touch panel can be simplified. Although the plurality of wirings extending in the Y direction (e.g., the wirings 71_1 and 71_2) each serve as the electrode included in the touch sensor as well as the one electrode of the liquid crystal element in FIG. 2A, one embodiment of the present invention is not limited thereto. For example, the plurality of wirings extending in the X direction (e.g., the wirings 72_1 and 72_2) may each serve as the electrode included in the touch sensor as well as the one electrode of the liquid crystal element. An example of a circuit diagram in that case is shown in FIG. 2B.

Figure 3:
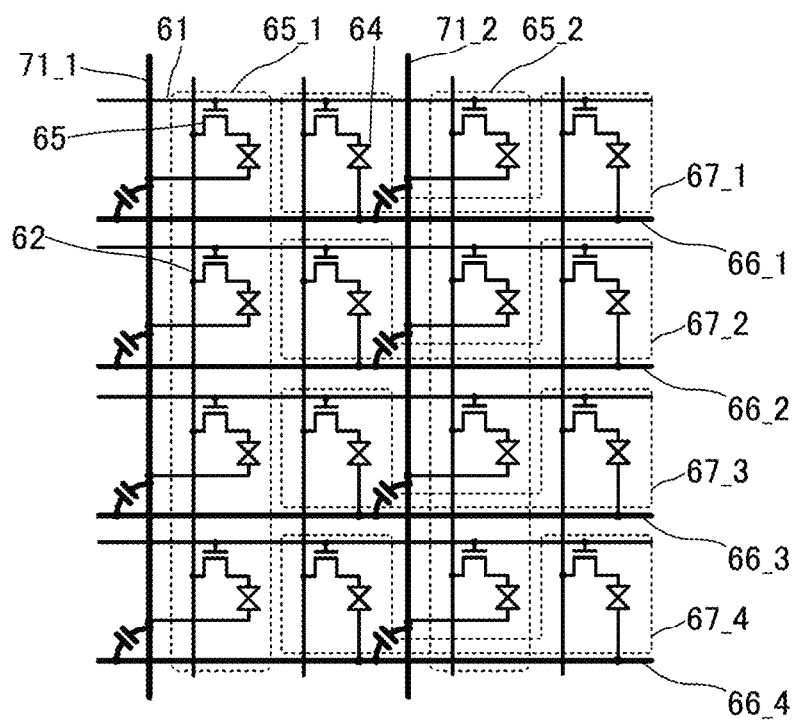
FIG. 3 illustrates pixels provided with a touch sensor of one embodiment.

As illustrated in FIG. 3, a configuration including a plurality of wirings (e.g., wirings 66_1 to 66_4) that are each electrically connected to the one electrode of the liquid crystal element 64 may be employed. In FIG. 3, a plurality of linear blocks (e.g., the blocks 65_1 and 65_2) that extend in the Y direction are formed. These blocks 65 are repeatedly arranged in the X direction. Moreover, a plurality of linear blocks (e.g., blocks 67_1 to 67_4) that extend in the X direction while stepping over the plurality of linear blocks that extend in the Y direction are formed. These blocks 67 are repeatedly arranged in the Y direction. The wirings 66_1 to 66_4 are formed at the same time as the wiring 61 by processing one conductive film; thus, the steps for manufacturing a touch panel can be simplified.

Figure 2B:
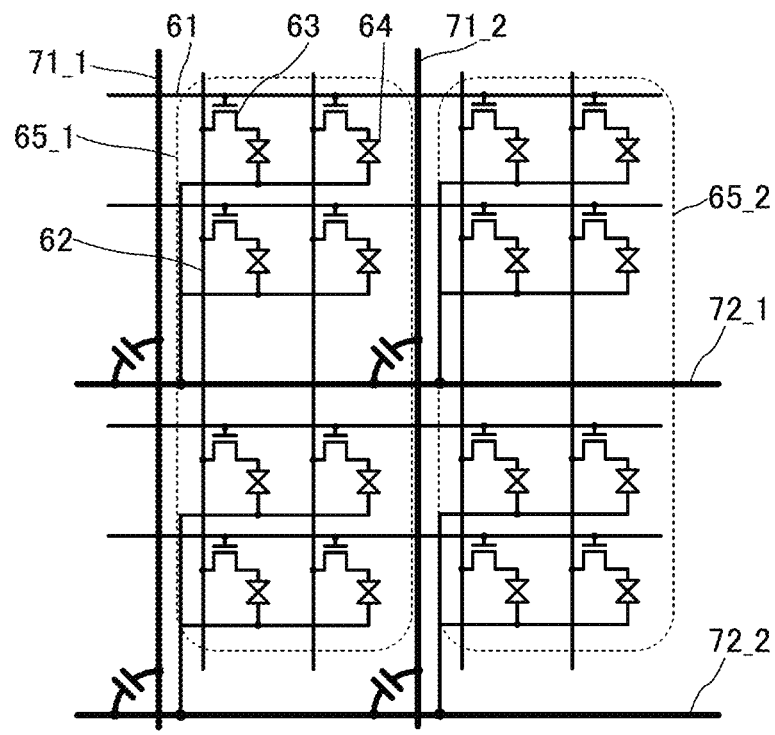
Figure 4A:
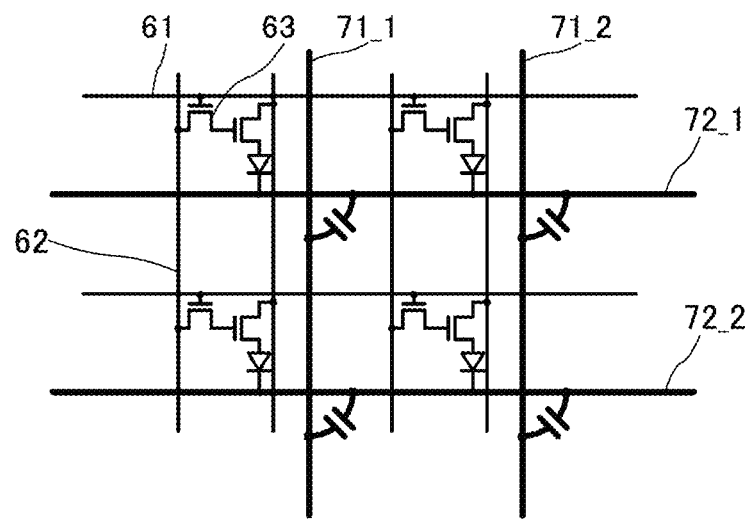
FIGS. 4A and 4B each illustrate pixels provided with a touch sensor of one embodiment.
Figure 4B:
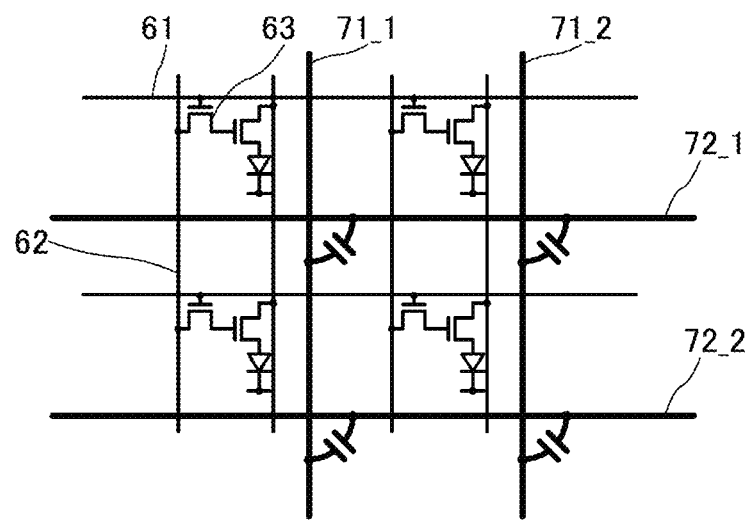

Although FIGS. 2A and 2B and FIG. 3 each illustrate the example in which the liquid crystal element is used as a display element, one embodiment of the present invention is not limited thereto. FIGS. 4A and 4B each illustrate an example in which a light-emitting element is used as a display element.

Figure 5A:
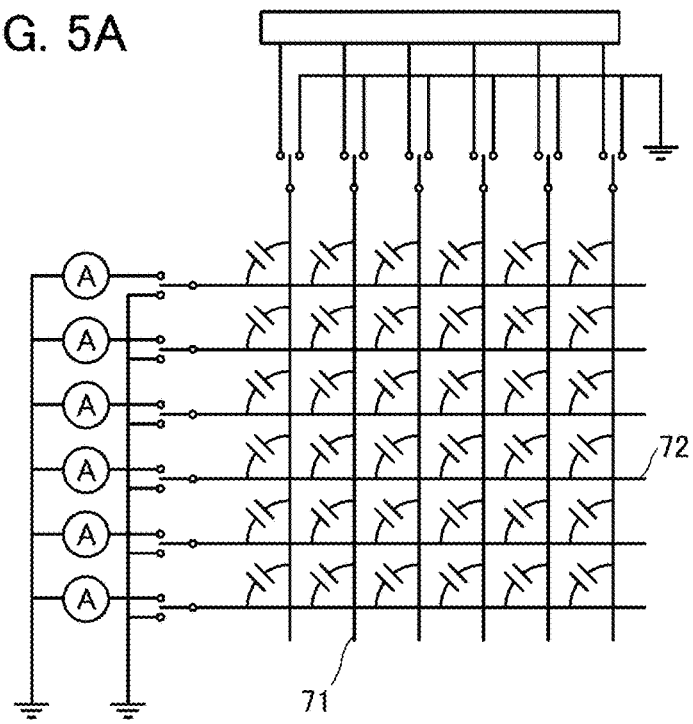
FIGS. 5A to 5C illustrate operations of touch sensors and pixels of one embodiment.

FIG. 5A is an equivalent circuit diagram illustrating the connection between a plurality of wirings 72 extending in the X direction and a plurality of wirings 71 extending in the Y direction. In the circuit diagram, the touch sensor is a projected mutual capacitive touch sensor. Input voltage (or selection voltage) or a common potential (or a ground potential or a reference potential) can be input to each of the wirings 71 extending in the Y direction. A ground potential (or a reference potential) can be input to each of the wirings 72 extending in the X direction, or the wirings 72 can be electrically connected to a sensing circuit. Note that the wirings 71 and the wirings 72 can be interchanged with each other. That is, the wirings 71 can be electrically connected to the sensing circuit.

Operation of the above-described touch panel is described below with reference to FIGS. 5B and 5C.

For example, one frame period is divided into a writing period and a sensing period. The writing period is a period during which image data is written to a pixel and the wirings 72 (also referred to as gate lines or scan lines) are sequentially selected. The sensing period is a period during which sensing is performed by the touch sensor and the wirings 71 extending in the Y direction are sequentially selected and input voltage is input.

Figure 5B:
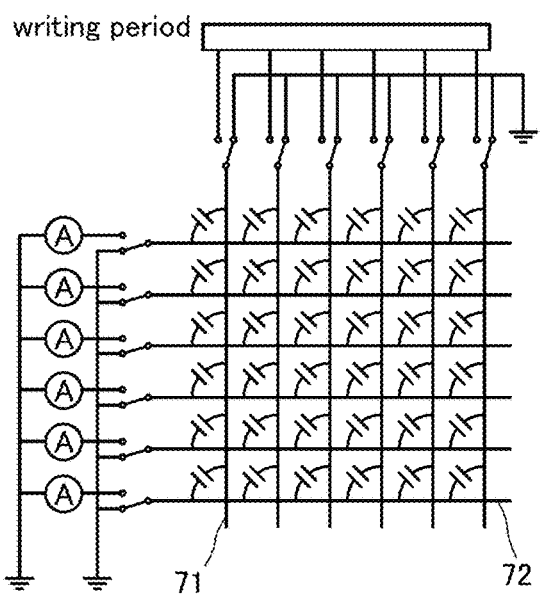

FIG. 5B is an equivalent circuit diagram in the writing period. In the wiring period, a common potential is input to both the wirings 72 extending in the X direction and the wirings 71 extending in the Y direction.

Figure 5C:
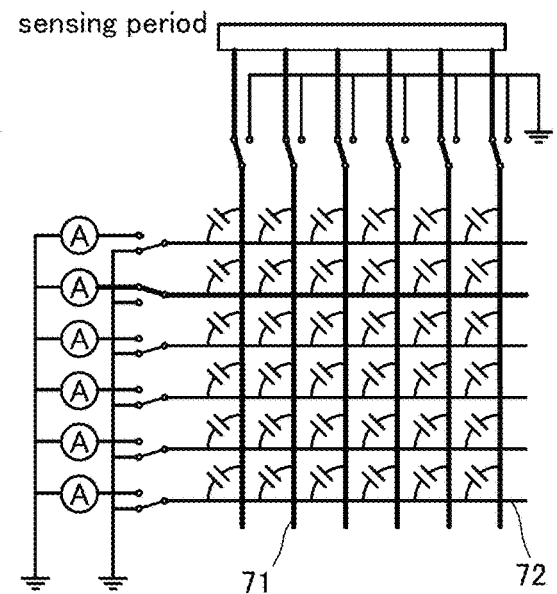

FIG. 5C is an equivalent circuit diagram at some point in time in the sensing period. In the sensing period, input voltage is input to each of the wirings 71 extending in the Y direction. The wirings 72 extending in the X direction that are selected are electrically connected to the sensing circuit, and a common potential is input to the wirings 72 extending in the X direction that are not selected.

Note that the driving method described here can be applied not only to the in-cell touch panel but also to touch panels having other structures.

It is preferable that the period during which an image is written and the period during which sensing is performed by the touch sensor be separately provided as described above. For example, sensing is preferably performed in a blanking period. In this manner, a decrease in sensitivity of the touch sensor caused by noise generated when an image is written to a pixel can be suppressed.

Examples of Touch Panel

Examples of a touch panel of one embodiment of the present invention are described below.

Note that in this specification and the like, a touch panel has a function of displaying or outputting an image or the like on or to a display surface and a function of a touch sensor capable of detecting the approach or contact of an object such as a finger or a stylus to the display surface. Therefore, the touch panel is one embodiment of an input/output device.

In this specification and the like, a structure in which a connector such as a flexible printed circuit (FPC) or a tape carrier package (TCP) is attached to a substrate of a touch panel, or a structure in which an integrated circuit (IC) is mounted on a substrate by a chip on glass (COG) method is referred to as a touch panel module or a display module, or simply referred to as a touch panel in some cases.

A capacitive touch sensor that can be used for one embodiment of the present invention includes a pair of conductive films. Capacitance is formed between the pair of conductive films. The capacitance between the pair of conductive films changes when an object touches or approaches the pair of conductive films. Utilizing this change, detection can be performed.

Examples of the capacitive touch sensor include a surface capacitive touch sensor and a projected capacitive touch sensor. Examples of the projected capacitive touch sensor include a self capacitive touch sensor and a mutual capacitive touch sensor, which differ mainly in the driving method. The use of a mutual capacitive touch sensor is preferable because multiple points can be detected simultaneously.

As a display element in a touch panel of one embodiment of the present invention, a variety of display elements, for example, a liquid crystal element (using a vertical electric field mode or a horizontal electric field mode), an optical element utilizing micro electro mechanical systems (MEMS), a light-emitting element such as an organic electroluminescence (EL) element or a light-emitting diode (LED), and an electrophoretic element can be used.

Here, a transmissive liquid crystal display device including a liquid crystal element using a horizontal electric field mode as a display element is preferably used for the touch panel.

One or both of a pair of substrates in a touch panel of one embodiment of the present invention include a pair of electrodes (also referred to as conductive films or wirings) included in a touch sensor. Thus, the touch panel has a structure in which a display panel and the touch sensor are combined. Therefore, the thickness of the touch panel is reduced, leading to a lightweight touch panel.

Figure 6A:
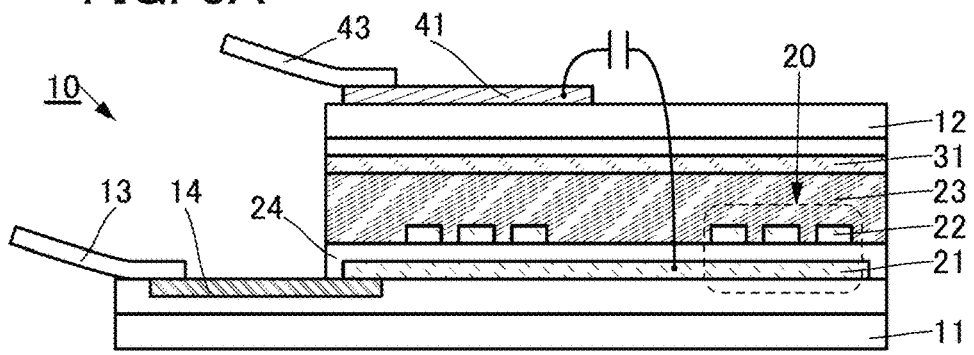
FIGS. 6A to 6D are schematic cross-sectional views illustrating modes of a touch panel of one embodiment.

FIG. 6A is a schematic cross-sectional view illustrating a mode of a touch panel 10 of one embodiment of the present invention.

The touch panel 10 includes a substrate 11, a substrate 12, an FPC 13, a conductive film 14, a liquid crystal element 20, a coloring film 31, a conductive film 41, and the like.

The liquid crystal element 20 includes a conductive film 21, a conductive film 22, and liquid crystal 23. In the example illustrated here, a liquid crystal element using a fringe field switching (FFS) mode is used as the liquid crystal element 20. The conductive film 22 is positioned over the conductive film 21 with an insulating film 24 provided therebetween. For example, the conductive film 22 has a comb-like top shape or a top shape provided with a slit (a top shape is also referred to as a planar shape). One of the conductive films 21 and 22 functions as a common electrode, and the other functions as a pixel electrode. In the case where a light-emitting element or the like is used as a display element, for example, the conductive film 22 does not have a comb-like top shape or a top shape provided with a slit.

The touch sensor can conduct detection using capacitance formed between the conductive film 41 provided on the substrate 12 side and the conductive film 21 serving as one of a pair of electrodes of the liquid crystal element 20. With such a structure, the one electrode of the liquid crystal element 20 can also serve as one of a pair of electrodes of the touch sensor. Thus, the processing steps can be simplified, leading to an improvement in yield and a reduction in manufacturing cost. Note that the conductive film 41 is formed over a surface of the substrate 12 on the display surface side (the side opposite to the substrate 11). In addition, the conductive film 41 is electrically connected to an FPC 43 provided on the substrate 12 side. The conductive film 21 is electrically connected to the FPC 13 provided on the substrate 11 side via the conductive film 14.

Figure 6B:
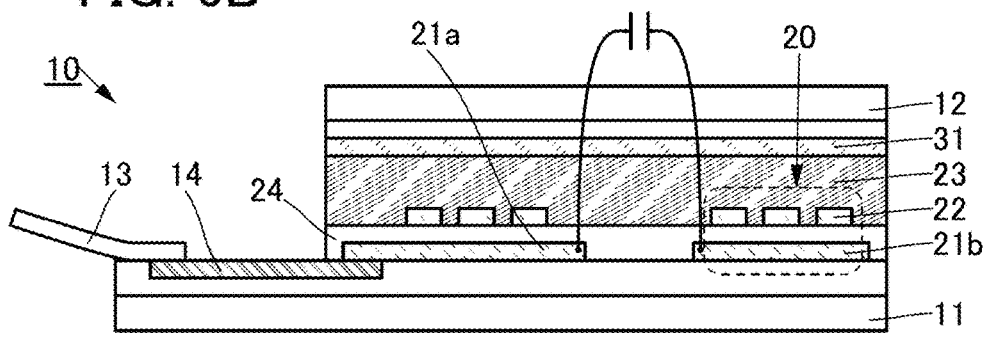

The touch panel 10 illustrated in FIG. 6B has a structure without the conductive film 41 and the FPC 43. Conductive films 21a and 21b serving as the common electrode of the liquid crystal element 20 also serve as the pair of electrodes of the touch sensor. With such a structure, the processing steps can be simpler than those of the structure illustrated in FIG. 6A. Note that the conductive film 21a is electrically connected to the FPC 13 via the conductive film 14, and the conductive film 21b is electrically connected to the FPC 13 via a conductive film that is not illustrated.

Figure 6C:
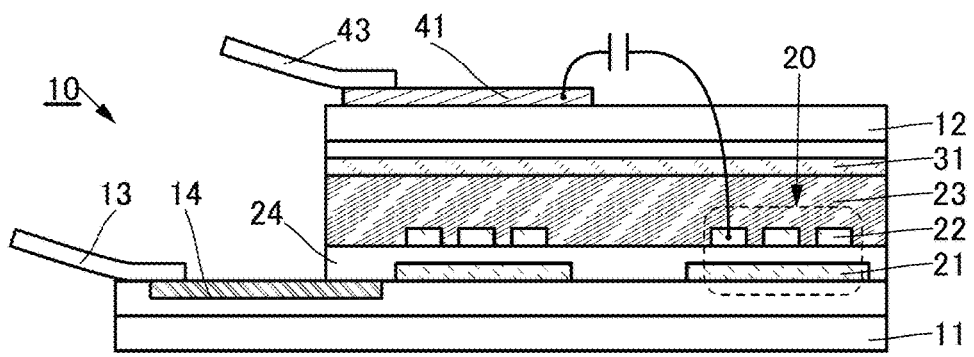
Figure 6D:
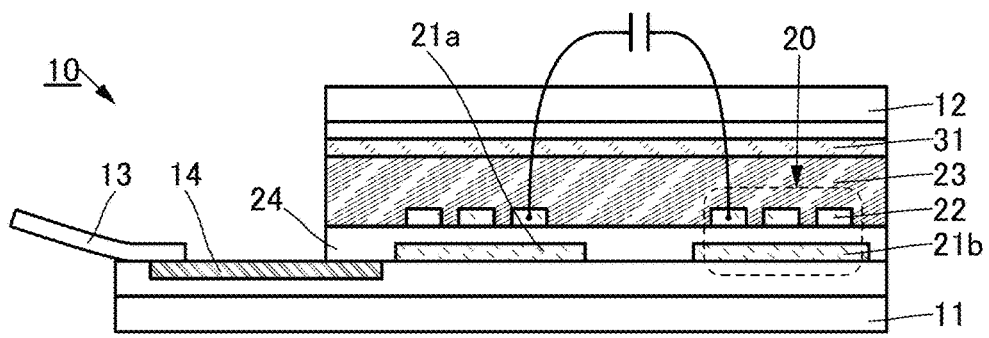

Note that FIGS. 6A and 6B illustrate examples in which the electrode (the conductive films 21, 21a, and 21b) that is positioned in a lower layer of the pair of electrodes forming the liquid crystal element 20 is a common electrode; however, one embodiment of the present invention is not limited to these examples. FIGS. 6C and 6D illustrate respective modification examples of FIGS. 6A and 6B. In FIGS. 6C and 6D, the electrode (the conductive film 22) that is positioned in an upper layer of the pair of electrodes forming the liquid crystal element 20 is a common electrode.

The above is the description of examples of the touch panel.

Structure Example 1

More specific structure examples of the touch panel are described below.

Figure 7A:
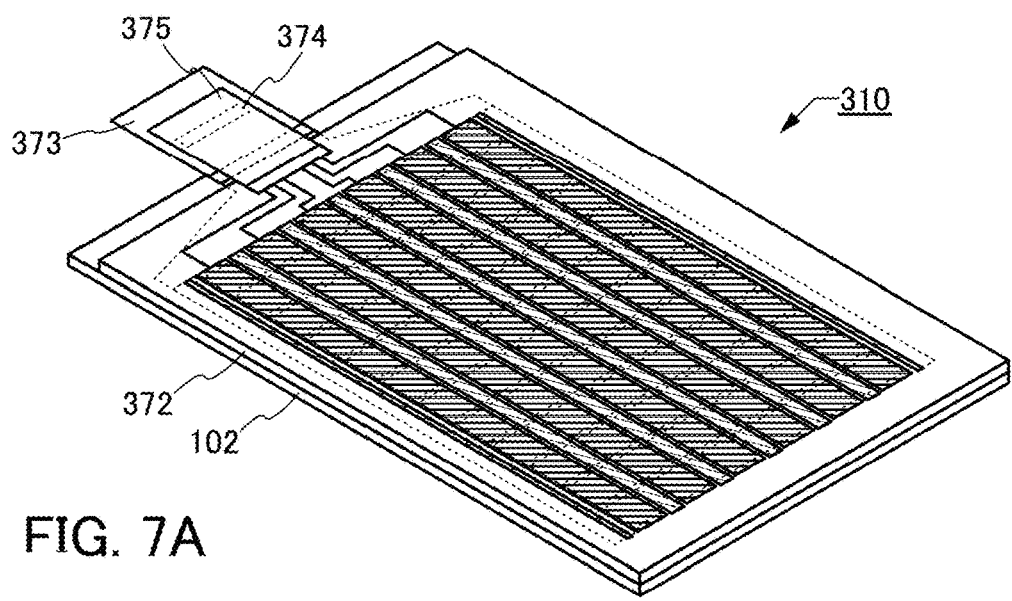
FIGS. 7A to 7C are perspective views illustrating an example of a touch panel of one embodiment.
Figure 7B:
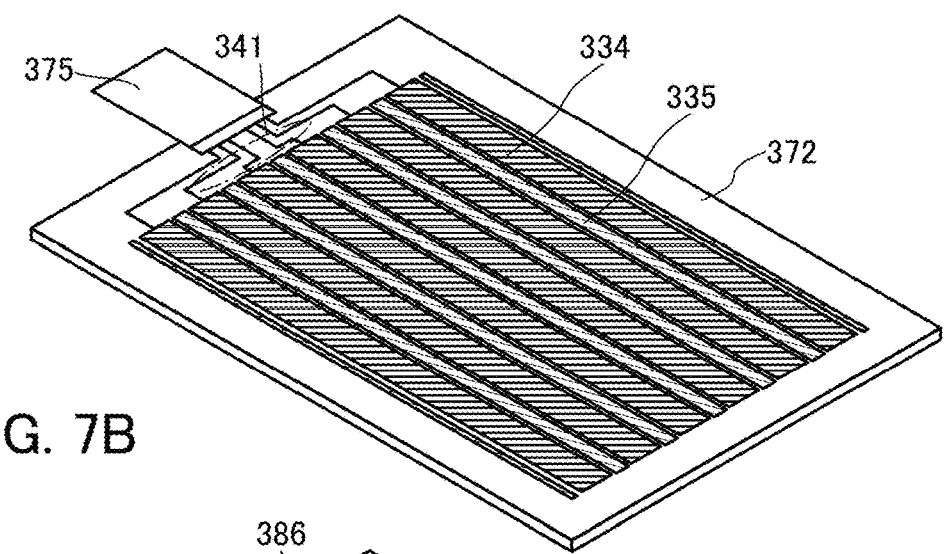
Figure 7C:
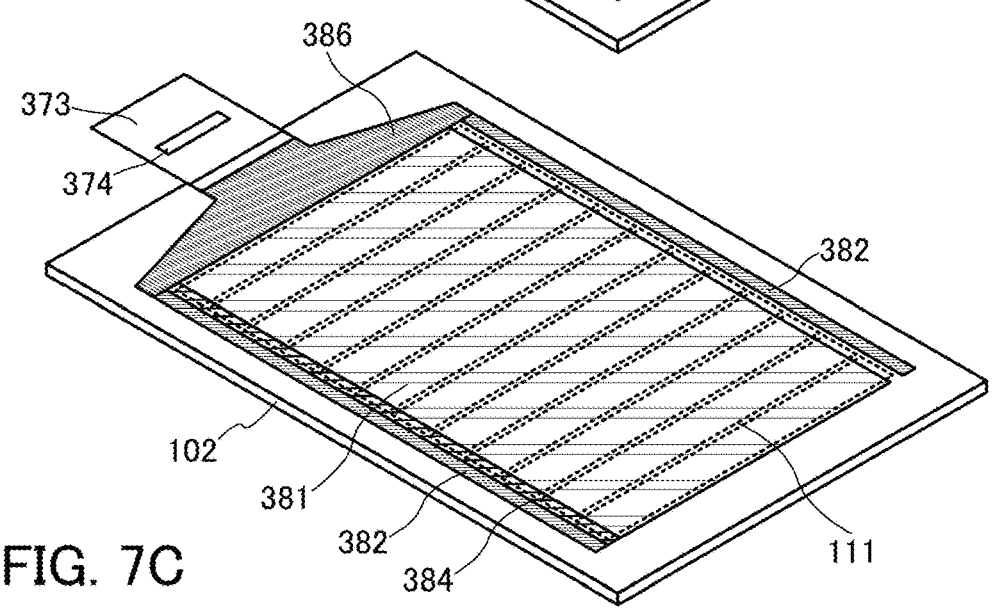

FIG. 7A is a schematic perspective view of a touch panel 310 of one embodiment of the present invention. FIGS. 7B and 7C are schematic perspective developed views of FIG. 7A. FIG. 7B is a schematic perspective view of the counter substrate side, and FIG. 7C is a schematic perspective view of the element substrate side. Note that only main components are illustrated for simplicity.

The touch panel 310 includes a substrate 102 and a substrate 372 that are provided so as to face each other.

A display portion 381, a driver circuit 382, a wiring 386, a driver circuit 384, and the like are provided over the substrate 102 (see FIG. 7C). An oxide semiconductor film 111 is formed in the display portion 381. The substrate 102 is provided with an FPC 373 that is electrically connected to the wiring 386. In the example illustrated in FIGS. 7A and 7C, an IC 374 is provided over the FPC 373.

A plurality of conductive films 334, a plurality of conductive films 335, a plurality of conductive films 341, and the like are provided on a surface of the substrate 372 that is the side opposite to the substrate 102 (see FIG. 7B). Each of the conductive films 341 is electrically connected to one of the plurality of conductive films 334. An FPC 375 that is electrically connected to the plurality of conductive films 341 is provided over the substrate 372.

The conductive film 335 is provided between the two conductive films 334. With the conductive film 335, the generation of a difference between the transmittance of a region where the conductive film 334 is provided and the transmittance of a region where the conductive film 334 is not provided can be suppressed. The conductive film 335 is preferably electrically floating. With this structure, a change in the potential of one of the conductive film 334 and the oxide semiconductor film 111 can be efficiently transmitted to the other through the conductive film 335, thereby increasing the detection sensitivity. The conductive film 335 is not necessarily provided, when it is not needed.

The display portion 381 includes at least a plurality of pixels (see FIG. 7C). Each of the pixels includes at least one display element. It is preferable that each of the pixels include a transistor and a display element. As the display element, typically, a light-emitting element such as an organic EL element, a liquid crystal element, or the like can be used. In this structure example, a liquid crystal element is used as the display element.

As the driver circuit 382, for example, a circuit functioning as a scan line driver circuit, a signal line driver circuit, or the like can be used.

The wiring 386 has a function of supplying a signal or electric power to the display portion 381 or the driver circuit 382. The signal or the electric power is input from the outside or the IC 374 to the wiring 386 through the FPC 373.

The driver circuit 384 has a function of sequentially selecting the oxide semiconductor film 111. When the touch sensor is driven by sequentially selecting not the oxide semiconductor film 111 but the conductive films 334, the driver circuit 384 has a function of switching a fixed potential and a sensing signal and supplying it to the oxide semiconductor film 111. In the case where a signal for driving the touch sensor is supplied from the IC 374 or the outside, the driver circuit 384 is not necessarily provided.

In the example illustrated in FIGS. 7A to 7C, the IC 374 is mounted on the FPC 373 by a chip-on-film (COF) method. As the IC 374, for example, an IC functioning as a scan line driver circuit or a signal line driver circuit can be used. Note that it is possible that the IC 374 is not provided when the touch panel 310 includes circuits functioning as a scan line driver circuit and a signal line driver circuit or when circuits functioning as a scan line driver circuit and a signal line driver circuit are provided outside and a signal for driving the display portion 381 is input through the FPC 373. The IC 374 may also be directly mounted on the substrate 102 by a chip-on-glass (COG) method or the like.

The IC 374 can have a function of driving the touch sensor. Alternatively, an IC for driving the touch sensor may further be provided. Further alternatively, an IC for driving the touch sensor may be mounted on the substrate 102.

The touch sensor includes the conductive film 334 that is provided over the substrate 372 and the oxide semiconductor film 111 that is provided over the substrate 102. With the use of capacitance formed between the conductive film 334 and the oxide semiconductor film 111, the approach or contact of an object can be sensed.

[Cross-Sectional Structure Example 1]

Examples of the cross-sectional structure of a touch panel of one embodiment of the present invention are described below with reference to the drawings.

Figure 8:
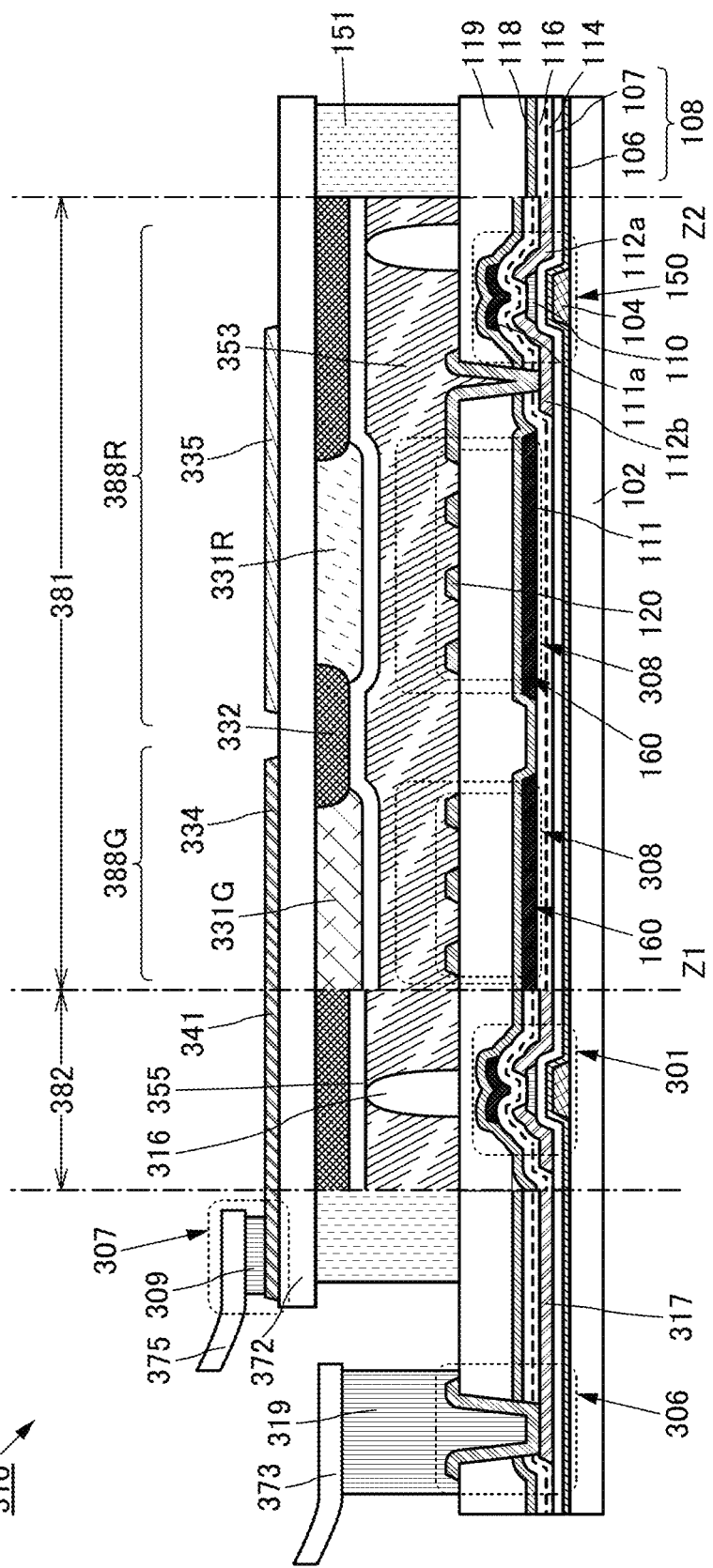
FIG. 8 is a cross-sectional view illustrating an example of a touch panel of one embodiment.

FIG. 8 is a schematic cross-sectional view of the touch panel 310. FIG. 8 illustrates the cross sections of a region including the FPCs 373 and 375, a region including the driver circuit 382, and a region including the display portion 381 in FIG. 7A.

The substrate 102 and the substrate 372 are attached to each other with a sealant 151. A region surrounded by the substrate 102, the substrate 372, and the sealant 151 is filled with liquid crystal 353.

The touch panel 310 illustrated in FIG. 8 includes, in the display portion 381, a transistor 150 including an oxide semiconductor film 110 and a capacitor 160 including an insulating film between a pair of electrodes. Note that in the capacitor 160, one of the pair of electrodes is the oxide semiconductor film 111, and the other of the pair of electrodes is a conductive film 120.

The transistor 150 includes a gate electrode 104 over a substrate 102, an insulating film 108 serving as a gate insulating film over the gate electrode 104, the oxide semiconductor film 110 overlapping with the gate electrode 104 over the insulating film 108, and a source electrode 112a and a drain electrode 112b over the oxide semiconductor film 110. In other words, the transistor 150 includes the oxide semiconductor film 110, the insulating film 108 serving as a gate insulating film in contact with the oxide semiconductor film 110, the gate electrode 104 overlapping with the oxide semiconductor film 110 and being in contact with the insulating film 108, and the source electrode 112a and the drain electrode 112b electrically connected to the oxide semiconductor film 110.

In addition, over the transistor 150, specifically over the oxide semiconductor film 110, the source electrode 112a, and the drain electrode 112b, insulating films 114, 116, 118, and 119 are formed. The insulating films 114, 116, and 118 function as protective insulating films for the transistor 150. The insulating film 119 functions as a planarization film. In addition, an opening reaching the drain electrode 112b is formed in the insulating films 114, 116, 118, and 119. The conductive film 120 is formed over the insulating film 119 to cover the opening. The conductive film 120 has a function of a pixel electrode. Note that a structure without the insulating film 119 may be employed.

The capacitor 160 is provided over the insulating film 116. The capacitor 160 includes the oxide semiconductor film 111 serving as the one of the pair of electrodes, the insulating films 118 and 119 serving as dielectric films over the oxide semiconductor film 111, and the conductive film 120 that serves as the other of the pair of electrodes and overlaps with the oxide semiconductor film 111 with the insulating films 118 and 119 provided therebetween. In other words, the conductive film 120 serves as the pixel electrode and the electrode of the capacitor. Note that the oxide semiconductor film 111 preferably has a thickness with which a variation in resistivity in the film thickness direction is not caused. Specifically, the thickness is preferably greater than or equal to 30 nm and less than or equal to 70 nm, further preferably greater than or equal to 50 nm and less than or equal to 70 nm.

Furthermore, the touch panel 310 illustrated in FIG. 8 includes a touch sensor in the display portion 381. The touch sensor includes, as a pair of electrodes, the oxide semiconductor film 111 and the conductive film 334 that is provided over the substrate 372. The transistor 150, the capacitor 160, and the touch sensor can be collectively referred to as a semiconductor device. Moreover, the transistor 150 and the touch sensor can also be collectively referred to as a semiconductor device. Note that as an auxiliary electrode, a conductive film may be formed in contact with the oxide semiconductor film 111. For example, a conductive film may be formed in a position overlapping with a light-blocking film 332 using a material similar to that of the gate electrode 104 or that of the source electrode 112a and the drain electrode 112b. Since the auxiliary electrode overlaps with the light-blocking film 332, delay of signal transmission for detection by the touch sensor can be reduced while the aperture ratio of the pixel is maintained.

Note that the oxide semiconductor film 110 serves as a channel region of the transistor 150. In addition, the oxide semiconductor film 111 serves as the one of the pair of electrodes of the capacitor 160. Thus, the oxide semiconductor film 111 has resistivity lower than the oxide semiconductor film 110. In addition, the oxide semiconductor films 110 and 111 preferably contain the same metal element. When the oxide semiconductor films 110 and 111 each contain the same metal element, a common manufacturing apparatus (e.g., a deposition apparatus or a processing apparatus) can be used and accordingly the manufacturing cost can be reduced.

In addition, the capacitor 160 has a light-transmitting property. In other words, each of the oxide semiconductor film 111, the conductive film 120, and the insulating films 118 and 119 that are included in the capacitor 160 are formed of a material with a light-transmitting property. Since the capacitor 160 has a light-transmitting property, the capacitor 160 can be formed large (in a large area) in the pixel except a region where the transistor is formed; thus, the touch panel can have increased capacitance while improving the aperture ratio. As a result, the touch panel can have an excellent display quality.

Note that as the insulating film 118 over the transistor 150 and included in the capacitor 160, an insulating film containing at least hydrogen is used. In addition, as an insulating film 107 included in the transistor 150 and the insulating films 114 and 116 over the transistor 150, insulating films containing at least oxygen are used. As described above, these insulating films are used as the insulating films included in the transistor 150 and the capacitor 160 and provided over the transistor 150 and the capacitor 160, so that the resistivity of the oxide semiconductor film 110 included in the transistor 150 and the resistivity of the oxide semiconductor film 111 included in the capacitor 160 can be controlled.

In addition, when the insulating films included in the capacitor 160 and provided over the transistor 150 and the capacitor 160 are provided as follows, the planarity of the conductive film 120 can be increased. Specifically, the insulating films 114 and 116 are formed over the oxide semiconductor film 110 and the insulating film 118 is formed over the oxide semiconductor film 111 so that the oxide semiconductor film 111 is positioned between the insulating films 116 and 118, whereby the resistivity of the oxide semiconductor film 111 can be controlled without providing an opening in the insulating films 114 and 116 in a position overlapping with the oxide semiconductor film 111. With such a structure, the orientation of the liquid crystals formed over the conductive film 120 can be favorable.

Note that in FIG. 8, an oxide semiconductor film 111a is provided to overlap with the oxide semiconductor film 110. The oxide semiconductor film 111a is formed at the same time using the same deposition step and the same etching step as the oxide semiconductor film 111. The oxide semiconductor film 111a serves as the second gate electrode of the transistor 150. In that case, the insulating films 114 and 116 serve as gate insulating films for the second gate electrode. In other words, the transistor 150 includes the insulating films 114 and 116 provided over the oxide semiconductor film 110, the source electrode 112a, and the drain electrode 112b and the oxide semiconductor film 111a provided over the insulating films 114 and 116 to overlap with the oxide semiconductor film 110.

Since the oxide semiconductor film 111a is formed at the same time using the same deposition step and the same etching step as the oxide semiconductor film 111, an increase in the number of processing steps can be prevented. Note that one embodiment of the present invention is not limited to these examples. The oxide semiconductor film 111a can be formed in a step different from the oxide semiconductor film 111. The oxide semiconductor film 111a may be connected to the gate electrode 104. Alternatively, the oxide semiconductor film 111a may be supplied with a signal or potential different from the signal or potential supplied to the gate electrode 104 without being connected to the gate electrode 104.

Note that the oxide semiconductor film 110 has higher resistivity than the oxide semiconductor film 111 because it is used as the channel region in the transistor 150. The oxide semiconductor film 111 has lower resistivity than the oxide semiconductor film 110 because it serves as an electrode. A method of controlling the resistivity of the oxide semiconductor films 110 and 111 is described later.

The touch panel 310 includes the conductive film 120, the oxide semiconductor film 111, and the like over the substrate 102. The conductive film 120, the oxide semiconductor film 111, and/or the like are included in a transistor 301, the transistor 150, a connection portion 306, a conductive film 317, and a liquid crystal element 308.

FIG. 8 illustrates the cross section of two pixels as an example of the display portion 381. For example, each of the pixels is a pixel exhibiting a red color, a pixel exhibiting a green color, or a pixel exhibiting a blue color; thus, full-color display can be achieved. In the display portion 381 illustrated in FIG. 8, for example, a pixel 388R includes the transistor 150, the capacitor 160, the liquid crystal element 308, and a coloring film 331R. Furthermore, a pixel 388G includes a transistor that is not illustrated, the capacitor 160, the liquid crystal element 308, and a coloring film 331G.

FIG. 8 illustrates, as an example of the driver circuit 382, an example in which the transistor 301 is provided.

FIG. 8 illustrates an example in which the transistors 301 and 150 each have a structure in which a semiconductor layer where a channel is formed is provided between two gate electrodes. Such transistors can have a higher field-effect mobility and thus have a higher on-state current than other transistors. Consequently, a circuit capable of high-speed operation can be obtained. Furthermore, the area occupied by a circuit portion can be reduced. The use of the transistor having a high on-state current can reduce signal delay in wirings and can suppress display unevenness even in a display panel or a touch panel in which the number of wirings is increased because of an increase in size or resolution.

Note that the transistor 301 included in the driver circuit 382 and the transistor 150 included in the display portion 381 may have the same structure. The plurality of transistors included in the driver circuit 382 may have the same structure or different structures. The plurality of transistors included in display portion 381 may have the same structure or different structures.

In the example illustrated in FIG. 8, a liquid crystal element using a fringe field switching (FFS) mode is used as the liquid crystal element 308. The liquid crystal element 308 includes the conductive film 120, the liquid crystal 353, and the oxide semiconductor film 111. Orientation of the liquid crystal 353 can be controlled with an electric field generated between the conductive film 120 and the oxide semiconductor film 111.

The conductive film 120 has a comb-like top shape or a top shape provided with a slit (a top shape is also referred to as a planar shape). The oxide semiconductor film 111 is provided so as to overlap with the conductive film 120. In a region overlapping with the coloring film 331R and the like, there is a portion where the conductive film 120 is not provided over the oxide semiconductor film 111.

Figure 9:
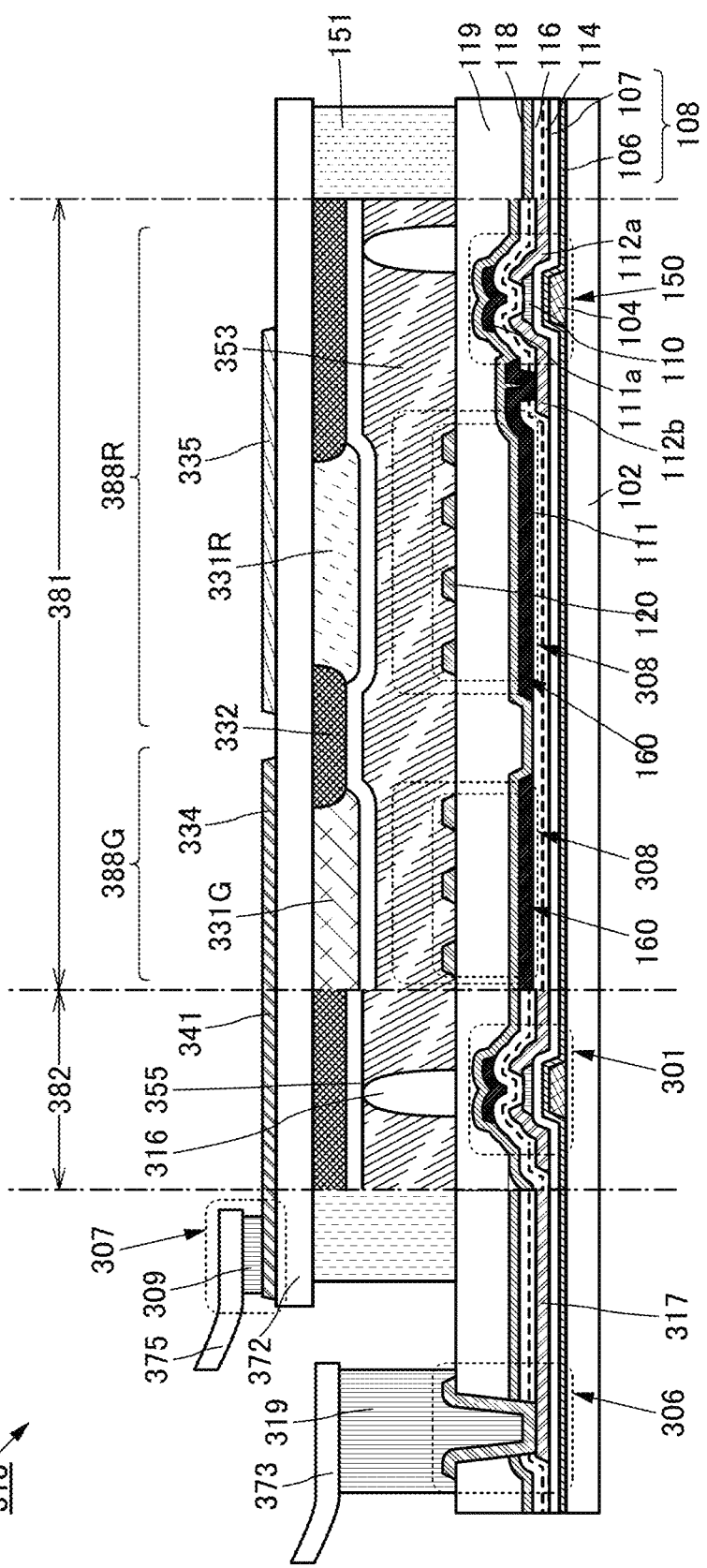
FIG. 9 is a cross-sectional view illustrating an example of a touch panel of one embodiment.

In FIG. 8, the conductive film 120 functions as a pixel electrode, and the oxide semiconductor film 111 functions as a common electrode. Alternatively, the conductive film 120 that is provided in an upper layer and has a comb-like top shape or a top shape provided with a slit may be used as the common electrode, and the oxide semiconductor film 111 that is provided in a lower layer may be used as the pixel electrode (see FIG. 9). In the touch panel 310 illustrated in FIG. 9, the oxide semiconductor film 111 is electrically connected to the drain electrode 112b of the transistor 150. In this case, the touch sensor in the touch panel 310 includes the conductive films 334 and 120 as a pair of electrodes.

The connection portion 306 is provided in a region near an end portion of the substrate 102. In the connection portion 306, the conductive film 317 is electrically connected to the FPC 373 through a connection layer 319. In the example illustrated in FIG. 8, the connection portion 306 is formed by stacking part of the conductive film 317 and a conductive film that is formed by processing the same conductive film as the conductive film 120.

The coloring film 331R, the coloring film 331G, a light-blocking film 332, an insulating film 355, and the like are provided on a surface of the substrate 372 that is on the substrate 102 side. The conductive film 334, the conductive film 335, the conductive film 341, and the like are provided on the surface of the substrate 372 that is the side opposite to the substrate 102.

The conductive film 334 is electrically connected to the conductive film 341. The conductive film 335 is electrically insulated from the conductive films 334 and 341. The conductive films 334, 341, and 335 are preferably formed at the same time by processing one conductive film. Alternatively, the conductive films 334 and 341 may be continuous. In that case, at least a region that overlaps with the display portion 381 corresponds to the conductive film 334 functioning as one electrode of the touch sensor, and the other region corresponds to the conductive film 341.

Figure 10:
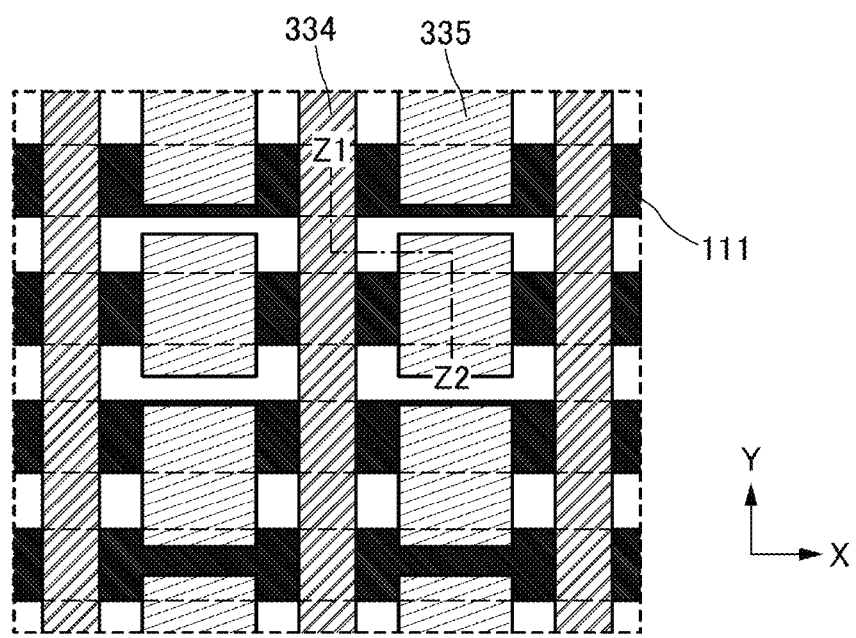
FIG. 10 is a top view illustrating a structure of electrodes of a touch sensor of one embodiment.

Here, the arrangement of the electrodes included in the touch sensor is described. FIG. 10 is a schematic top view of the pair of electrodes of the touch sensor included in the touch panel 310 illustrated in FIG. 8. The dashed-dotted line Z1-Z2 in FIG. 10 corresponds to the display portion 381 in FIG. 8.

The conductive film 334 that is one electrode of the touch sensor extends in the Y direction. The oxide semiconductor film 111 that is the other electrode of the touch sensor extends in the X direction and intersects with the conductive film 334. The conductive film 335 is preferably formed using the same conductive film as the conductive film 334; however, the conductive film 335 is illustrated with hatching that is different from that of the conductive film 334 because the functions of the conductive films 334 and 335 are different. The conductive film 335 is brought into an electrically floating state, so that the potential of one of the conductive film 334 and the oxide semiconductor film 111 can be transmitted efficiently to the other via the conductive film 335. Accordingly, the sensitivity of the touch sensor can be enhanced.

The coloring films 331R and 331G and the light-blocking film 332 are provided on the surface of the substrate 372 that is on the substrate 102 side (see FIG. 8). The insulating film 355 is provided so as to cover the coloring film 331R and the light-blocking film 332.

The insulating film 355 has a function of an overcoat preventing impurities contained in the coloring film 331R, the light-blocking film 332, and the like from diffusing into the liquid crystal 353.

A spacer 316 is provided over the insulating film 119 to adjust the distance between the substrate 102 and the substrate 372. Although FIG. 8 illustrates the example in which the spacer 316 is in contact with components (e.g., the insulating film 355) on the substrate 372 side, the spacer 316 is not necessarily in contact with them. Moreover, FIG. 8 illustrates the example in which the spacer 316 is provided on the substrate 102 side; however, the spacer 316 may be provided on the substrate 372 side. For example, the spacer 316 can be provided between adjacent two sub-pixels. A particulate spacer may be used as the spacer 316. Although a material such as silica can be used for the particulate spacer, an elastic material such as an organic resin or rubber is preferably used. In that case, the particulate spacer may have a shape that is vertically crushed.

Surfaces of the conductive film 120, the insulating film 119, the insulating film 355, and the like that are in contact with the liquid crystal 353 may be provided with alignment films for controlling the orientation of the liquid crystal 353.

At least regions of the conductive films 334 and 335 that overlap with the coloring film 331R and the like are preferably formed using a light-transmitting material.

In the case where the touch panel 310 includes a transmissive liquid crystal display device, for example, two polarizing plates that are not illustrated are provided to be above and below the display portion 381. Light from a backlight provided on the outer side of the polarizing plate enters through the polarizing plate. At this time, orientation of the liquid crystal 353 is controlled with a voltage applied between the conductive film 120 and the oxide semiconductor film 111. In other words, the intensity of light emitted through the polarizing plate can be controlled. Light entering from the backlight, excluding light in a particular wavelength range, is absorbed by the coloring film, so that red, blue, or green light is emitted.

In addition to the polarizing plate, a circularly polarizing plate can be used, for example. An example of the circularly polarizing plate is a stack including a linear polarizing plate and a quarter-wave retardation plate. With the circularly polarizing plate, the viewing angle dependency can be reduced.

In the example illustrated here, the liquid crystal element 308 is a liquid crystal element using an FFS mode. However, one embodiment of the present invention is not limited thereto, and a liquid crystal element using any of a variety of modes can be used. For example, a liquid crystal element using a vertical alignment (VA) mode, a twisted nematic (TN) mode, an in-plane switching (IPS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

Furthermore, a normally black liquid crystal display device, for example, a transmissive liquid crystal display device using a vertical alignment (VA) mode, may be used as the touch panel 310. Examples of the vertical alignment mode include a multi-domain vertical alignment (MVA) mode, a patterned vertical alignment (PVA) mode, and an advanced super-view (ASV) mode.

The liquid crystal element is an element that controls transmission and non-transmission of light by optical modulation action of the liquid crystal. Note that optical modulation action of the liquid crystal is controlled by an electric field applied to the liquid crystal (including a horizontal electric field, a vertical electric field, and an oblique electric field). As the liquid crystal used for the liquid crystal element, thermotropic liquid crystal, low-molecular liquid crystal, high-molecular liquid crystal, polymer dispersed liquid crystal (PDLC), ferroelectric liquid crystal, antiferroelectric liquid crystal, or the like can be used. Such a liquid crystal material exhibits a cholesteric phase, a smectic phase, a cubic phase, a chiral nematic phase, an isotropic phase, or the like depending on the conditions.

As the liquid crystal material, either of positive liquid crystal and negative liquid crystal may be used, and an appropriate liquid crystal material can be used depending on the mode or design to be used.

In the case of employing a horizontal electric field mode, liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition that includes liquid crystal exhibiting a blue phase and a chiral material has a short response time and has optical isotropy. In addition, the liquid crystal composition that includes liquid crystal exhibiting a blue phase and a chiral material does not need alignment treatment and has a small viewing angle dependence. An alignment film does not need to be provided and rubbing treatment is thus not necessary; accordingly, electrostatic discharge damage caused by the rubbing treatment can be prevented, and defects and damage of the liquid crystal display device in the manufacturing process can be reduced.

In this structure example, the touch panel 310 can detect touch operation or the like by utilizing the capacitance formed between the conductive film 334 and the oxide semiconductor film 111. That is, the oxide semiconductor film 111 serves as one of a pair of electrodes of the liquid crystal element 308 as well as one of a pair of electrodes of the touch sensor.

A conductive material transmitting visible light is preferably used for the conductive film 120 and/or the conductive film 334. The conductive film 120 and/or the conductive film 334 is formed using, for example, a conductive material containing a metal oxide. For example, a metal oxide among light-transmitting conductive materials described later can be used.

Alternatively, the conductive film 120 and/or the conductive film 334 is preferably formed using a metal oxide containing the same metal element as other conductive films or a semiconductor layer. In particular, in the case where an oxide semiconductor is used for the semiconductor layer of the transistor in the touch panel 310, a conductive oxide containing a metal element contained in the oxide semiconductor is preferably used.

A fixed potential is supplied to the conductive film 334; thus, electromagnetic noise from the outside can be blocked. For example, when sensing is not performed, a constant potential that does not influence the switching of the liquid crystal 353 may be supplied to the conductive film 334. For example, a ground potential, a common potential, or a predetermined constant potential can be supplied. The conductive film 334 and the oxide semiconductor film 111 may be set at the same potential, for example.

By applying an appropriate potential to the conductive film 334, a component in the thickness direction in the directions of an electric field (the directions of the lines of electric force) generated between the conductive film 120 and the oxide semiconductor film 111 can be reduced, and an electric field can be effectively applied in the direction substantially perpendicular to the thickness direction (in the lateral direction). Thus, an orientation defect in the liquid crystal 353 can be suppressed, and a malfunction such as light leakage can be prevented.

A substrate that an object such as a finger or a stylus directly touches may be provided above the conductive films 334 and 335 and the substrate 372. In that case, a polarizing plate or a circularly polarizing plate is preferably provided between the substrate 372 and the substrate 102. In that case, the above substrate is preferably provided with a protective layer (such as a ceramic coat). The protective layer can be formed using an inorganic insulating material such as silicon oxide, aluminum oxide, yttrium oxide, or yttria-stabilized zirconia (YSZ). In addition, tempered glass may be used for the above substrate. The tempered glass that can be used here is one that has been subjected to physical or chemical treatment by an ion exchange method, a thermal tempering method, or the like and has a surface to which compressive stress has been applied.

[Components]

The above components are described below.

[Substrate]

A substrate having a flat surface can be used as the substrate included in the touch panel. The substrate through which light emitted from the display element is extracted is formed using a material that transmits the light. For example, a material such as glass, quartz, ceramics, sapphire, or an organic resin can be used. Alternatively, a single crystal semiconductor substrate or a polycrystalline semiconductor substrate made of silicon or silicon carbide, a compound semiconductor substrate made of silicon germanium or the like, an SOI substrate, or the like may be used. Still alternatively, any of these substrates provided with a semiconductor element may be used as the substrate.

In the case where a glass substrate is used as the substrate, a large glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured. Alternatively, a flexible substrate may be used as the substrate, and a transistor, a capacitor, or the like may be provided directly over the flexible substrate.

The weight and thickness of the touch panel can be decreased by using a thin substrate. Furthermore, a flexible touch panel can be obtained by using a substrate that is thin enough to have flexibility.

As the glass, for example, non-alkali glass, barium borosilicate glass, aluminoborosilicate glass, or the like can be used.

Examples of a material having flexibility and a light-transmitting property with respect to visible light include glass that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE) resin. In particular, a material whose thermal expansion coefficient is low is preferred, and for example, a polyamide imide resin, a polyimide resin, or PET can be suitably used. A substrate in which a glass fiber is impregnated with an organic resin or a substrate whose thermal expansion coefficient is reduced by mixing an organic resin with an inorganic filler can also be used. A substrate using such a material is lightweight, and thus, a touch panel using this substrate can also be lightweight.

Since the substrate through which light is not extracted does not need to have a light-transmitting property, a metal substrate using a metal material or an alloy material, a ceramic substrate, a semiconductor substrate, or the like can be used as well as the above-described substrates. A metal material and an alloy material, which have high thermal conductivity, are preferable because they can easily conduct heat to the whole sealing substrate and accordingly can prevent a local temperature rise in the touch panel. To obtain flexibility and bendability, the thickness of a metal substrate is preferably greater than or equal to 10 µm and less than or equal to 200 µm, more preferably greater than or equal to 20 µm and less than or equal to 50 µm.

There is no particular limitation on a material of the metal substrate, but it is preferable to use, for example, aluminum, copper, nickel, or a metal alloy such as an aluminum alloy or stainless steel.

It is preferable to use a substrate subjected to insulation treatment in such a manner that a surface of a conductive substrate is oxidized or an insulating film is formed on a surface. An insulating film may be formed by, for example, a coating method such as a spin-coating method or a dipping method, an electrodeposition method, an evaporation method, or a sputtering method. An oxide film may be formed on the substrate surface by an anodic oxidation method, exposing to or heating in an oxygen atmosphere, or the like.

The flexible substrate may have a stacked structure of a layer of any of the above-mentioned materials and a hard coat layer (e.g., a silicon nitride layer) that protects a surface of the touch panel from damage or the like, a layer (e.g., an aramid resin layer) that can disperse pressure, or the like. Furthermore, to suppress a decrease in the lifetime of the display element due to moisture and the like, an insulating film with low water permeability may be provided. For example, a film containing nitrogen and silicon (e.g., a silicon nitride film or a silicon oxynitride film) or a film containing nitrogen and aluminum (e.g., an aluminum nitride film) may be provided.

The substrate may be formed by stacking a plurality of layers. In particular, when a glass layer is used, a barrier property against water and oxygen can be improved, and thus, a highly reliable touch panel can be provided.

A substrate in which a glass layer, an adhesive layer, and an organic resin layer are stacked from the side closer to the display element can be used, for example. The thickness of the glass layer is greater than or equal to 20 µm and less than or equal to 200 µm, preferably greater than or equal to 25 µm and less than or equal to 100 µm. With such a thickness, the glass layer can have both a high barrier property against water and oxygen and a high flexibility. The thickness of the organic resin layer is greater than or equal to 10 µm and less than or equal to 200 µm, preferably greater than or equal to 20 µm and less than or equal to 50 µm. By providing such an organic resin layer, occurrence of a break or a crack in the glass layer can be inhibited, and the mechanical strength can be improved. With the substrate that includes such a composite material of a glass material and an organic resin, a highly reliable flexible touch panel can be provided.

[Transistor]

The transistor includes a conductive film functioning as the gate electrode, the semiconductor layer, a conductive film functioning as the source electrode, a conductive film functioning as the drain electrode, and the insulating film functioning as the gate insulating film. In the above example, a bottom-gate transistor is used.

Note that there is no particular limitation on the structure of the transistor included in the touch panel of one embodiment of the present invention. For example, a staggered transistor or an inverted staggered transistor may be used. A top-gate transistor or a bottom-gate transistor may be used.

There is no particular limitation on the crystallinity of a semiconductor material used for the transistor, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be suppressed.

As a semiconductor material for the semiconductor layer of the transistor, an element of Group 14, a compound semiconductor, or an oxide semiconductor can be used, for example. Typically, a semiconductor containing silicon, a semiconductor containing gallium arsenide, an oxide semiconductor containing indium, or the like can be used.

An oxide semiconductor is preferably used as a semiconductor in which a channel of the transistor is formed. In particular, an oxide semiconductor having a wider band gap than silicon is preferably used. A semiconductor material having a wider band gap and a lower carrier density than silicon is preferably used because the off-state current of the transistor can be reduced.

For example, it is preferable that the oxide semiconductor contain at least indium (In) or zinc (Zn). It is further preferable that the oxide semiconductor include an In-M-Zn oxide (M is a metal such as Al, Ti, Ga, Ge, Y, Zr, Sn, La, Ce, Sn, or Hf).

As the semiconductor layer, it is particularly preferable to use an oxide semiconductor film including a plurality of crystal parts whose c-axes are aligned substantially perpendicular to a surface on which the semiconductor layer is formed or the top surface of the semiconductor layer and having no grain boundary between adjacent crystal parts.

There is no grain boundary in such an oxide semiconductor; therefore, generation of a crack in an oxide semiconductor film that is caused by stress when a display panel is bent is prevented. Therefore, such an oxide semiconductor can be preferably used for a flexible touch panel that is used in a bent state, or the like.

Moreover, the use of such an oxide semiconductor for the semiconductor layer makes it possible to provide a highly reliable transistor in which a variation in electrical characteristics is suppressed.

Charge accumulated in a capacitor through a transistor can be held for a long time because of the low off-state current of the transistor. When such a transistor is used for a pixel, operation of a driver circuit can be stopped while a gray scale of an image displayed in each display region is maintained. As a result, a display device with an extremely low power consumption can be obtained.

<Oxide Semiconductor Film>

It is preferable that the oxide semiconductor films 110 and 111 each include a film represented by an In-M-Zn oxide that contains, for example, at least indium (In), zinc (Zn), and M (a metal such as Al, Ti, Ga, Y, Zr, La, Ce, Sn, or Hf). In order to reduce variations in electrical characteristics of the transistor including the oxide semiconductor, the oxide semiconductor preferably contains a stabilizer in addition to the above elements.

Examples of the stabilizer, including metals that can be used as M, are gallium (Ga), tin (Sn), hafnium (Hf), aluminum (Al), and zirconium (Zr). Other examples of the stabilizer are lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As an oxide semiconductor included in each of the oxide semiconductor films 110 and 111, any of the following oxides can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, an "In—Ga—Zn-based oxide" means an oxide containing In, Ga, and Zn as its main components, and there is no limitation on the ratio of In:Ga:Zn. The In—Ga—Zn-based oxide may contain another metal element in addition to In, Ga, and Zn.

The oxide semiconductor films 110 and 111 may include the same metal elements contained in the above oxides. The use of the same metal elements for the oxide semiconductor films 110 and 111 can reduce the manufacturing cost. For example, when metal oxide targets with the same metal composition are used, the manufacturing cost can be reduced, and the same etching gas or the same etchant can be used in processing the oxide semiconductor films 110 and 111. Note that even when the oxide semiconductor films 110 and 111 include the same metal elements, they have different compositions in some cases. For example, a metal element in a film is released during the manufacturing process of the transistor and the capacitor, which might result in different metal compositions.

Note that in the case where the oxide semiconductor film 110 includes an In-M-Zn oxide, when the summation of In and M is assumed to be 100 atomic %, the atomic proportions of In and M are preferably higher than 25 atomic % and lower than 75 atomic %, respectively, more preferably higher than 34 atomic % and lower than 66 atomic %, respectively.

The energy gap of the oxide semiconductor film 110 is 2 eV or more, preferably 2.5 eV or more, more preferably 3 eV or more. In this manner, the off-state current of the transistor can be reduced by using an oxide semiconductor having a wide energy gap.

The thickness of the oxide semiconductor film 110 is greater than or equal to 3 nm and less than or equal to 200 nm, preferably greater than or equal to 3 nm and less than or equal to 100 nm, more preferably greater than or equal to 3 nm and less than or equal to 50 nm.

In the case where the oxide semiconductor film 110 includes an In-M-Zn oxide (M represents Al, Ti, Ga, Ge, Y, Zr, Sn, La, Ce, Hf, or Nd), it is preferable that the atomic ratio of metal elements of a sputtering target used for forming a film of the In-M-Zn oxide satisfy In≥M and Zn≥M. As the atomic ratio of the metal elements of such a sputtering target, In:M:Zn=1:1:1, In:M:Zn=1:1:1.2, In:M:Zn=3:1:2, In:M:Zn=1:3:4, In:M:Zn=1:3:6, and the like are given. Note that the atomic ratio of metal elements in the formed oxide semiconductor film 110 varies from the above atomic ratio of metal elements of the sputtering target within a range of ±40% as an error.

An oxide semiconductor film with a low carrier density is used as the oxide semiconductor film 110. For example, an oxide semiconductor film whose carrier density is lower than or equal to $1\times10^{17}/cm^3$, preferably lower than or equal to $1\times10^{15}/cm^3$, more preferably lower than or equal to $1\times10^{13}/cm^3$, more preferably lower than or equal to $1\times10^{11}/cm^3$ is used as the oxide semiconductor film 110.

Note that, without limitation to the compositions and materials described above, a material with an appropriate composition may be used depending on required semiconductor characteristics and electrical characteristics (e.g., field-effect mobility and threshold voltage) of the transistor. Furthermore, to obtain required semiconductor characteristics of the transistor, it is preferable that the carrier density, the impurity concentration, the defect density, the atomic ratio of a metal element to oxygen, the interatomic distance, the density, and the like of the oxide semiconductor film 110 be set to be appropriate.

When silicon or carbon that is one of elements belonging to Group 14 is contained in the oxide semiconductor film 110, oxygen vacancies are increased, and the oxide semiconductor film 110 has n-type conductivity. Thus, the concentration of silicon or carbon (measured by secondary ion mass spectrometry (SIMS)) of the oxide semiconductor film 110 is lower than or equal to $2\times10^{18}$ atoms/cm$^3$, preferably lower than or equal to $2\times10^{17}$ atoms/cm$^3$.

Furthermore, the concentration of alkali metal or alkaline earth metal in the oxide semiconductor film 110, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the oxide semiconductor film 110.

When nitrogen is contained in the oxide semiconductor film 110, electrons serving as carriers are generated to increase the carrier density, so that the oxide semiconductor film 110 easily has n-type conductivity. Thus, a transistor including an oxide semiconductor that contains nitrogen is likely to be normally on. For this reason, nitrogen in the oxide semiconductor film is preferably reduced as much as possible; the concentration of nitrogen that is measured by SIMS is preferably set to, for example, lower than or equal to $5\times10^{18}$ atoms/cm$^3$.

The oxide semiconductor film 110 may have a non-single-crystal structure, for example. The non-single-crystal structure includes a c-axis aligned crystalline oxide semiconductor (CAAC-OS) that is described later, a polycrystalline structure, a microcrystalline structure that is described later, or an amorphous structure, for example. Among the non-single-crystal structures, an amorphous structure has the highest density of defect states, whereas CAAC-OS has the lowest density of defect states.

The oxide semiconductor film 110 may have an amorphous structure, for example. An oxide semiconductor film having an amorphous structure has disordered atomic arrangement and no crystalline component, for example. Alternatively, an oxide film having an amorphous structure has, for example, an absolutely amorphous structure and no crystal part.

Note that the oxide semiconductor film 110 may be a mixed film including two or more of the following: a region having an amorphous structure, a region having a microcrystalline structure, a region having a polycrystalline structure, a region of CAAC-OS, and a region having a single-crystal structure. Furthermore, the mixed film has a stacked-layer structure of two or more of the following in some cases: the region having an amorphous structure, the region having a microcrystalline structure, the region having a polycrystalline structure, the region of CAAC-OS, and the region having a single-crystal structure.

Note that silicon may be used as a semiconductor in which a channel of the transistor is formed. Although amorphous silicon may be used as silicon, silicon having crystallinity is particularly preferable. For example, microcrystalline silicon, polycrystalline silicon, single crystal silicon, or the like is preferably used. In particular, polycrystalline silicon can be formed at a lower temperature than single crystal silicon and has a higher field-effect mobility and a higher reliability than amorphous silicon. When such a polycrystalline semiconductor is used for a pixel, the aperture ratio of the pixel can be improved. Even in the case where pixels are provided at extremely high density, a gate driver circuit and a source driver circuit can be formed over a substrate over which the pixels are formed, and the number of components of an electronic device can be reduced.

[Conductive Film]

As conductive films such as a gate, a source, and a drain of the transistor and a wiring and an electrode in the touch panel, a single-layer structure or a stacked-layer structure using any of metals such as aluminum, titanium, chromium, nickel, copper, yttrium, zirconium, molybdenum, silver, tantalum, and tungsten, or an alloy containing any of these metals as its main component can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may also be used. Copper containing manganese is preferably used because controllability of a shape by etching is increased.

As a light-transmitting conductive material, a conductive oxide such as indium oxide, indium tin oxide (ITO), indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium, or an alloy material containing any of these metal materials can be used. Alternatively, a nitride of the metal material (e.g., titanium nitride) or the like may be used. In the case of using the metal material or the alloy material (or the nitride thereof), the thickness is set small enough to be able to transmit light. Alternatively, a stack of any of the above materials can be used as the conductive film. For example, a stacked film of indium tin oxide and an alloy of silver and magnesium is preferably used because the conductivity can be increased.

Alternatively, for the conductive film, an oxide semiconductor similar to that of the semiconductor layer is preferably used. In that case, it is preferable that the conductive film be formed to have a lower electric resistance than a region in the semiconductor layer where a channel is formed.

For example, such a conductive film can be used as the oxide semiconductor films 111 and 111a. Alternatively, it can be used as another light-transmitting conductive film.

[Method for Controlling Resistivity of Oxide Semiconductor]

An oxide semiconductor film that can be used as each of the oxide semiconductor films 110, 111, and 111a includes a semiconductor material whose resistivity can be controlled by oxygen vacancies in the film and/or the concentration of impurities such as hydrogen or water in the film. Thus, treatment to be performed on the oxide semiconductor films 110, 111, and 111a is selected from the following to control the resistivity of each of the oxide semiconductor films: treatment for increasing oxygen vacancies and/or the impurity concentration and treatment for reducing oxygen vacancies and/or the impurity concentration.

Specifically, plasma treatment is performed on the oxide semiconductor film used as the oxide semiconductor film 111 serving as the electrode of the capacitor 160 and the oxide semiconductor film 111a to increase oxygen vacancies and/or impurities such as hydrogen or water in the oxide semiconductor film, so that the oxide semiconductor film can have a high carrier density and a low resistivity. Furthermore, an insulating film containing hydrogen is formed in contact with the oxide semiconductor film to diffuse hydrogen from the insulating film containing hydrogen (e.g., the insulating film 118) to the oxide semiconductor film, so that the oxide semiconductor film can have a high carrier density and a low resistivity. As described above, the oxide semiconductor films 111 and 111a serve as a semiconductor before the step of increasing oxygen vacancies or diffusing hydrogen in the films, whereas they serve as a conductor after the step.

Note that in increasing oxygen vacancies in the oxide semiconductor film by plasma treatment, when the oxide semiconductor film has a large thickness, the degree of an increase in oxygen vacancies is varied in the oxide semiconductor film in some cases. Moreover, in diffusing hydrogen from the insulating film to the oxide semiconductor film, when the oxide semiconductor film has a large thickness, the degree of an increase in impurities such as hydrogen or water is varied in the oxide semiconductor film in some cases. As a result, the resistivity of a portion near the bottom surface of the oxide semiconductor film becomes higher than that of a portion near the top surface of the film in some cases. Thus, with such a variation, even in the case where the resistivity of the oxide semiconductor film is sufficiently low, a conductive film such as a wiring is electrically connected to the oxide semiconductor film at its bottom surface side, so that contact resistance between the conductive film and the oxide semiconductor film is increased in some cases. On the other hand, the oxide semiconductor film needs to have a thickness that is large enough to serve as a conductive film. Thus, it is preferable that the oxide semiconductor films 111 and 111a each have a thickness with which a variation in resistivity in the film thickness direction is not caused. Specifically, the thickness is preferably 1 than or equal to 30 nm and less than or equal to 70 nm, further preferably greater than or equal to 50 nm and less than or equal to 70 nm.

The oxide semiconductor film 110 that serves as the channel region of the transistor 150 is not in contact with an insulating film 106 containing hydrogen or the insulating film 118 containing hydrogen because the insulating films 107, 114, and 116 are provided. With the use of an insulating film containing oxygen, in other words, an insulating film capable of releasing oxygen, for at least one of the insulating films 107, 114, and 116, oxygen can be supplied to the oxide semiconductor film 110. The oxide semiconductor film 110 to which oxygen is supplied is an oxide semiconductor film having a high resistivity because oxygen vacancies in the film or at the interface are compensated. Note that as the insulating film capable of releasing oxygen, a silicon oxide film or a silicon oxynitride film can be used, for example.

To reduce the resistivity of the oxide semiconductor film, an ion implantation method, an ion doping method, a plasma immersion ion implantation method, or the like can be employed to inject hydrogen, boron, phosphorus, or nitrogen into the oxide semiconductor film.

To reduce the resistivity of the oxide semiconductor film, plasma treatment may be performed on the oxide semiconductor film. For the plasma treatment, for example, a gas containing at least one of a rare gas (He, Ne, Ar, Kr, or Xe), hydrogen, and nitrogen is typically used. Specifically, plasma treatment in an Ar atmosphere, plasma treatment in a mixed gas atmosphere of Ar and hydrogen, plasma treatment in an ammonia atmosphere, plasma treatment in a mixed gas atmosphere of Ar and ammonia, plasma treatment in a nitrogen atmosphere, or the like can be employed.

In the oxide semiconductor film subjected to the plasma treatment, an oxygen vacancy is formed in a lattice from which oxygen is released (or in a portion from which oxygen is released). This oxygen vacancy can generate a carrier. When hydrogen is supplied from an insulating film that is in the vicinity of the oxide semiconductor film, specifically, that is in contact with the lower surface or the upper surface of the oxide semiconductor film, and hydrogen is bonded to the oxygen vacancy, an electron serving as a carrier might be generated.

The oxide semiconductor film in which oxygen vacancies are filled and the hydrogen concentration is reduced can be referred to as a highly purified intrinsic or substantially highly purified intrinsic oxide semiconductor film. The term "substantially intrinsic" refers to the state where the oxide semiconductor film has a carrier density of lower than $8\times10^{11}/cm^3$, preferably lower than $1\times10^{11}/cm^3$, more preferably lower than $1\times10^{10}/cm^3$. A highly purified intrinsic or substantially highly purified intrinsic oxide semiconductor film has few carrier generation sources and thus can have a low carrier density. The highly purified intrinsic or substantially highly purified intrinsic oxide semiconductor film has a low density of defect states and accordingly can have a low density of trap states.

The highly purified intrinsic or substantially highly purified intrinsic oxide semiconductor film has an extremely low off-state current; even when an element has a channel width of $1\times10^6$ μm and a channel length of 10 μm, the off-state current can be lower than or equal to the measurement limit of a semiconductor parameter analyzer, i.e., lower than or equal to $1\times10^{-13}$ A, at a voltage (drain voltage) between a source electrode and a drain electrode of from 1 V to 10 V. Accordingly, the transistor 150 in which the channel region is formed in the oxide semiconductor film 110 formed using a highly purified intrinsic or substantially highly purified intrinsic oxide semiconductor film can have a small variation in electrical characteristics and a high reliability.

For example, an insulating film containing hydrogen, in other words, an insulating film capable of releasing hydrogen, typically, a silicon nitride film, is used as the insulating film 118, whereby hydrogen can be supplied to the oxide semiconductor film 111. The hydrogen concentration in the insulating film capable of releasing hydrogen is preferably higher than or equal to $1\times10^{22}$ atoms/cm$^3$. Such an insulating film is formed in contact with the oxide semiconductor films 111 and 111a, whereby hydrogen can be effectively contained in the oxide semiconductor films 111 and 111a. In this manner, the resistivity of the oxide semiconductor film can be controlled by changing the structures of the insulating films in contact with the oxide semiconductor films 110, 111, and 111a. Note that a material similar to the insulating film 118 may be used for the insulating film 106. The use of silicon nitride for the insulating film 106 prevents the gate electrode 104 from being supplied with oxygen diffused from the insulating film 107 and being oxidized.

Hydrogen contained in the oxide semiconductor film reacts with oxygen bonded to a metal atom to be water and also causes an oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Accordingly, the oxide semiconductor film 111 formed in contact with the insulating film containing hydrogen is an oxide semiconductor film that has a higher carrier density than the oxide semiconductor film 110.

Hydrogen in the oxide semiconductor film 110 of the transistor 150 in which a channel region is formed is preferably reduced as much as possible. Specifically, in the oxide semiconductor film 110, the concentration of hydrogen that is measured by SIMS is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, more preferably lower than $5\times10^{18}$ atoms/cm$^3$, more preferably lower than or equal to $1\times10^{18}$ atoms/cm$^3$, more preferably lower than or equal to $5\times10^{17}$ atoms/cm$^3$, more preferably lower than or equal to $1\times10^{16}$ atoms/cm$^3$.

The oxide semiconductor film 111 serving as the electrode of the capacitor 160 and the oxide semiconductor film 111a serving as the second gate of the transistor 150 are each an oxide semiconductor film that has a higher hydrogen concentration and/or a larger number of oxygen vacancies than the oxide semiconductor film 110 and has a lower resistivity than the oxide semiconductor film 110. The hydrogen concentration in the oxide semiconductor films 111 and 111a is higher than or equal to $8\times10^{19}$ atoms/cm$^3$, preferably higher than or equal to $1\times10^{20}$ atoms/cm$^3$, more preferably higher than or equal to $5\times10^{20}$ atoms/cm$^3$. The hydrogen concentration in the oxide semiconductor films 111 and 111a is greater than or equal to 2 times, preferably greater than or equal to 10 times the hydrogen concentration in the oxide semiconductor film 110. The resistivity of the oxide semiconductor films 111 and 111a is preferably greater than or equal to $1\times10^{-8}$ times and less than $1\times10^{-1}$ times the resistivity of the oxide semiconductor film 110. The resistivity of the conductive film is typically higher than or equal to $1\times10^{-3}$ Ωcm and lower than $1\times10^{4}$ Ωcm, preferably higher than or equal to $1\times10^{-3}$ Ωcm and lower than $1\times10^{-1}$ Ωcm.

<Insulating Film>

As each of the insulating films 106 and 107 serving as a gate insulating film of the transistor 150, an insulating film including at least one of the following films formed by a plasma chemical vapor deposition (CVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that the stacked structure of the insulating films 106 and 107 is not necessarily employed, and an insulating film with a single-layer structure selected from the above films may be used.

The insulating film 106 has a function of a blocking film that inhibits penetration of oxygen. For example, in the case where excess oxygen is supplied to the insulating film 107, the insulating film 114, the insulating film 116, and/or the oxide semiconductor film 110, the insulating film 106 can inhibit penetration of oxygen.

Note that the insulating film 107 that is in contact with the oxide semiconductor film 110 serving as a channel region of the transistor 150 is preferably an oxide insulating film and preferably includes a region including oxygen in excess of the stoichiometric composition (an oxygen-excess region). In other words, the insulating film 107 is an insulating film that is capable of releasing oxygen. In order to provide the oxygen-excess region in the insulating film 107, the insulating film 107 is formed in an oxygen atmosphere, for example. Alternatively, the oxygen-excess region may be formed by supplying oxygen to the formed insulating film 107. As a method for supplying oxygen, an ion implantation method, an ion doping method, a plasma immersion ion implantation method, plasma treatment, or the like can be employed.

In the case where hafnium oxide is used for the insulating films 106 and 107, the following effect is attained. Hafnium oxide has a higher dielectric constant than silicon oxide and silicon oxynitride. Therefore, the thicknesses of the insulating films 106 and 107 can be made large as compared with the case where silicon oxide is used; as a result, a leakage current due to a tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to the above examples.

In this embodiment, a silicon nitride film is formed as the insulating film 106, and a silicon oxide film is formed as the insulating film 107. The silicon nitride film has a higher dielectric constant than a silicon oxide film and needs a larger thickness for capacitance equivalent to that of the silicon oxide film. Thus, when the silicon nitride film is included as the insulating film 108 serving as the gate insulating film of the transistor 150, the physical thickness of the insulating film can be increased. Therefore, the electrostatic breakdown of the transistor 150 can be prevented by inhibiting a reduction in the withstand voltage of the transistor 150 and improving the withstand voltage of the transistor 150.

<Protective Insulating Film>

As each of the insulating films 114, 116, and 118 serving as a protective insulating film of the transistor 150, an insulating film including at least one of the following films formed by a plasma CVD method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

Note that the insulating film 114 that is in contact with the oxide semiconductor film 110 serving as a channel region of the transistor 150 is preferably an oxide insulating film capable of releasing oxygen. In other words, the insulating film capable of releasing oxygen is an insulating film that includes a region containing oxygen in excess of that in the stoichiometric composition (oxygen-excess region). In order to provide the oxygen-excess region in the insulating film 114, the insulating film 114 is formed in an oxygen atmosphere, for example. Alternatively, the oxygen-excess region may be formed by supplying oxygen to the formed insulating film 114. As a method for supplying oxygen, an ion implantation method, an ion doping method, a plasma immersion ion implantation method, plasma treatment, or the like can be employed.

The use of the insulating film capable of releasing oxygen as the insulating film 114 can reduce the number of oxygen vacancies in the oxide semiconductor film 110 by transferring oxygen to the oxide semiconductor film 110 serving as the channel region of the transistor 150. For example, the number of oxygen vacancies in the oxide semiconductor film 110 can be reduced by using an insulating film having the following feature: the number of oxygen molecules released from the insulating film by heat treatment at a temperature higher than or equal to 100° C. and lower than or equal to 700° C., or higher than or equal to 100° C. and lower than or equal to 500° C. is greater than or equal to $1.0\times10^{18}$ molecules/cm$^3$ when measured by thermal desorption spectroscopy (hereinafter referred to as TDS).

It is preferable that the number of defects in the insulating film 114 be small, typically the spin density corresponding to a signal that appears at g=2.001 due to a dangling bond of silicon be lower than or equal to $3\times10^{17}$ spins/cm$^3$ by ESR measurement. This is because if the density of defects in the insulating film 114 is high, oxygen is bonded to the defects and the amount of oxygen that permeates the insulating film 114 is decreased. Furthermore, it is preferable that the amount of defects at the interface between the insulating film 114 and the oxide semiconductor film 110 be small and typically, the spin density of a signal that appears at g=1.89 or more and 1.96 or less due to the defect in the oxide semiconductor film 110 be lower than or equal to $1\times10^{17}$ spins/cm$^3$, more preferably lower than or equal to the lower limit of detection by ESR measurement.

Note that all oxygen entering the insulating film 114 from the outside moves to the outside of the insulating film 114 in some cases. Alternatively, some oxygen entering the insulating film 114 from the outside remains in the insulating film 114 in some cases. Furthermore, movement of oxygen occurs in the insulating film 114 in some cases in such a manner that oxygen enters the insulating film 114 from the outside and oxygen contained in the insulating film 114 moves to the outside of the insulating film 114. When an oxide insulating film that is permeable to oxygen is formed as the insulating film 114, oxygen released from the insulating film 116 provided over the insulating film 114 can be moved to the oxide semiconductor film 110 through the insulating film 114.

The insulating film 114 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. A silicon oxynitride film that releases less nitrogen oxide, an aluminum oxynitride film that releases less nitrogen oxide, or the like can be used as the oxide insulating film.

Note that a silicon oxynitride film that releases a small amount of nitrogen oxide is a film of which the amount of released ammonia is larger than the amount of released nitrogen oxide in TDS; the amount of released ammonia is typically greater than or equal to $1\times10^{18}$ molecules/cm$^3$ and less than or equal to $5\times10^{19}$ molecules/cm$^3$. The amount of released ammonia corresponds to the released amount caused by heat treatment at a film surface temperature higher than or equal to 50° C. and lower than or equal to 650° C., preferably higher than or equal to 50° C. and lower than or equal to 550° C.

Nitrogen oxide (NO$_x$; x is greater than 0 and less than or equal to 2, preferably greater than or equal to 1 and less than or equal to 2), typically NO$_2$ or NO, forms levels in the insulating film 114, for example. The levels are positioned in the energy gap of the oxide semiconductor film 110. Therefore, when nitrogen oxide is diffused to the interface between the insulating film 114 and the oxide semiconductor film 110, an electron is trapped by the level on the insulating film 114 side. As a result, the trapped electron remains in the vicinity of the interface between the insulating film 114 and the oxide semiconductor film 110; thus, the threshold voltage of the transistor is shifted in the positive direction.

Nitrogen oxide reacts with ammonia and oxygen in heat treatment. Since nitrogen oxide contained in the insulating film 114 reacts with ammonia contained in the insulating film 216 in heat treatment, nitrogen oxide contained in the insulating film 114 is reduced. Therefore, an electron is hardly trapped at the interface between the insulating film 114 and the oxide semiconductor film 110.

In a transistor using the oxide insulating film as the insulating film 114, the shift in threshold voltage can be reduced, which leads to a smaller change in electrical characteristics of the transistor.

Note that in an ESR spectrum obtained at 100 K or lower of the insulating film 114, by heat treatment in a manufacturing process of the transistor, typically heat treatment at a temperature lower than 400° C. or lower than 375° C. (preferably higher than or equal to 340° C. and lower than or equal to 360° C.), a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor greater than or equal to 1.964 and less than or equal to 1.966 are observed. The split width of the first and second signals and the split width of the second and third signals, which are obtained by ESR measurement using an X-band, are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is less than $1\times10^{18}$ spins/cm$^3$, typically greater than or equal to $1\times10^{17}$ spins/cm$^3$ and less than $1\times10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than 0 and less than or equal to 2, preferably greater than or equal to 1 and less than or equal to 2). Typical examples of nitrogen oxide include nitrogen monoxide and nitrogen dioxide. In other words, the smaller the sum of the spin densities of the first signal that appears at a g-factor greater than or equal to 2.037 and less than or equal to 2.039, the second signal that appears at a g-factor greater than or equal to 2.001 and less than or equal to 2.003, and the third signal that appears at a g-factor greater than or equal to 1.964 and less than or equal to 1.966 is, the lower the content of nitrogen oxide in the oxide insulating film is.

The nitrogen concentration of the oxide insulating film measured by SIMS is lower than or equal to $6\times10^{20}$ atoms/cm$^3$.

The oxide insulating film is formed by a PECVD method at a substrate temperature higher than or equal to 220° C. and lower than or equal to 350° C. using silane and dinitrogen monoxide, whereby a dense and hard film can be formed.

The insulating film 116 in contact with the insulating film 114 is formed using an oxide insulating film whose oxygen content is in excess of that in the stoichiometric composition. Part of oxygen is released from the oxide insulating film whose oxygen content is in excess of that in the stoichiometric composition by heating. The oxide insulating film whose oxygen content is in excess of that in the stoichiometric composition is an oxide insulating film of which the amount of released oxygen converted into oxygen atoms is greater than or equal to $1.0\times10^{19}$ atoms/cm$^3$, preferably greater than or equal to $3.0\times10^{20}$ atoms/cm$^3$ in TDS. Note that the temperature of the film surface in the TDS is preferably higher than or equal to 100° C. and lower than or equal to 700° C., or higher than or equal to 100° C. and lower than or equal to 500° C.

Furthermore, it is preferable that the amount of defects in the insulating film 116 be small, typically the spin density of a signal that appears at g=2.001 due to a dangling bond of silicon be less than $1.5\times10^{18}$ spins/cm$^3$, preferably less than or equal to $1\times10^{18}$ spins/cm$^3$ by ESR measurement. Note that the insulating film 116 is provided more apart from the oxide semiconductor film 110 than the insulating film 114 is; thus, the insulating film 116 may have higher defect density than the insulating film 114.

The thickness of the insulating film 114 can be greater than or equal to 5 nm and less than or equal to 150 nm, preferably greater than or equal to 5 nm and less than or equal to 50 nm, more preferably greater than or equal to 10 nm and less than or equal to 30 nm. The thickness of the insulating film 116 can be greater than or equal to 30 nm and less than or equal to 500 nm, preferably greater than or equal to 150 nm and less than or equal to 400 nm.

The insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, the present invention is not limited to this. For example, a single-layer structure of the insulating film 114, a single-layer structure of the insulating film 116, or a stacked-layer structure of three or more layers may be used.

The insulating film 118 serving as a dielectric film of the capacitor 160 is preferably a nitride insulating film. The relative dielectric constant of a silicon nitride film is higher than that of a silicon oxide film, and the silicon nitride film needs to have a larger film thickness than the silicon oxide film to obtain a capacitance equivalent to that of the silicon oxide film. Thus, when the silicon nitride film is included in the insulating film 118 serving as the dielectric film of the capacitor 160, the physical thickness of the insulating film can be increased. Accordingly, a reduction in the withstand voltage of the capacitor 160 can be inhibited. Furthermore, the electrostatic breakdown of the capacitor 160 can be prevented by improving the withstand voltage. Note that the insulating film 118 also has a function of decreasing the resistivity of the oxide semiconductor film 111 that functions as the electrode of the capacitor 160.

The insulating film 118 has a function of blocking oxygen, hydrogen, water, an alkali metal, an alkaline earth metal, or the like. By providing the insulating film 118, it is possible to prevent outward diffusion of oxygen from the oxide semiconductor film 110, outward diffusion of oxygen contained in the insulating films 114 and 116, and entry of hydrogen, water, or the like into the oxide semiconductor film 110 from the outside. Note that instead of the nitride insulating film having a blocking effect against oxygen, hydrogen, water, an alkali metal, an alkaline earth metal, and the like, an oxide insulating film having a blocking effect against oxygen, hydrogen, water, and the like, may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

Examples of an insulating material that can be used for a planarization film, an overcoat, a spacer, and the like include a resin such as an acrylic resin or an epoxy resin, a resin having a siloxane bond, and an inorganic insulating material such as silicon oxide, silicon oxynitride, silicon nitride oxide, silicon nitride, or aluminum oxide.

[Adhesive Layer]

For the adhesive layer, a curable resin such as a heat curable resin, a photocurable resin, or a two-component type curable resin can be used. For instance, an acrylic resin, polyurethane, an epoxy resin, or a resin having a siloxane bond can be used.

[Connection Layer]

For the connection layer, an anisotropic conductive film (ACF), an anisotropic conductive paste (ACP), or the like can be used.

[Coloring Film]

Examples of a material that can be used for the coloring film include a metal material, a resin material, and a resin material containing a pigment or dye.

The above is the description of the components.

[Cross-Sectional Structure Example 2]

Figure 11:
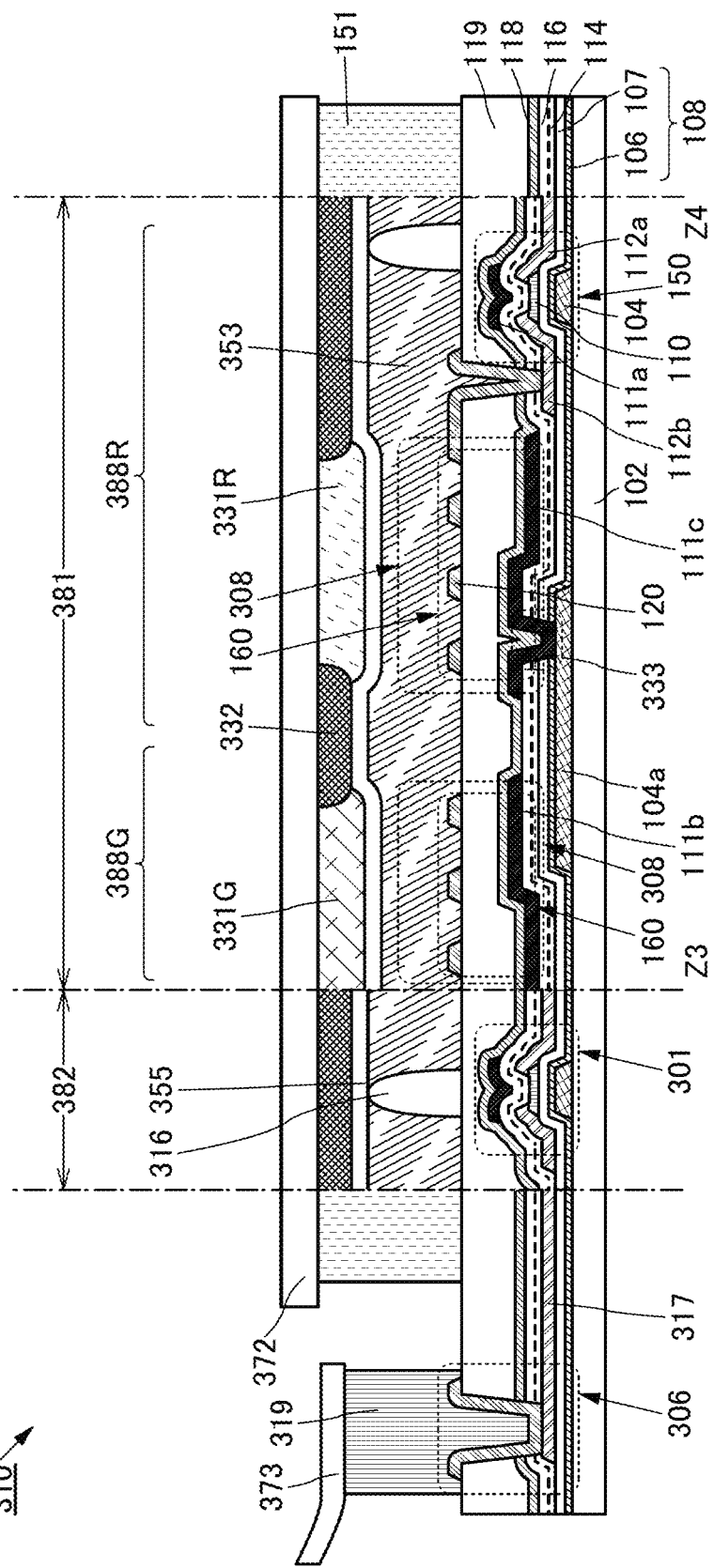
FIG. 11 is a cross-sectional view illustrating an example of a touch panel of one embodiment.

FIG. 11 illustrates a structure example of a cross section of a touch panel that is partly different from the above-described structure examples. Note that the description of the portions already described is omitted and different portions are described.

FIG. 11 has a structure in which the conductive films 334, 335, and 341 and the FPC 375 are not provided on the display surface side of the substrate 372. The oxide semiconductor film 111 serving as a common electrode of the liquid crystal element 308 also serves as the pair of electrodes of the touch sensor. Specifically, an oxide semiconductor film 111b that extends in one direction and an oxide semiconductor film 111c that is electrically connected to a conductive film 104a extending in the direction orthogonal to the oxide semiconductor film 111b serve as the pair of electrodes of the touch sensor. With such a structure, the processing steps can be simpler than those of the structure illustrated in FIG. 8. Note that the oxide semiconductor film 111c is electrically connected to the conductive film 104a via an opening 333 provided in the insulating films 108, 114, and 116. The conductive film 104a can be formed at the same time using the same material as the gate electrode 104.

Figure 12A:
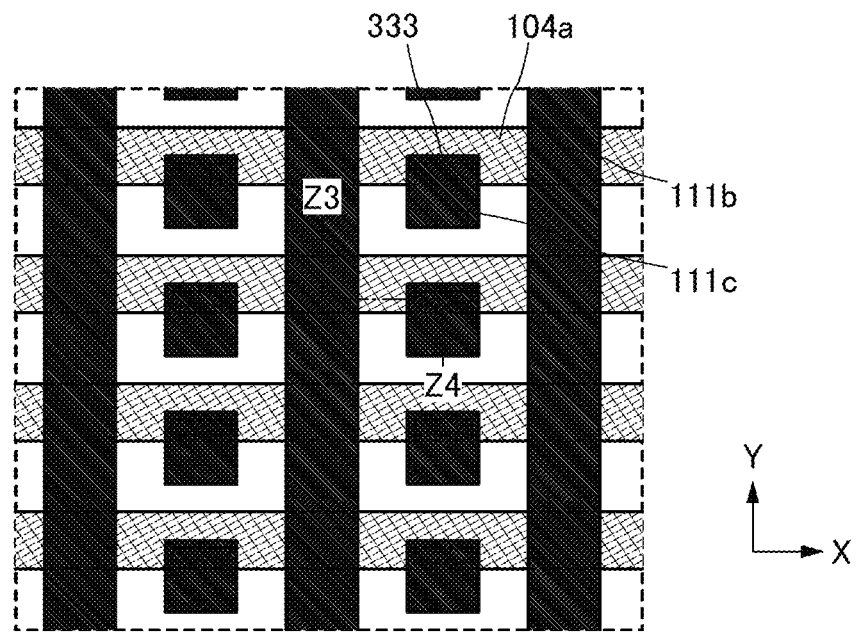
FIGS. 12A and 12B are each a top view illustrating a structure of electrodes of a touch sensor of one embodiment.

Here, the arrangement of the electrodes included in the touch sensor is described. FIG. 12A is a schematic top view of the pair of electrodes of the touch sensor included in the touch panel 310 illustrated in FIG. 11. The dashed-dotted line Z3-Z4 in FIG. 12A corresponds to the display portion 381 in FIG. 11.

The oxide semiconductor film 111b that is one electrode of the touch sensor extends in the Y direction. The oxide semiconductor film 111c that is the other electrode of the touch sensor is electrically connected to the conductive film 104a via the opening 333. The conductive film 104a extends in the X direction and intersects with the oxide semiconductor film 111b.

Figure 12B:
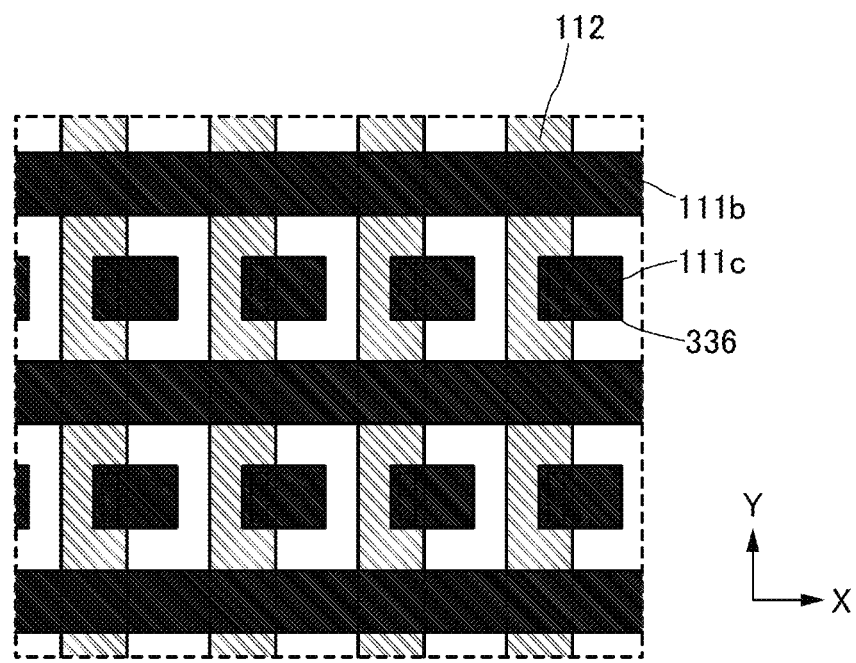

Alternatively, as the conductive film extending in one direction, a conductive film 112 that is formed at the same time using the same material as the source electrode 112a and the drain electrode 112b may be used instead of the conductive film 104a (see FIG. 12B). Note that FIG. 12B shows an example in which the oxide semiconductor film 111b extends in the X direction and the conductive film 112 extends in the Y direction. The oxide semiconductor film 111c is electrically connected to the conductive film 112 via an opening 336 provided in the insulating film 118 (not illustrated).

Other Examples

Note that one embodiment of the present invention is not limited to the above-described structures and can have various structures.

<Peripheral Circuit>

A peripheral circuit can be formed outside a substrate over which pixels are formed. That is, a circuit for driving a touch sensor and a circuit for driving a pixel can be separately formed. Note that one circuit can also have both the functions.

A driver circuit for selecting one of the conductive films (electrodes) in the X direction or one of the conductive films (electrodes) in the Y direction of the touch sensor can be formed with a TFT over a substrate over which pixels are formed.

The circuit for driving a touch sensor may be provided on the gate driver side for driving a pixel or the source driver side.

An IC is preferably used as a circuit that has a sensing function and is one of two circuits, a circuit electrically connected to the conductive films (electrodes) in the X direction and a circuit electrically connected to the conductive films (electrodes) in the Y direction, of the touch sensor. In that case, the conductive films are preferably controlled with the IC via an FPC.

<Material for Conductive Film (Electrode) of Touch Sensor>

The pair of conductive films of the touch sensor is preferably formed using the same material as the common electrode, the pixel electrode, or the like of the liquid crystal element.

Alternatively, the pair of conductive films of the touch sensor may be formed of a meshed metal film (also referred to as a metal mesh).

By providing a metal film directly on or below at least one of the conductive film (electrode) in the X direction and the conductive film (electrode) in the Y direction of the touch sensor, the resistance of the conductive film can be reduced. In that case, a stacked structure of a conductive film including a metal oxide and a conductive film including a metal is preferably used, because these conductive films can be formed by a patterning technique using a half tone mask and thus the process can be simplified.

<Wiring for Connecting Conductive Films (Electrodes) of Touch Sensor>

In a region of the touch sensor where the conductive film in the X direction intersects with the conductive film in the Y direction, a bridge structure using another conductive film is formed in such a manner that, for example, by using a conductive film on the same plane as the gate electrode of the transistor, conductive films in the X direction are provided in the lateral direction parallel to the gate line throughout the pixels. Alternatively, by using a conductive film on the same plane as the source electrode and the drain electrode of the transistor, the conductive films in the Y direction are provided in the vertical direction parallel to the source line throughout the pixels. In that case, a contact portion is formed in the pixel. Alternatively, the same conductive film as the conductive film functioning as the common electrode or a conductive film on the same plane as the conductive film functioning as the pixel electrode may also be used.

<Conductive Film (Electrode) of Touch Sensor and Conductive Film (Electrode) of Liquid Crystal Element>

A conductive film (electrode) having a slit on the upper side and can be used as the pixel electrode, and a conductive film (electrode) provided across a plurality of pixels on the lower side can be used as the common electrode.

Alternatively, a conductive film (electrode) that is provided across a plurality of pixels on the upper side and has a slit can be used as the common electrode, and a conductive film (electrode) that is provided on the lower side can be used as the pixel electrode.

The conductive film in the X direction of the touch sensor can also serve as the conductive film functioning as the pixel electrode or the conductive film functioning as the common electrode.

Alternatively, the conductive film in the Y direction of the touch sensor can also serve as the conductive film functioning as the pixel electrode or the conductive film functioning as the common electrode.

In addition, the conductive film in the X direction of the touch sensor may be one of a conductive film to which a pulse voltage is applied and a conductive film for sensing a current. In that case, the conductive film in the Y direction of the touch sensor may be the other of the conductive films.

The conductive film functioning as the common electrode may be provided across a plurality of pixels. For example, the conductive film functioning as the common electrode may be electrically connected to a common wiring formed using a conductive film on the same plane as the gate electrode of the transistor. In that case, one conductive film functioning as the common electrode may have an island-shape.

<Counter Substrate>

When a substrate (also referred to as a counter substrate) that faces the substrate provided with the transistor and the like is provided with the conductive film in the X direction or the conductive film in the Y direction of the touch sensor, a light-blocking film is preferably provided closer to the viewing side than the conductive film.

In the case where the counter substrate is provided with one electrode of a liquid crystal element using a TN mode, an MVA mode, or the like, the one electrode may have a slit in a region that overlaps with the conductive film of the touch sensor provided on the counter substrate.

In the case where a pair of electrodes of a liquid crystal element are provided over a substrate over which a transistor and the like are provided as in the case of a liquid crystal element using an FFS mode, an IPS mode, or the like, the counter substrate may be provided with a conductive film for controlling the orientation of liquid crystal. In a manner similar to the above, the conductive film for controlling the orientation of liquid crystal may also have a slit in a region that overlaps with the conductive film of the touch sensor.

<Driving Method>

As a method for driving the touch sensor, for example, a method in which sensing (scanning) of the corresponding row is performed in a period between horizontal periods (gate selection periods) for the driving of the pixel can be used. Alternatively, one frame period may be divided in two periods; writing to all pixels may be performed in the former period, and sensing may be performed in the latter period.

<Method for Manufacturing Transistor, Capacitor, and the Like>

Next, an example of a method for manufacturing the transistor 150 and a pair of electrodes included in the capacitor 160 and the liquid crystal element 308 (the oxide semiconductor film 111 and the conductive film 120) in the touch panel 310 illustrated in FIG. 8 is described with reference to FIGS. 25A to 25D, FIGS. 26A to 26C, FIGS. 27A to 27C, and FIG. 28.

First, the gate electrode 104 is formed over the substrate 102. After that, the insulating film 108 including the insulating films 106 and 107 is formed over the substrate 102 and the gate electrode 104 (see FIG. 25A).

Note that the substrate 102, the gate electrode 104, and the insulating films 106 and 107 can be selected from the materials that are described above. In this embodiment, a glass substrate is used as the substrate 102; a tungsten film is used as a conductive film for the gate electrode 104; a silicon nitride film releasing hydrogen is used as the insulating film 106; and a silicon oxynitride film releasing oxygen is used as the insulating film 107.

To form the gate electrode 104, a conductive film is formed over the substrate 102, is patterned so that a desired region thereof remains, and unnecessary regions are etched.

Figure 25A:
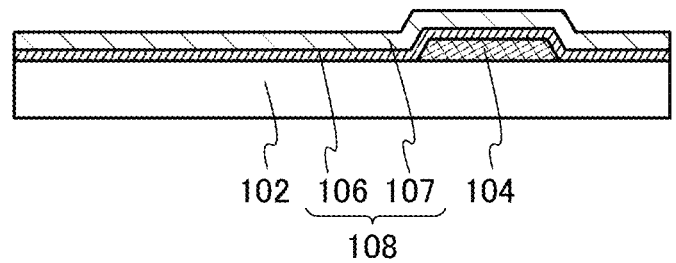
FIGS. 25A to 25D are cross-sectional views illustrating a method for manufacturing a transistor and the like of one embodiment.
Figure 25B:
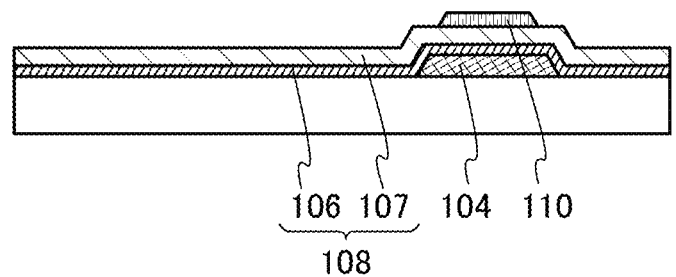

Next, the oxide semiconductor film 110 is formed in a region overlapping with the gate electrode 104 over the insulating film 108 (see FIG. 25B).

The oxide semiconductor film 110 can be formed using any of the materials described above. In this embodiment, as the oxide semiconductor film 110, an In—Ga—Zn oxide film, which is formed using a metal oxide target with In:Ga:Zn=1:1:1.2 [atomic ratio], is used.

The oxide semiconductor film 110 can be formed in such a manner that an oxide semiconductor film is formed over the insulating film 108, the oxide semiconductor film is patterned so that a desired region thereof remains, and then unnecessary regions are etched.

After formation of the oxide semiconductor film 110, heat treatment is preferably performed. The heat treatment is preferably performed at a temperature of higher than or equal to 250° C. and lower than or equal to 650° C., preferably higher than or equal to 300° C. and lower than or equal to 500° C., more preferably higher than or equal to 350° C. and lower than or equal to 450° C., in an inert gas atmosphere, an atmosphere containing an oxidizing gas at 10 ppm or more, or a reduced pressure atmosphere. Alternatively, the heat treatment may be performed first in an inert gas atmosphere, and then another heat treatment is performed in an atmosphere containing an oxidizing gas at 10 ppm or more in order to compensate oxygen released from the oxide semiconductor film 110. By this heat treatment, impurities such as hydrogen and water can be removed from at least one of the insulating film 106, the insulating film 107, and the oxide semiconductor film 110. Note that the above-described heat treatment may be performed before the oxide semiconductor film 110 is processed into an island shape.

Note that stable electrical characteristics can be effectively imparted to the transistor 150 in which the oxide semiconductor film 110 serves as a channel region by reducing the concentration of impurities in the oxide semiconductor film 110 to make the oxide semiconductor film 110 intrinsic or substantially intrinsic.

Figure 25C:
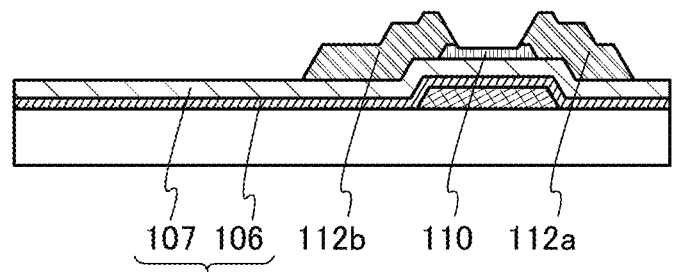
Figure 25D:
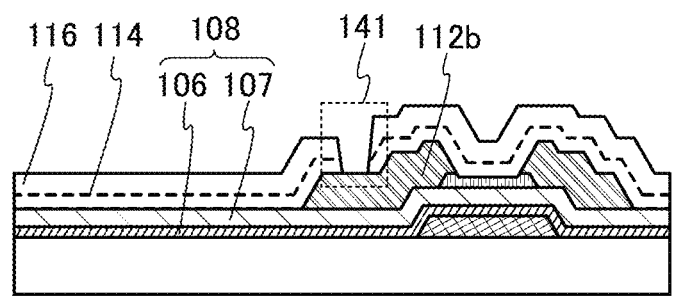

Next, a conductive film is formed over the insulating film 108 and the oxide semiconductor film 110 and is patterned so that a desired region thereof remains and unnecessary regions are etched, whereby the source electrode 112a and the drain electrode 112b are formed over the insulating film 108 and the oxide semiconductor film 110 (see FIG. 25C).

The source electrode 112a and the drain electrode 112b can be formed using a material selected from the above-described materials. Note that in this embodiment, a three-layered structure including a tungsten film, an aluminum film, and a titanium film can be used for the source electrode 112a and the drain electrode 112b.

After the source electrode 112a and the drain electrode 112b are formed, a surface of the oxide semiconductor film 110 may be cleaned. The cleaning may be performed, for example, using a chemical solution such as phosphoric acid. The cleaning using a chemical solution such as a phosphoric acid can remove impurities (e.g., elements contained in the source electrode 112a and the drain electrode 112b) attached to the surface of the oxide semiconductor film 110. Note that the cleaning is not necessarily performed, and thus the cleaning may be unnecessary.

In addition, in the step of forming the source electrode 112a and the drain electrode 112b and/or the cleaning step, the thickness of a region of the oxide semiconductor film 110 that is not covered by the source electrode 112a and the drain electrode 112b might be reduced.

Next, the insulating films 114 and 116 are formed over the insulating film 108, the oxide semiconductor film 110, the source electrode 112a, and the drain electrode 112b. Then, the insulating films 114 and 116 are patterned so that a desired region thereof remains and unnecessary regions are etched, whereby an opening 141 is formed (see FIG. 25D).

Note that after the insulating film 114 is formed, the insulating film 116 is preferably formed in succession without exposure to the air. After the insulating film 114 is formed, the insulating film 116 is formed in succession by adjusting at least one of the flow rate of a source gas, pressure, a high-frequency power, and a substrate temperature without exposure to the air, whereby the concentration of impurities attributed to the atmospheric component at the interface between the insulating film 114 and the insulating film 116 can be reduced, and oxygen in the insulating films 114 and 116 can be moved to the oxide semiconductor film 110; accordingly, the amount of oxygen vacancy in the oxide semiconductor film 110 can be reduced.

Note that the insulating film 114 functions as a protective film for the oxide semiconductor film 110 in the step of forming the insulating film 116. Consequently, the insulating film 116 can be formed using the high-frequency power having a high power density while damage to the oxide semiconductor film 110 is reduced.

The insulating films 114 and 116 can be formed using any of the materials described above. In this embodiment, a silicon oxynitride film capable of releasing oxygen is used as the insulating films 114 and 116.

Heat treatment (hereinafter referred to as first heat treatment) is preferably performed after the insulating films 114 and 116 are formed. The first heat treatment can reduce nitrogen oxide included in the insulating films 114 and 116. By the first heat treatment, part of oxygen included in the insulating films 114 and 116 can be moved to the oxide semiconductor film 110, so that the amount of oxygen vacancy included in the oxide semiconductor film 110 can be reduced.

The temperature of the first heat treatment is typically lower than 400° C., preferably lower than 375° C., further preferably higher than or equal to 150° C. and lower than or equal to 350° C. The first heat treatment may be performed under an atmosphere of nitrogen, oxygen, ultra-dry air (air with a water content of 20 ppm or less, preferably 1 ppm or less, more preferably 10 ppb or less), or a rare gas (argon, helium, or the like). The atmosphere of nitrogen, oxygen, ultra-dry air, or a rare gas preferably does not contain hydrogen, water, and the like. An electric furnace, a rapid thermal annealing (RTA) apparatus, or the like can be used for the heat treatment.

The opening 141 is formed to expose part of the drain electrode 112b. The opening 141 can be formed by a dry etching method, for example. Alternatively, a wet etching method or a combination of dry etching and wet etching can be employed for formation of the opening 141. Note that the etching step of forming the opening 141 can reduce the thickness of the drain electrode 112b in some cases.

Figure 26A:
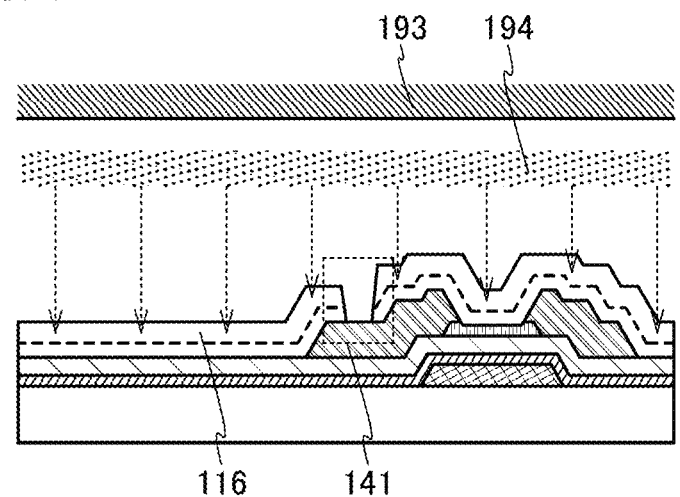
FIGS. 26A to 26C are cross-sectional views illustrating a method for manufacturing a transistor and the like of one embodiment.
Figure 26B:
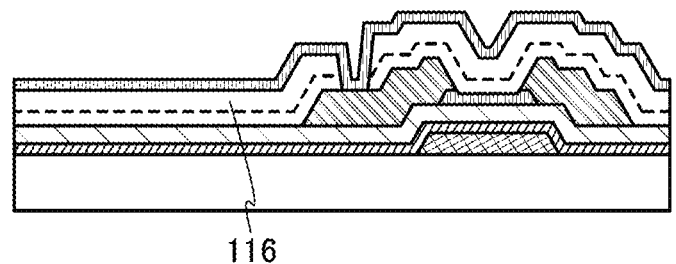

Next, an oxide semiconductor film to be the oxide semiconductor films 111 and 111a is formed over the insulating film 116 to cover the opening 141 (see FIGS. 26A and 26B).

Note that FIG. 26A is a schematic cross-sectional view of the inside of a deposition apparatus when the oxide semiconductor film is formed over the insulating film 116. In FIG. 26A, a sputtering apparatus is used as the deposition apparatus, and a target 193 placed inside the sputtering apparatus and plasma 194 formed under the target 193 are schematically shown.

When the oxide semiconductor film is formed, plasma discharge is performed in an atmosphere containing an oxygen gas. At this time, oxygen is added to the insulating film 116 over which the oxide semiconductor film is to be formed. When the oxide semiconductor film is formed, an inert gas (e.g., a helium gas, an argon gas, or a xenon gas) and the oxygen gas may be mixed. For example, it is preferable to use the argon gas and the oxygen gas with the flow rate of the oxygen gas higher than the flow rate of the argon gas. When the flow rate of the oxygen gas is set higher, oxygen can be favorably added to the insulating film 116. As an example of the formation conditions of the oxide semiconductor film, the proportion of the oxygen gas in a whole deposition gas is higher than or equal to 50% and lower than or equal to 100%, preferably higher than or equal to 80% and lower than or equal to 100%.

In FIG. 26A, oxygen or excess oxygen added to the insulating film 116 is schematically shown by arrows of broken lines.

The oxide semiconductor film is formed at a substrate temperature higher than or equal to room temperature and lower than 340° C., preferably higher than or equal to room temperature and lower than or equal to 300° C., further preferably higher than or equal to 100° C. and lower than or equal to 250° C., still further preferably higher than or equal to 100° C. and lower than or equal to 200° C. The oxide semiconductor film is formed while being heated, so that the crystallinity of the oxide semiconductor film can be increased. On the other hand, in the case where a large-sized glass substrate (e.g., the 6th generation to the 10th generation) is used as the substrate 102 and the oxide semiconductor film is formed at a substrate temperature higher than or equal to 150° C. and lower than 340° C., the substrate 102 might be changed in shape (distorted or warped). In the case where a large-sized glass substrate is used, the change in the shape of the glass substrate can be suppressed by forming the oxide semiconductor film at a substrate temperature higher than or equal to 100° C. and lower than 150° C.

The oxide semiconductor film can be formed using any of the materials described above. In this embodiment, the oxide semiconductor film is formed by a sputtering method using an In—Ga—Zn metal oxide target (with In:Ga:Zn=1:3:6 [atomic ratio]).

Figure 26C:
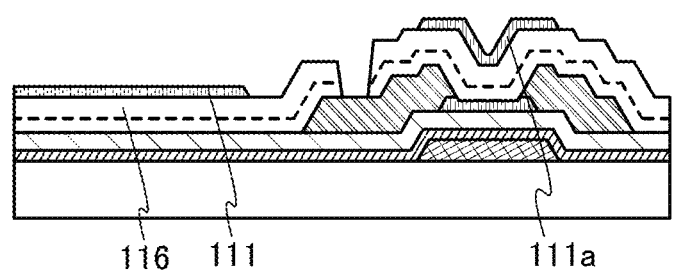

Next, the oxide semiconductor film is processed into a desired shape to form the island-shaped oxide semiconductor films 111 and 111a (see FIG. 26C).

The oxide semiconductor films 111 and 111a can be formed in such a manner that an oxide semiconductor film is formed over the insulating film 116, the oxide semiconductor film is patterned so that a desired region thereof remains, and then unnecessary regions are etched.

Figure 27A:
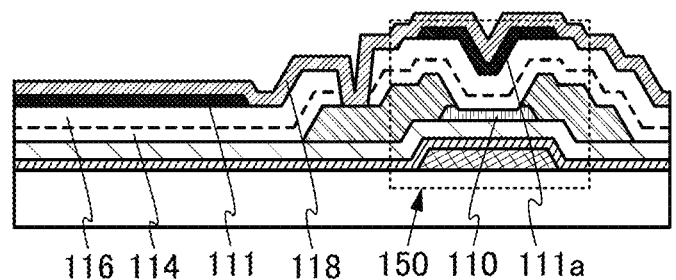
FIGS. 27A to 27C are cross-sectional views illustrating a method for manufacturing a transistor and the like of one embodiment.

Next, the insulating film 118 is formed over the insulating film 116 and the oxide semiconductor films 111 and 111a (see FIG. 27A).

The insulating film 118 includes one or both of hydrogen and nitrogen. As the insulating film 118, a silicon nitride film is preferably used, for example. The insulating film 118 can be formed by a sputtering method or a PECVD method, for example. In the case where the insulating film 118 is formed by a PECVD method, for example, the substrate temperature is lower than 400° C., preferably lower than 375° C., further preferably higher than or equal to 180° C. and lower than or equal to 350° C. The substrate temperature at which the insulating film 118 is formed is preferably within the above range because a dense film can be formed. Furthermore, when the substrate temperature at which the insulating film 118 is formed is within the above range, oxygen or excess oxygen in the insulating films 114 and 116 can be moved to the oxide semiconductor film 110.

After the insulating film 118 is formed, heat treatment similar to the first heat treatment (hereinafter referred to as second heat treatment) may be performed. Through such heat treatment at lower than 400° C., preferably lower than 375° C., further preferably higher than or equal to 180° C. and lower than or equal to 350° C. after the addition of oxygen to the insulating film 116 when the oxide semiconductor film to be the oxide semiconductor films 111 and 111a is formed, oxygen or excess oxygen in the insulating film 116 can be moved into the oxide semiconductor film 110 and compensate oxygen vacancies in the oxide semiconductor film 110.

Figure 28:
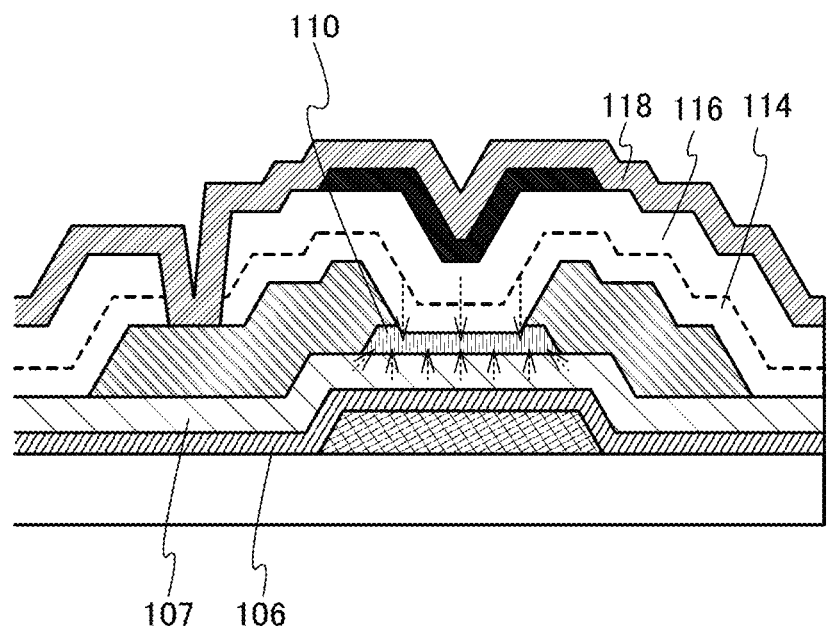
FIG. 28 is a cross-sectional view illustrating a method for manufacturing a transistor and the like of one embodiment.

Oxygen moved to the oxide semiconductor film 110 is described with reference to FIG. 28. FIG. 28 are model diagrams illustrating oxygen moved to the oxide semiconductor film 110 due to the substrate temperature at the time of forming the insulating film 118 (typically, lower than 375° C.) or the second heat treatment after the formation of the insulating film 118 (typically, lower than 375° C.). In FIG. 28, oxygen (oxygen radicals, oxygen atoms, or oxygen molecules) moved to the oxide semiconductor film 110 is shown by arrows of broken lines. Note that FIG. 28 is a cross-sectional view of the transistor 150 after the insulating film 118 is formed and its periphery.

In the oxide semiconductor film 110 in FIG. 28, oxygen vacancies are compensated with oxygen moved from films in contact with the oxide semiconductor film 110 (here, the insulating film 107 and the insulating film 114). Specifically, in the touch panel of one embodiment of the present invention, the insulating film 107 includes an excess oxygen region because an oxygen gas is used at the time of forming the oxide semiconductor film to be the oxide semiconductor film 110 by sputtering and oxygen is added to the insulating film 107. Furthermore, the insulating film 116 includes an excess oxygen region because an oxygen gas is used at the time of forming the oxide semiconductor film to be the oxide semiconductor film 111 by sputtering and oxygen is added to the insulating film 116. In the oxide semiconductor film 110 between the insulating films including the excess oxygen regions, oxygen vacancies can be favorably compensated.

Furthermore, the insulating film 106 is provided under the insulating film 107, and the insulating film 118 is provided over the insulating films 114 and 116. When the insulating films 106 and 118 are formed using a material having low oxygen permeability, e.g., silicon nitride, oxygen contained in the insulating films 107, 114, and 116 can be confined to the oxide semiconductor film 110 side; thus, oxygen can be favorably moved to the oxide semiconductor film 110. Note that the insulating film 118 also has an advantageous effect of preventing an external impurity such as water, alkali metal, or alkaline earth metal, from diffusing into the oxide semiconductor film 110 included in the transistor 150.

The insulating film 118 contains one or both of hydrogen and nitrogen. Thus, one or both of hydrogen and nitrogen is added to the oxide semiconductor films 111 and 111a in contact with the formed insulating film 118, so that the oxide semiconductor films 111 and 111a have high carrier density and can function as an oxide conductive film.

Note that since the resistivity of the oxide semiconductor films 111 and 111a is decreased, the oxide semiconductor films 111 and 111a in FIG. 27A are indicated by a different hatching pattern from that in FIG. 26C. At this stage, the transistor 150 is completed.

The resistivity of the oxide semiconductor films 111 and 111a is lower than at least the resistivity of the oxide semiconductor film 110 and is preferably higher than or equal to $1\times10^{-3}$ Ωcm and lower than $1\times10^{4}$ Ωcm, further preferably higher than or equal to $1\times10^{-3}$ Ωcm and lower than $1\times10^{-1}$ Ωcm.

Figure 27B:
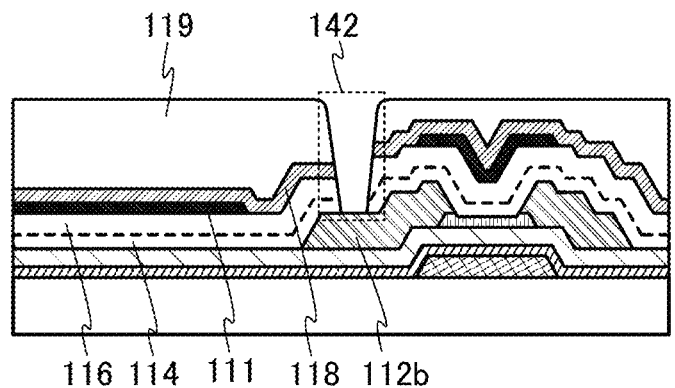

Then, an opening 142 is formed as follows: the insulating film 119 is formed over the insulating film 118, the insulating films 118 and 119 are patterned so that a desired region thereof remains, and unnecessary regions are etched (see FIG. 27B).

The insulating film 119 can be formed using any of the materials described above. Note that in this embodiment, an acrylic resin is used for the insulating film 119.

The opening 142 is formed to expose part of the drain electrode 112b. The opening 142 can be formed by a dry etching method, for example. Alternatively, a wet etching method or a combination of dry etching and wet etching can be employed for formation of the opening 142. Note that the etching step of forming the opening 142 can reduce the thickness of the drain electrode 112b in some cases.

Note that the opening may be formed in the insulating films 114, 116, 118, and 119 at one time in the step of forming the opening 142 without performing the step of forming the opening 141. In this case, the number of steps of manufacturing the touch panel of one embodiment of the present invention is reduced, resulting in a reduction of the manufacturing cost.

Figure 27C:
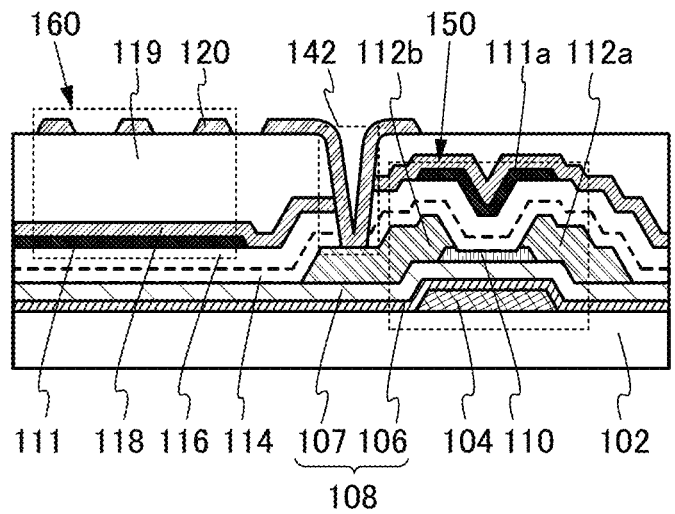

Then, a conductive film is formed over the insulating film 119 to cover the opening 142 and is patterned so that a desired region thereof remains, and unnecessary regions are etched; thus, the conductive film 120 is formed (see FIG. 27C).

The conductive film 120 can be formed using any of the materials described above. Note that in this embodiment, indium tin oxide is used for the conductive film 120.

The capacitor 160 is formed concurrently with the conductive film 120. The capacitor 160 includes a dielectric layer between a pair of electrodes. One of the pair of electrodes corresponds to the oxide semiconductor film 111, and the other electrode corresponds to the conductive film 120. In addition, the insulating films 118 and 119 serve as a dielectric layer of the capacitor 160.

Through the above steps, the transistor 150 and the pair of electrodes included in the capacitor 160 and the liquid crystal element 308 in the touch panel 310 illustrated in FIG. 8 can be formed.

Figure 29A:
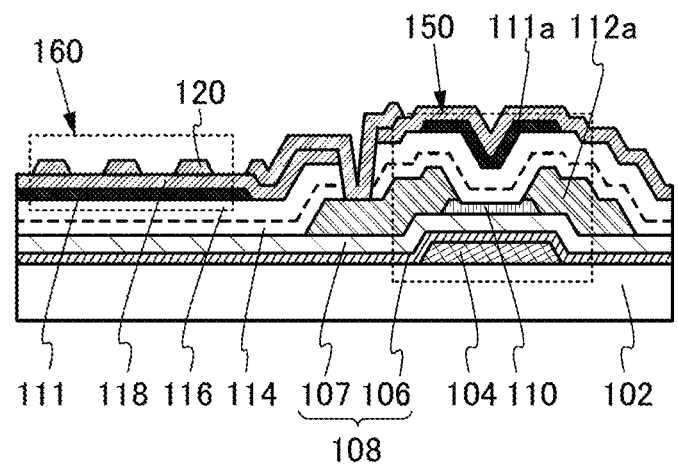
FIGS. 29A and 29B are each a cross-sectional view illustrating a structure of a transistor and the like of one embodiment.
Figure 29B:
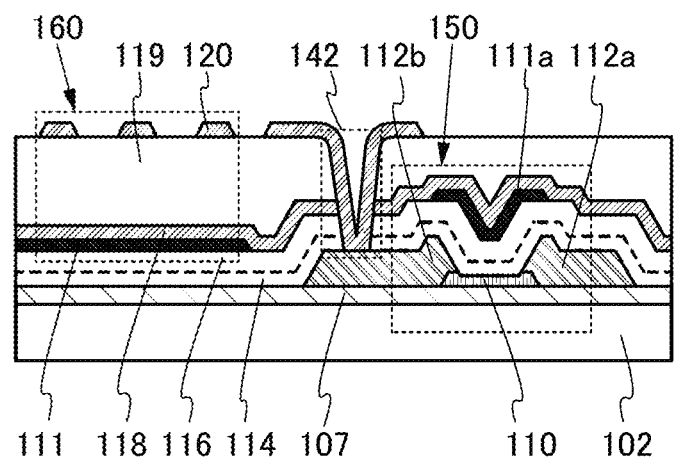

Note that although the structure with the insulating film 119 is shown in FIG. 27C, a structure without the insulating film 119 may be employed (see FIG. 29A). In the structure in FIG. 29A, the insulating film 118 serves as a dielectric film of the capacitor 160. Moreover, in the transistor 150, a structure in which the gate electrode 104 is not provided and the oxide semiconductor film 111a serves as a first gate electrode may be employed (see FIG. 29B). FIG. 29B differs from FIG. 27C in that the gate electrode 104 and the insulating film 106 are not provided. The transistor 150 illustrated in FIG. 29B is a so-called top-gate transistor.

The structures, the methods, and the like described in this embodiment can be combined as appropriate with any of the structures, the methods, and the like described in the other embodiments.

Structure Example 2

In this structure example, an organic EL element is used as the display element included in the touch panel.

Cross-Sectional Structure Example 1

Examples of the cross-sectional structure of a touch panel of one embodiment of the present invention are described below with reference to the drawings. Note that the description of the portions already described is omitted and different portions are described.

Figure 13:
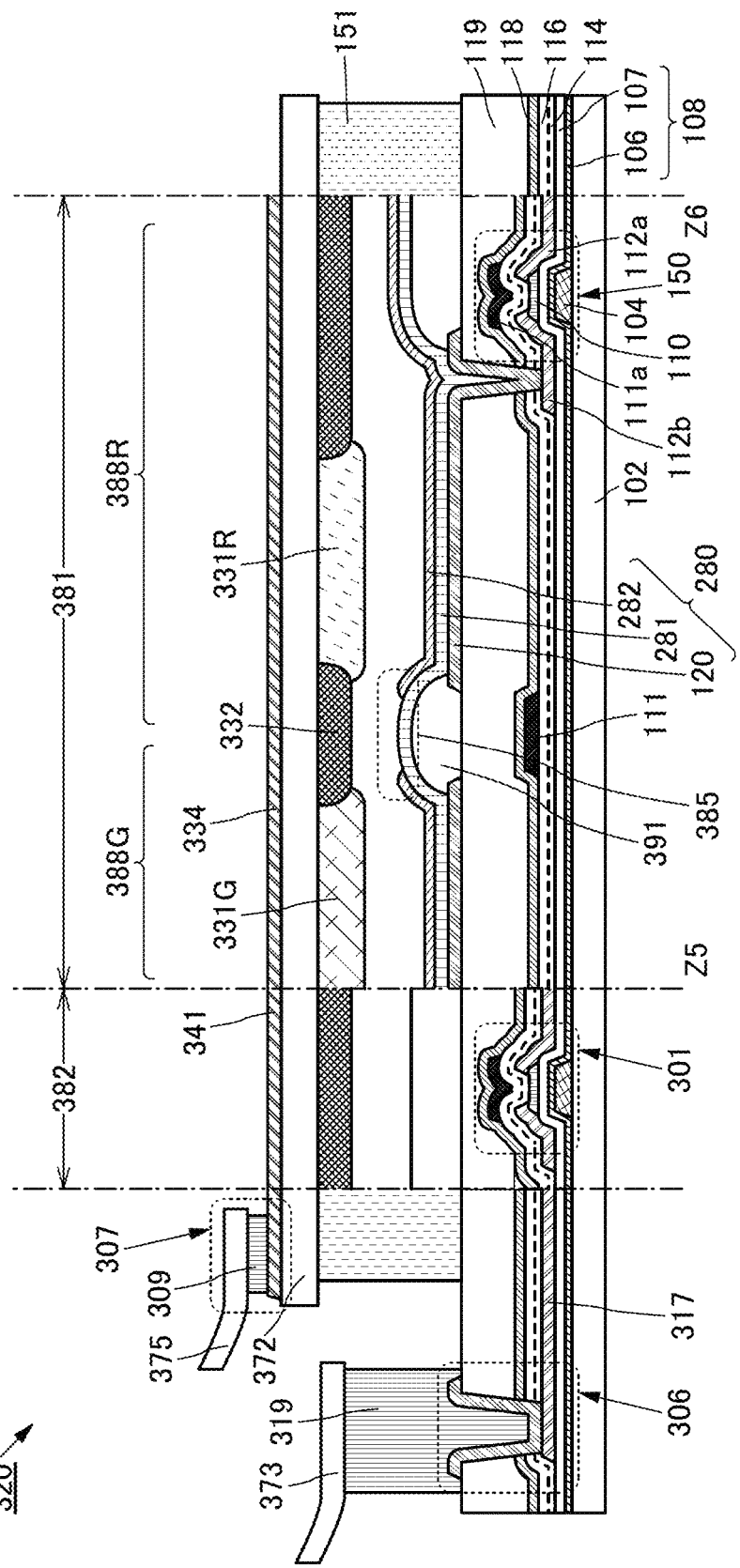
FIG. 13 is a cross-sectional view illustrating an example of a touch panel of one embodiment.

A touch panel 320 illustrated in FIG. 13 includes a light-emitting element 280 in the display portion 381. The light-emitting element 280 includes the conductive film 120, an EL layer 281, and a conductive film 282. The conductive film 120 serving as a reflective film is electrically connected to the drain electrode 112b of the transistor 150 via an opening provided in the insulating films 114, 116, 118, and 119. The conductive film 282 is also referred to as a lower electrode. A material transmitting visible light is used for the conductive film 282. Moreover, the conductive film 282 may serve as a semi-reflective film. The conductive film 282 can also be referred to as an upper electrode. By applying a voltage between the conductive films 120 and 282, light emitted by a light-emitting layer included in the EL layer 281 can be extracted through a coloring film (e.g., the coloring film 331R) provided in the substrate 372. The touch panel 320 illustrated in FIG. 13 includes a so-called top emission display device. Note that the specific structure of the light-emitting element 280 is described later in Embodiment 4.

An insulating film 391 serving as a partition is provided over the insulating film 119. The insulating film 391 is provided to overlap with end portions of the conductive films 120 of two adjacent pixels. The EL layer 281 is provided over the conductive film 120 and the insulating film 391. The conductive film 282 is provided over the EL layer 281 to overlap with at least the conductive film 120. For example, in the touch panel 320 illustrated in FIG. 13, the conductive film 282 includes an opening 385 in a position overlapping with a space between two conductive films 120 of two pixels that are adjacent in one direction. Alternatively, the conductive film 282 may include one opening 385 for each block that includes a plurality of pixels that are adjacent in one direction (e.g., 30 or 60 pixels) in a position overlapping with a space between two conductive films 120 of two pixels that are adjacent to each other in the one direction.

The oxide semiconductor film 111 is provided over the insulating film 116 in a position overlapping with the opening 385. The oxide semiconductor film 111 can be formed at the same time using the same material as the oxide semiconductor film 111a serving as the second gate electrode of the transistor 150.

The touch sensor included in the touch panel 320 is formed using the conductive film 334 that is provided over the substrate 372 and the oxide semiconductor film 111 that is provided over the substrate 102. With the use of capacitance formed between the conductive film 334 and the oxide semiconductor film 111, the approach or contact of an object can be sensed.

Figure 14:
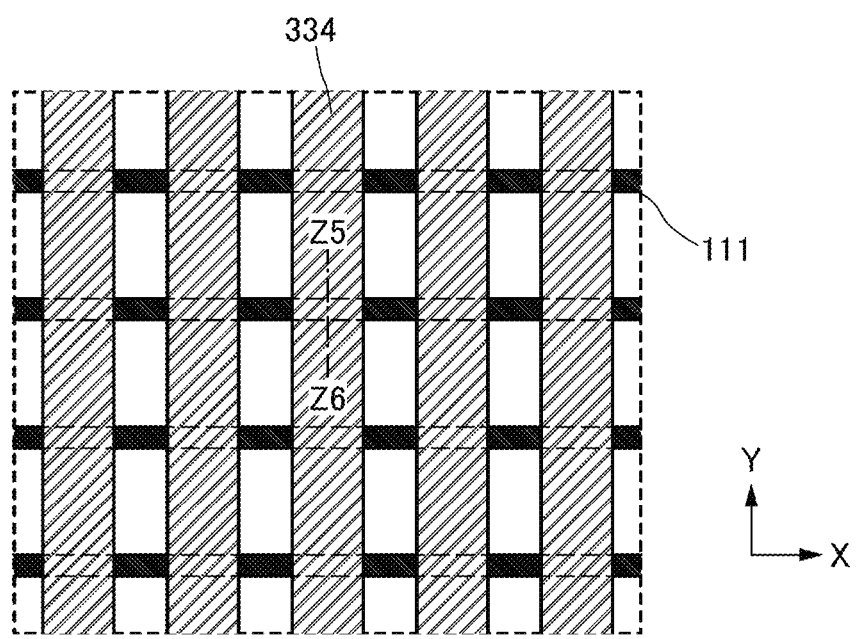
FIG. 14 is a top view illustrating a structure of electrodes of a touch sensor of one embodiment.

Here, the arrangement of the electrodes included in the touch sensor is described. FIG. 14 is a schematic top view of the pair of electrodes of the touch sensor included in the touch panel 320 illustrated in FIG. 13. The dashed-dotted line Z5-Z6 in FIG. 14 corresponds to the display portion 381 in FIG. 13.

The conductive film 334 that is one electrode of the touch sensor extends in the Y direction. The oxide semiconductor film 111 that is the other electrode of the touch sensor extends in the X direction and intersects with the conductive film 334. Note that the conductive film 334 may extend in the X direction and the oxide semiconductor film 111 may extend in the Y direction.

In the touch panel 320, the substrate 102 and the substrate 372 are attached to each other with the sealant 151. A region surrounded by the substrate 102, the substrate 372, and the sealant 151 is a hollow; however, the region may be filled with a sealant. An insulating film is not provided over the coloring films 331R and 331G and the light-blocking film 332; however, the above-described insulating film 355 serving as an overcoat may be provided.

Figure 15:
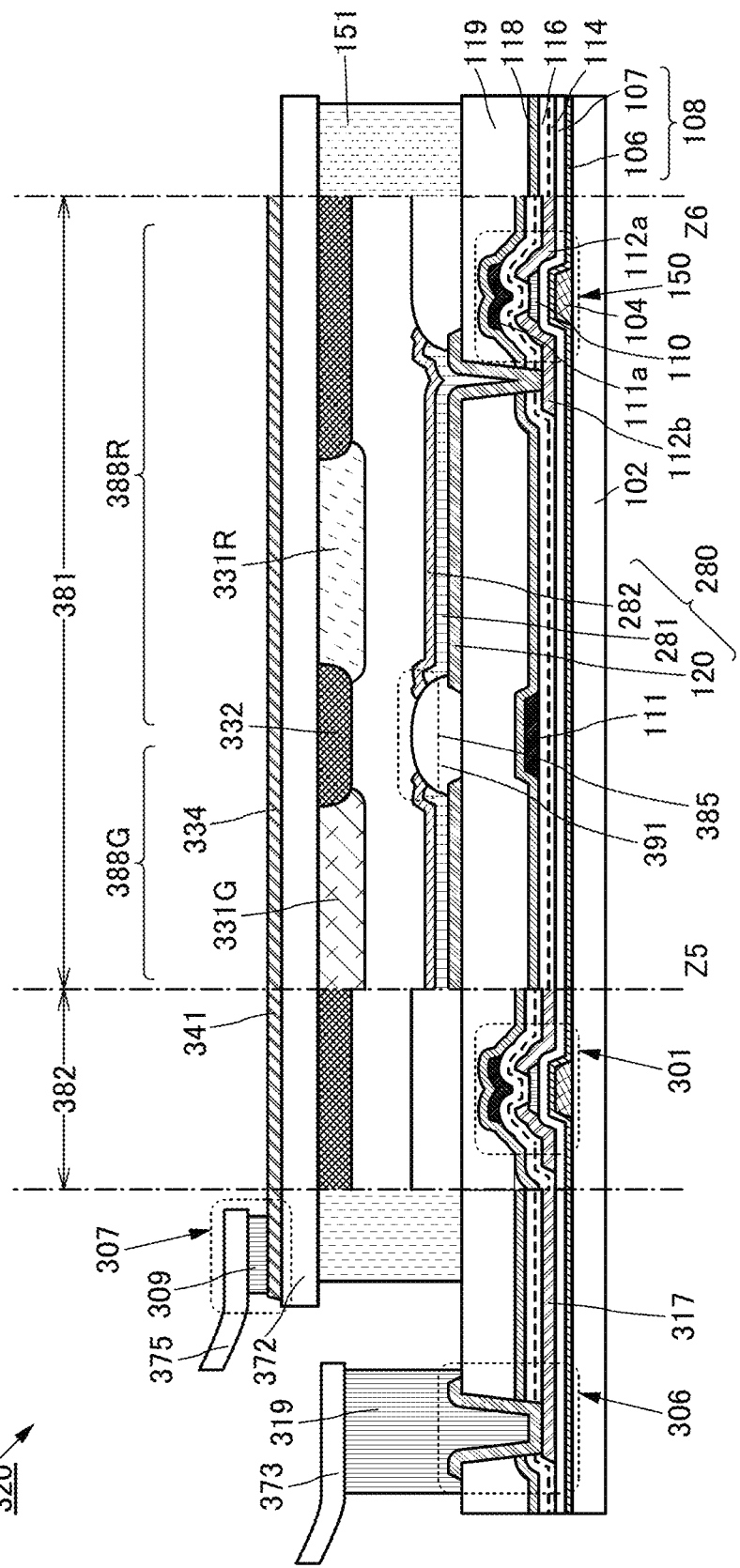
FIG. 15 is a cross-sectional view illustrating an example of a touch panel of one embodiment.

The EL layer 281 is shared by a plurality of pixels in the light-emitting element 280 in FIG. 13; however, the EL layer 281 may be provided for each pixel (see FIG. 15). In this case, the EL layer 281 including a light-emitting layer emitting light whose color corresponds to emission color required by a pixel may be provided for each pixel. A structure without a coloring film (e.g., the coloring films 331R and 331G) may be employed.

[Cross-Sectional Structure Example 2]

Figure 16:
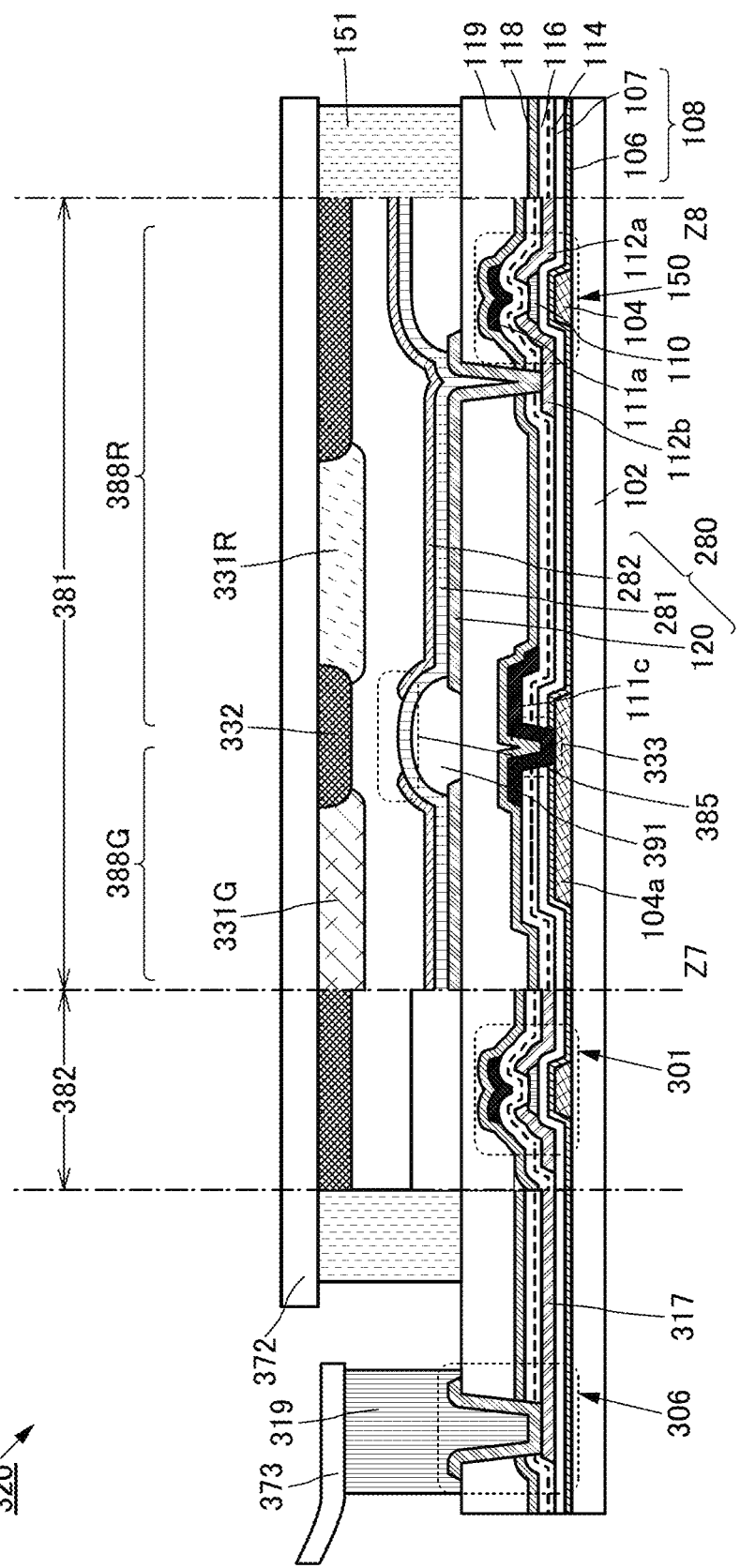
FIG. 16 is a cross-sectional view illustrating an example of a touch panel of one embodiment.

FIG. 16 illustrates a cross-sectional structure example of a touch panel that partly differs from the structure of FIG. 13. Note that descriptions of the portions already described are omitted and different portions are described.

FIG. 16 has a structure in which the conductive films 334 and 341 and the FPC 375 are not provided on the display surface side of the substrate 372. The oxide semiconductor film 111 formed at the same time using the same material as the second gate electrode of the transistor 150 serves as the pair of electrodes of the touch sensor. Specifically, the oxide semiconductor film 111b (not illustrated) that extends in one direction and the oxide semiconductor film 111c that is electrically connected to the conductive film 104a extending in the direction orthogonal to the oxide semiconductor film 111b serve as the pair of electrodes of the touch sensor. With such a structure, the processing steps can be simpler than those of the structure illustrated in FIG. 13. Note that the oxide semiconductor film 111c is electrically connected to the conductive film 104a via the opening 333 provided in the insulating films 108, 114, and 116. The conductive film 104a can be formed at the same time using the same material as the gate electrode 104.

Figure 17:
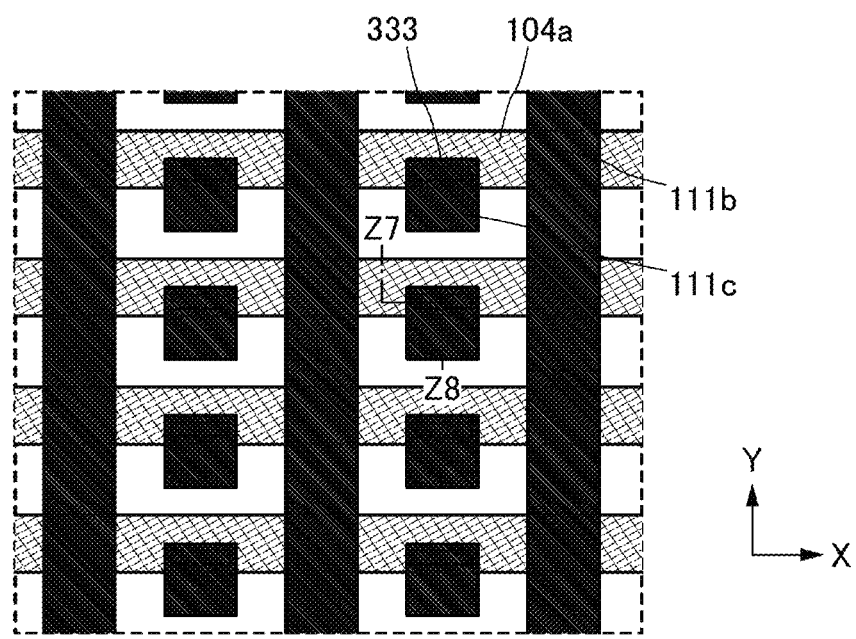
FIG. 17 is a top view illustrating a structure of electrodes of a touch sensor of one embodiment.

Here, the arrangement of the electrodes included in the touch sensor is described. FIG. 17 is a schematic top view of the pair of electrodes of the touch sensor included in the touch panel 320 illustrated in FIG. 16. The dashed-dotted line Z7-Z8 in FIG. 17 corresponds to the display portion 381 in FIG. 16.

The oxide semiconductor film 111b that is one electrode of the touch sensor extends in the Y direction. The oxide semiconductor film 111c that is the other electrode of the touch sensor is electrically connected to the conductive film 104a via the opening 333. The conductive film 104a extends in the X direction and intersects with the oxide semiconductor film 111b.

Figure 18:
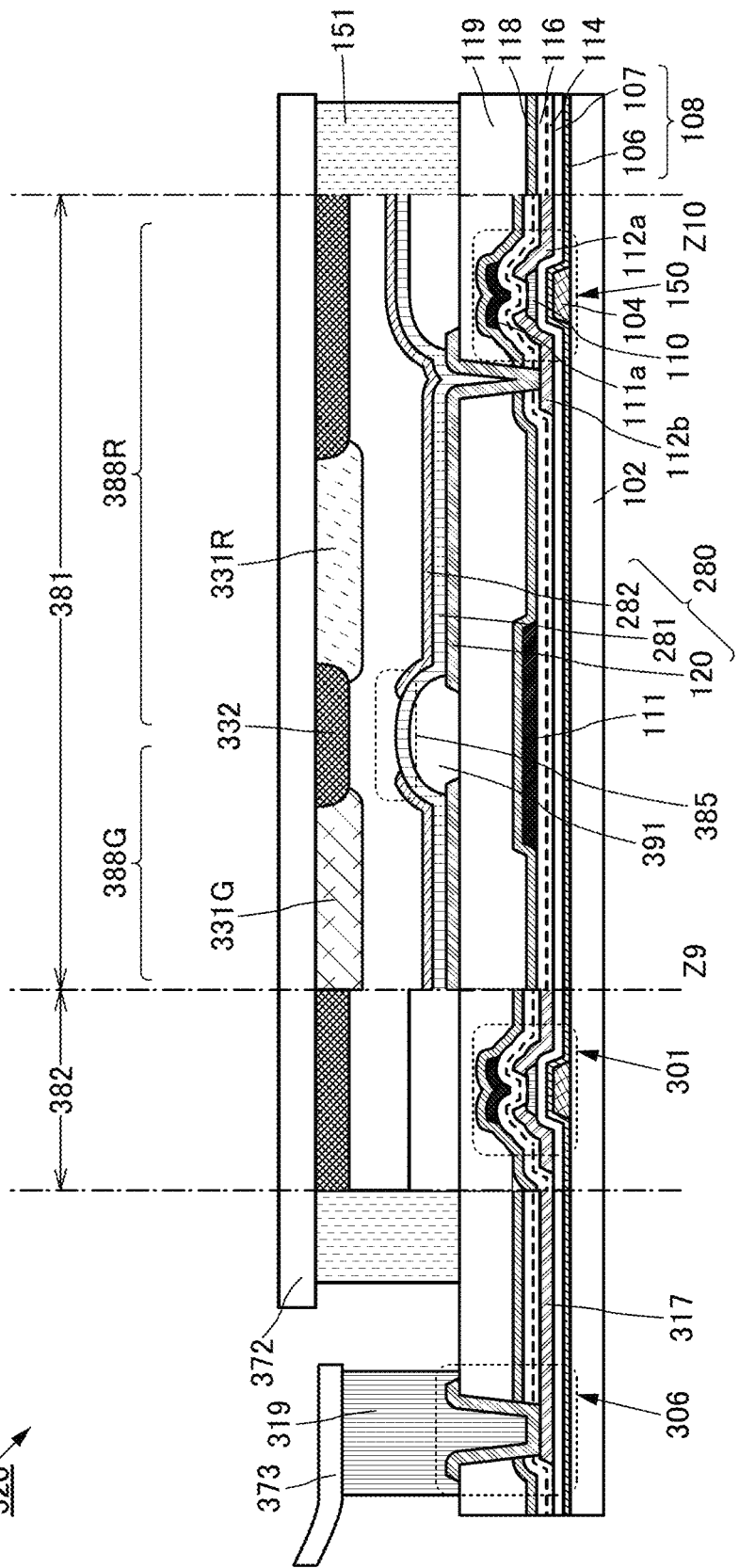
FIG. 18 is a cross-sectional view illustrating an example of a touch panel of one embodiment.
Figure 19:
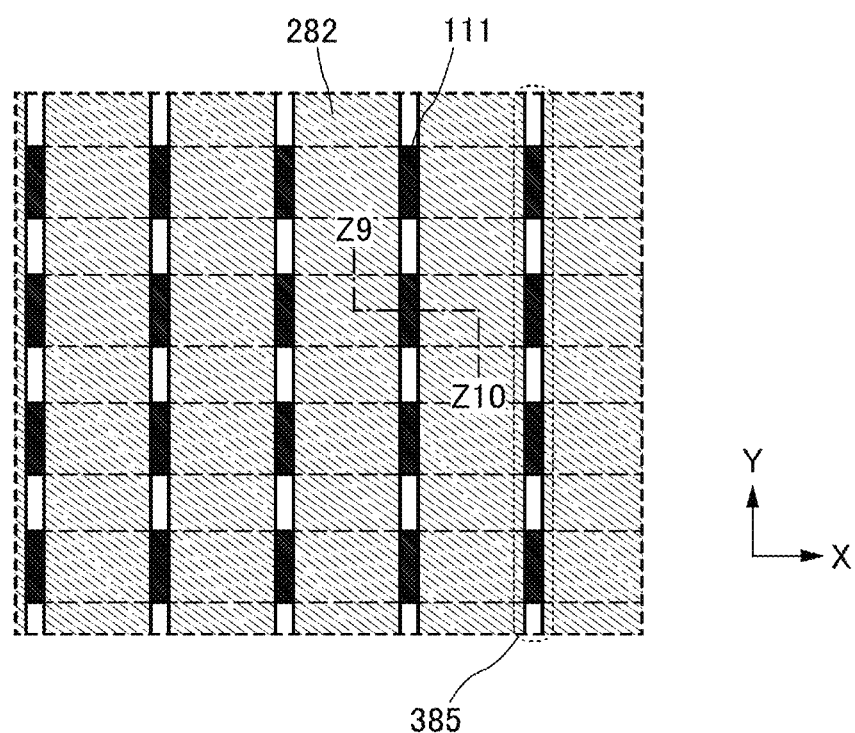
FIG. 19 is a top view illustrating a structure of electrodes of a touch sensor of one embodiment.

The conductive film 282 serving as one electrode of the light-emitting element 280 may serve as the other electrode of the touch sensor. In the touch panel 320 in FIG. 18, the oxide semiconductor film 111 that is the one electrode of the touch sensor extends in the X direction. The conductive film 282 extends in the Y direction and intersects with the oxide semiconductor film 111. FIG. 19 is a schematic top view of the pair of electrodes of the touch sensor included in the touch panel 320 illustrated in FIG. 18. The dashed-dotted line Z9-Z10 in FIG. 19 corresponds to the display portion 381 in FIG. 18. The opening 385 included in the conductive film 282 extends in the direction orthogonal to the direction in which the oxide semiconductor film 111 extends. Part of the opening 385 overlaps with the oxide semiconductor film 111.

[Cross-Sectional Structure Example 3]

Figure 20:
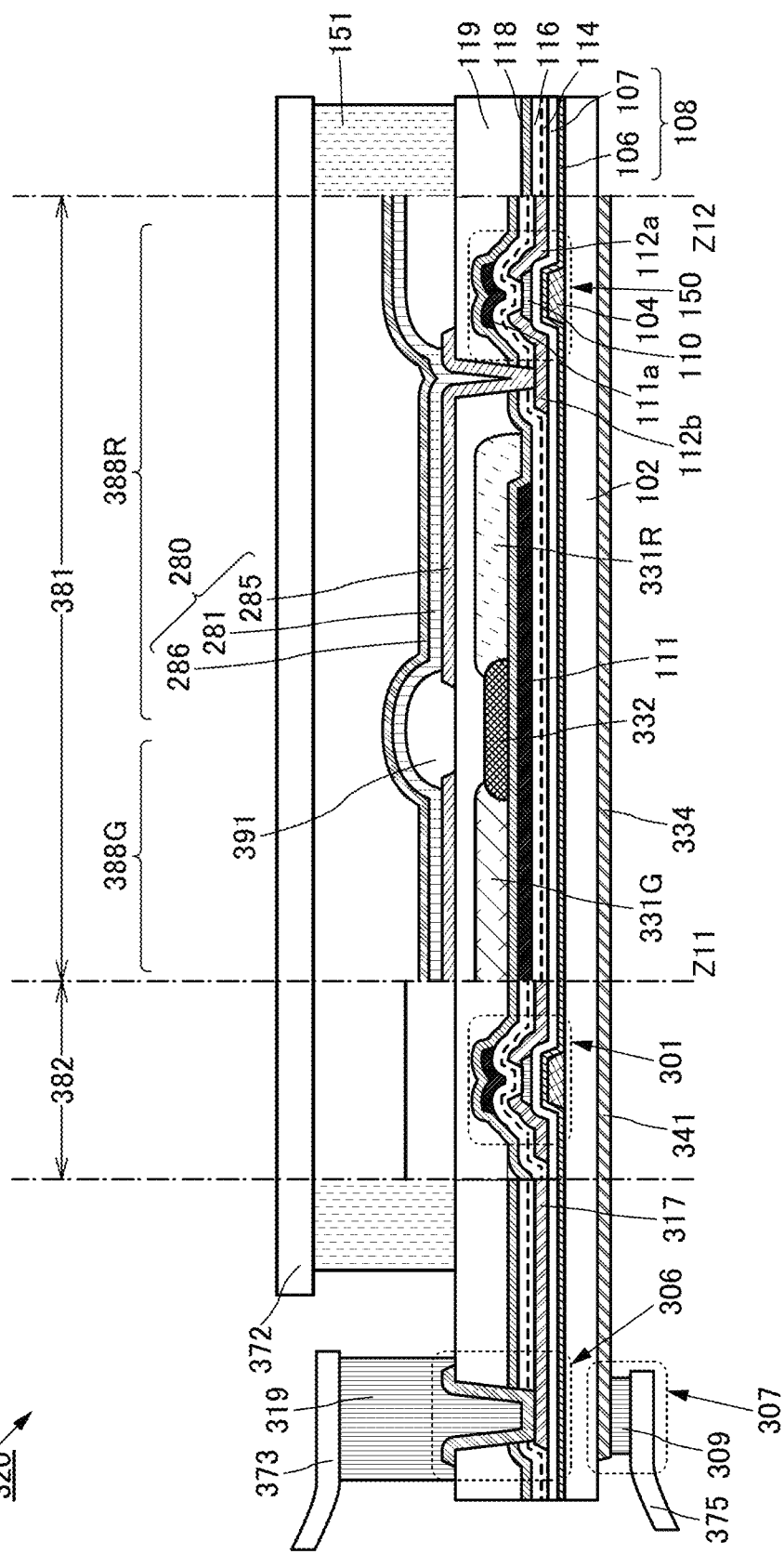
FIG. 20 is a cross-sectional view illustrating an example of a touch panel of one embodiment.

FIG. 20 illustrates a cross-sectional structure example of a touch panel that partly differs from the above-described structure example. Note that descriptions of the portions already described are omitted and different portions are described.

A touch panel 320 illustrated in FIG. 20 includes the light-emitting element 280 in the display portion 381. The light-emitting element 280 includes a conductive film 285, the EL layer 281, and a conductive film 286. The conductive film 285 is electrically connected to the drain electrode 112b of the transistor 150 via an opening provided in the insulating films 114, 116, 118, and 119. A material transmitting visible light is used for the conductive film 285. Moreover, the conductive film 285 may serve as a semi-reflective film. The conductive film 286 serves as a reflective film. By applying a voltage between the conductive films 285 and 286, light emitted by a light-emitting layer included in the EL layer 281 can be extracted through a coloring film (e.g., the coloring film 331R) provided in the substrate 102. The touch panel 320 illustrated in FIG. 20 includes a display device having a so-called bottom emission structure.

The light-blocking film 332 and the coloring films 331R and 331G are provided over the insulating film 118. The light-blocking film 332 is provided in a position overlapping with the insulating film 391. The coloring films 331R and 331G are provided in a position overlapping with the conductive film 285. The EL layer 281 and the conductive film 286 are provided in this order over the conductive film 285.

The conductive films 334 and 341 and the FPC 375 are provided on the display surface side (the side opposite to the substrate 372) of the substrate 102. A touch sensor included in the touch panel 320 is formed using the conductive film 334 and the oxide semiconductor film 111 that serve as a pair of electrodes. With the conductive film 334 provided on the display surface side of the substrate 102, another conductive film (e.g., the conductive film 285 and the conductive film 286) is not interposed between the pair of electrodes. The oxide semiconductor film 111 transmits visible light and thus can be provided in a region overlapping with the conductive film 285 through which light emitted from the light-emitting element 280 passes. Accordingly, the oxide semiconductor film 111 can be provided in a large area; thus, the capacitance of the touch sensor can be large.

Figure 21:
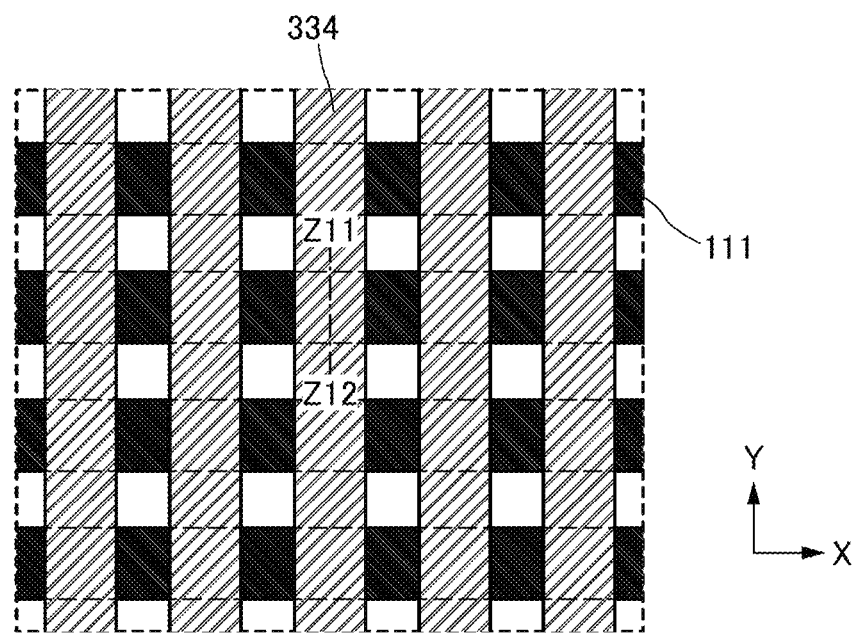
FIG. 21 is a top view illustrating a structure of electrodes of a touch sensor of one embodiment.

Here, the arrangement of the electrodes included in the touch sensor is described. FIG. 21 is a schematic top view of the pair of electrodes of the touch sensor included in the touch panel 320 illustrated in FIG. 20. The dashed-dotted line Z11-Z12 in FIG. 21 corresponds to the display portion 381 in FIG. 20.

The conductive film 334 that is one electrode of the touch sensor extends in the Y direction. The oxide semiconductor film 111 that is the other electrode of the touch sensor extends in the X direction and intersects with the conductive film 334. Note that the conductive film 334 may extend in the X direction and the oxide semiconductor film 111 may extend in the Y direction.

Figure 22:
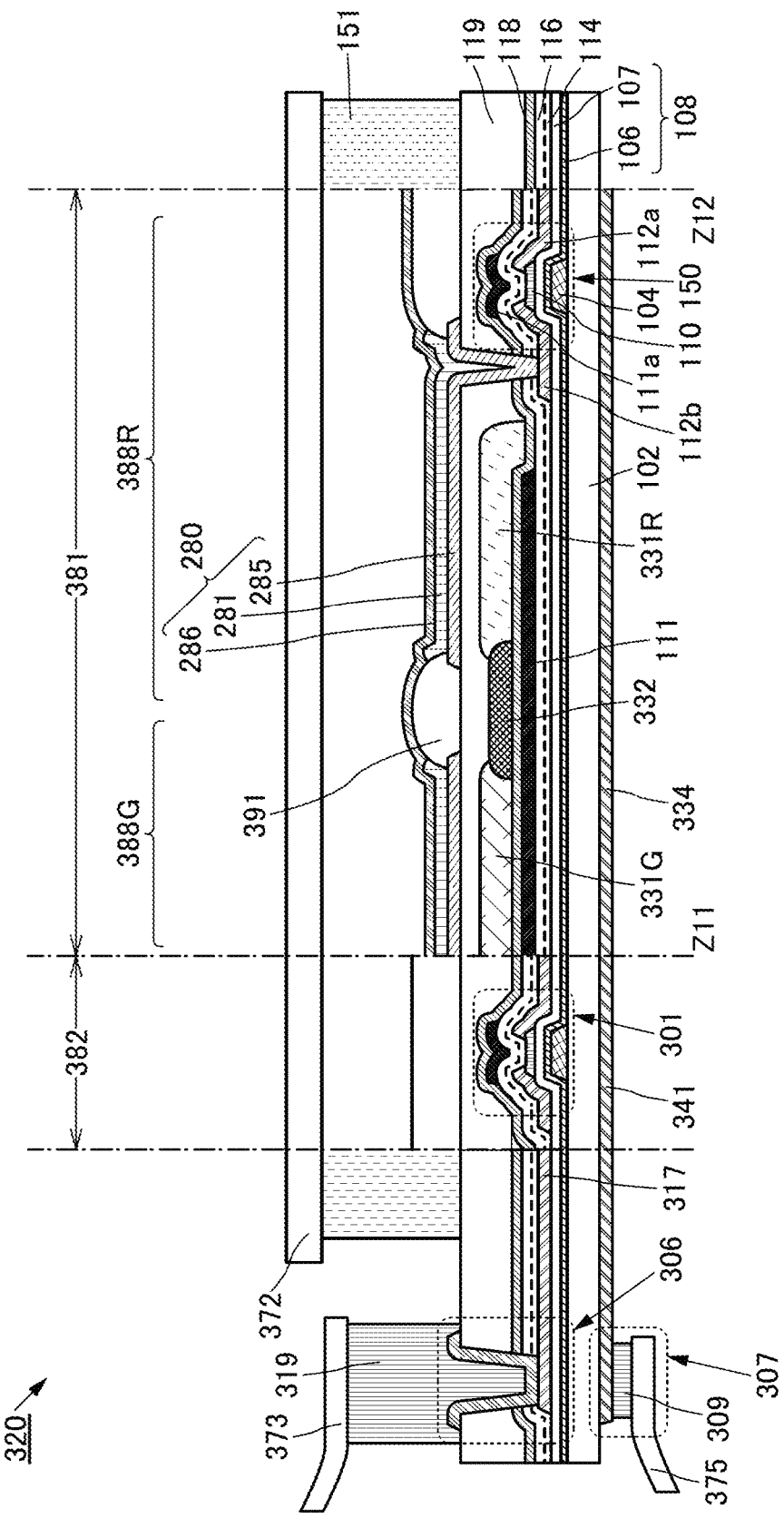
FIG. 22 is a cross-sectional view illustrating an example of a touch panel of one embodiment.

Although the EL layer 281 is shared by a plurality of pixels in the light-emitting element 280 in FIG. 20, the EL layer 281 may be provided for each pixel (see FIG. 22). In this case, the EL layer 281 including a light-emitting layer emitting light whose color corresponds to color required to a pixel may be provided for each pixel. A structure without a coloring film (e.g., the coloring films 331R and 331G) may be employed.

[Cross-Sectional Structure Example 4]

Figure 23:
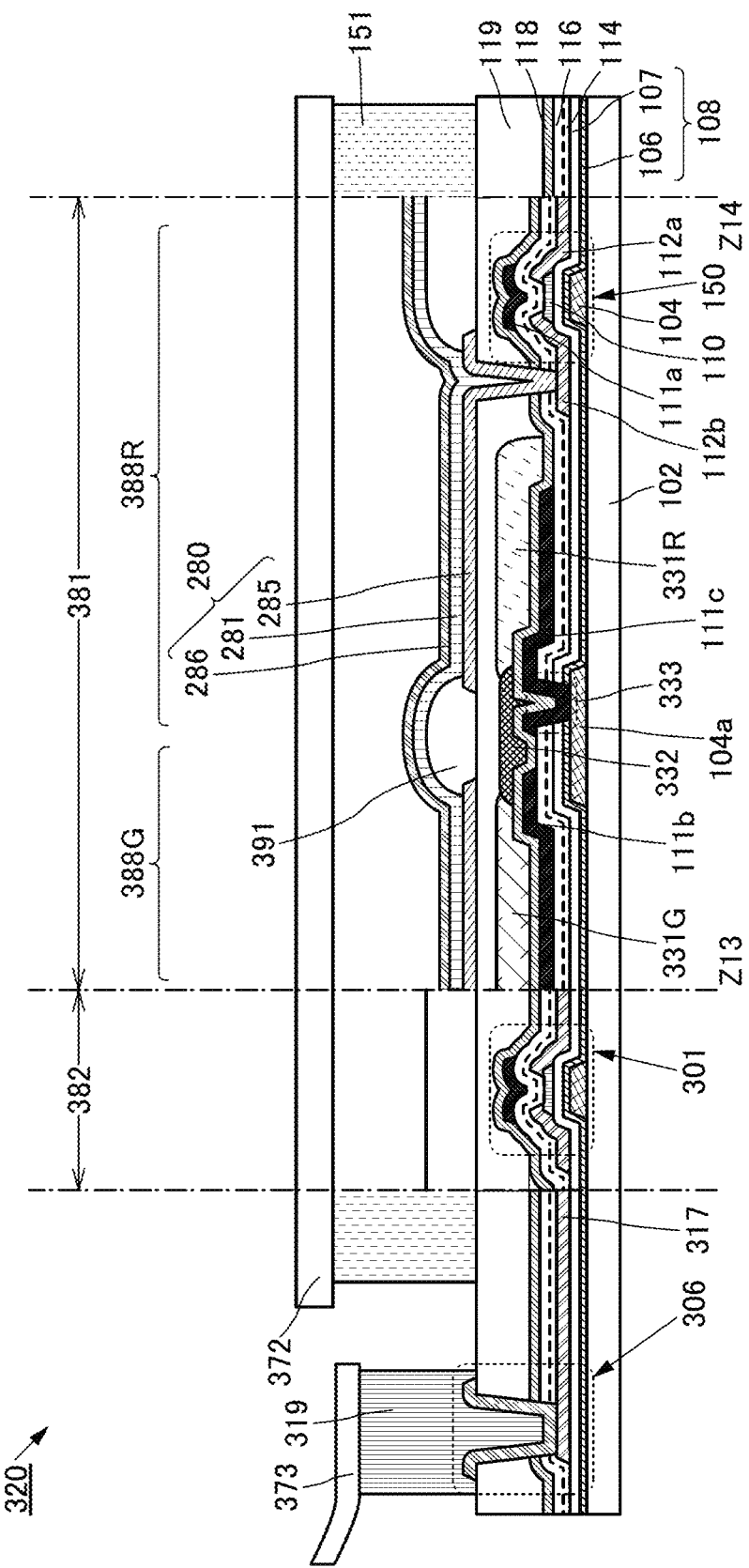
FIG. 23 is a cross-sectional view illustrating an example of a touch panel of one embodiment.

FIG. 23 illustrates a cross-sectional structure example of a touch panel that partly differs from the structure of FIG. 20. Note that descriptions of the portions already described are omitted and different portions are described.

FIG. 23 has a structure in which the conductive films 334 and 341 and the FPC 375 are not provided on the display surface side of the substrate 102. The oxide semiconductor film 111 formed at the same time using the same material as the second gate electrode of the transistor 150 serves as the pair of electrodes of the touch sensor. Specifically, the oxide semiconductor film 111*b* that extends in one direction and the oxide semiconductor film 111*c* that is electrically connected to the conductive film 104*a* extending in the direction orthogonal to the oxide semiconductor film 111*b* serve as the pair of electrodes of the touch sensor. With such a structure, the processing steps can be simpler than those of the structure illustrated in FIG. 20. Note that the oxide semiconductor film 111*c* is electrically connected to the conductive film 104*a* via the opening 333 provided in the insulating films 108, 114, and 116. The conductive film 104*a* can be formed at the same time using the same material as the gate electrode 104. It is preferable that the conductive film 104*a* be provided in a region overlapping with the light-blocking film 332 because the pair of electrodes of the touch sensor is formed with the aperture ratio of the pixel maintained.

Figure 24:
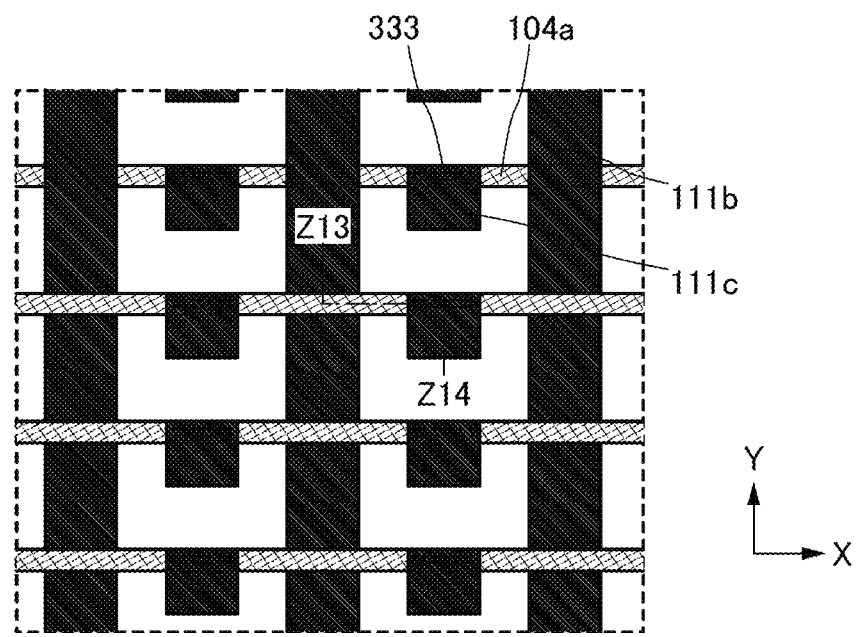
FIG. 24 is a top view illustrating a structure of electrodes of a touch sensor of one embodiment.

Here, the arrangement of the electrodes included in the touch sensor is described. FIG. 24 is a schematic top view of the pair of electrodes of the touch sensor included in the touch panel 320 illustrated in FIG. 23. The dashed-dotted line Z13-Z14 in FIG. 24 corresponds to the display portion 381 in FIG. 23.

The oxide semiconductor film 111*b* that is one electrode of the touch sensor extends in the Y direction. The oxide semiconductor film 111*c* that is the other electrode of the touch sensor is electrically connected to the conductive film 104*a* via the opening 333. The conductive film 104*a* extends in the X direction and intersects with the oxide semiconductor film 111*b*.

At least part of this embodiment can be implemented in combination with any of the other embodiments described in this specification as appropriate.

Embodiment 2

In this embodiment, an example of an oxide semiconductor that can be used for the transistor and the capacitor of the liquid crystal display device of one embodiment of the present invention is described. The structure of an oxide semiconductor is described below.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

Oxide semiconductors are classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, oxide semiconductors are classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time contains a void and has an unstable structure. For this reason, an a-like OS has physical properties similar to those of an amorphous oxide semiconductor.

<CAAC-OS>

First, a CAAC-OS is described.

A CAAC-OS is an oxide semiconductor having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 30A:
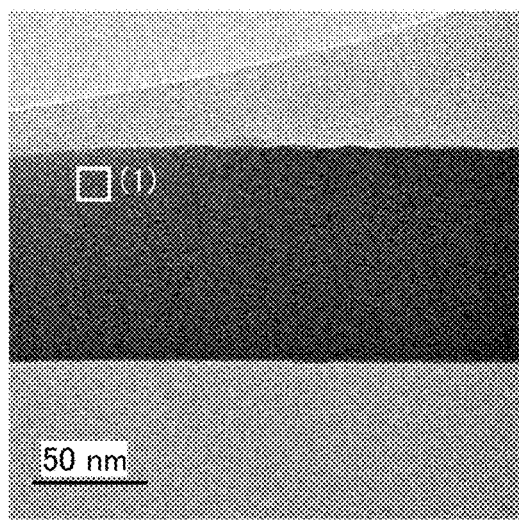
FIGS. 30A to 30C are Cs-corrected high-resolution TEM images of a cross section of a CAAC-OS.

The CAAC-OS observed with a TEM is described below. FIG. 30A shows a high-resolution TEM image of a cross section of the CAAC-OS observed from the direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 30B:
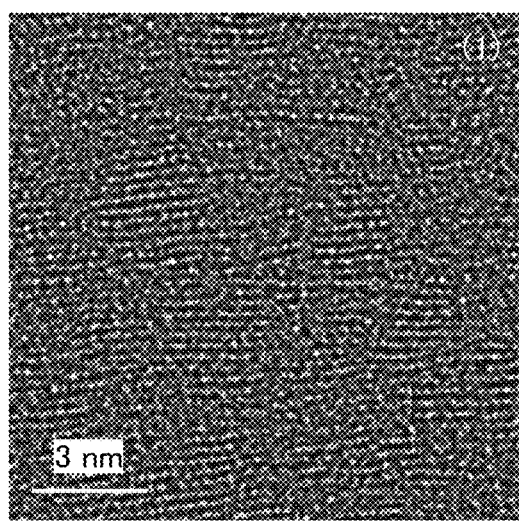

FIG. 30B is an enlarged Cs-corrected high-resolution TEM image of a region (1) in FIG. 30A. FIG. 30B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 30C:
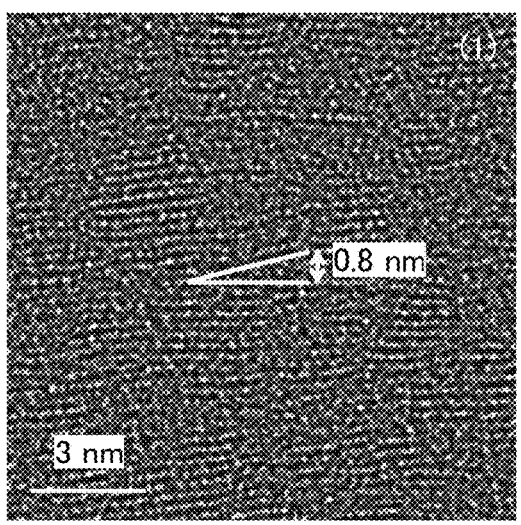

As shown in FIG. 30B, the CAAC-OS has a characteristic atomic arrangement. The characteristic atomic arrangement is denoted by an auxiliary line in FIG. 30C. FIGS. 30B and 30C prove that the size of a pellet is greater than or equal to 1 nm or greater than or equal to 3 nm, and the size of a space caused by the tilt of the pellets is approximately 0.8 nm. Therefore, the pellet can also be referred to as a nanocrystal (nc). Note that a CAAC-OS can be referred to as an oxide semiconductor including c-axis aligned nanocrystals (CANC).

Figure 30D:
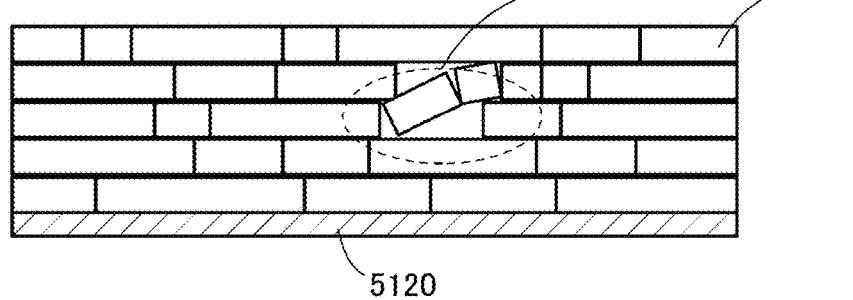
FIG. 30D is a schematic cross-sectional view of a CAAC-OS.

Here, according to the Cs-corrected high-resolution TEM images, the schematic arrangement of pellets 5100 of a CAAC-OS over a substrate 5120 is illustrated by such a structure in which bricks or blocks are stacked (see FIG. 30D). The part in which the pellets are tilted as observed in FIG. 30C corresponds to a region 5161 illustrated in FIG. 30D.

Figure 31A:
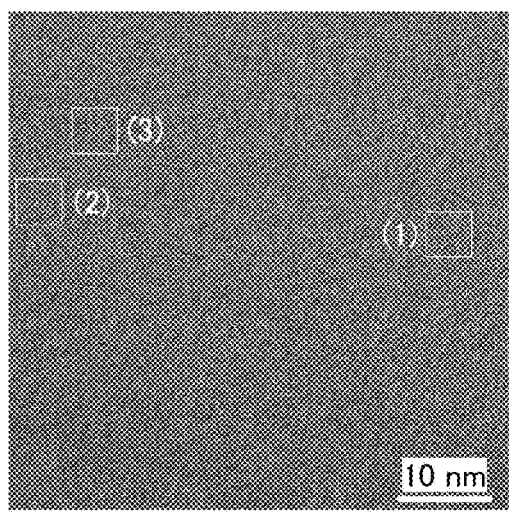
FIGS. 31A to 31D are Cs-corrected high-resolution TEM images of a plane of a CAAC-OS.
Figure 31B:
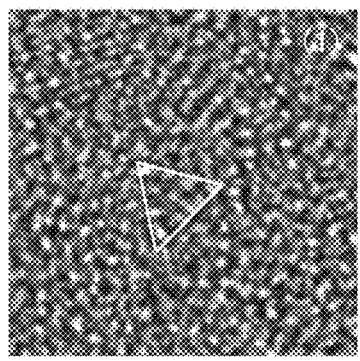
Figure 31C:
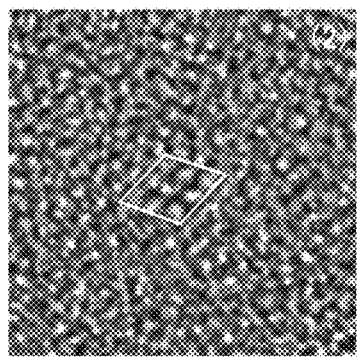
Figure 31D:
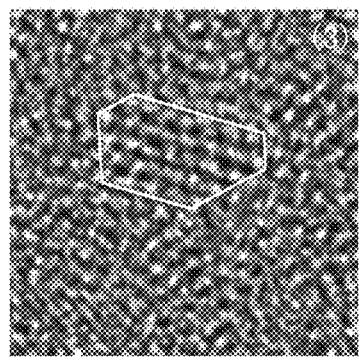

FIG. 31A shows a Cs-corrected high-resolution TEM image of a plane of the CAAC-OS film observed from the direction substantially perpendicular to the sample surface. FIGS. 31B, 31C, and 31D are enlarged Cs-corrected high-resolution TEM images of regions (1), (2), and (3) in FIG. 31A, respectively. FIGS. 31B, 31C, and 31D indicate that metal atoms are arranged in a triangular, quadrangular, or hexagonal configuration in a pellet. However, there is no regularity of arrangement of metal atoms between different pellets.

Figure 32A:
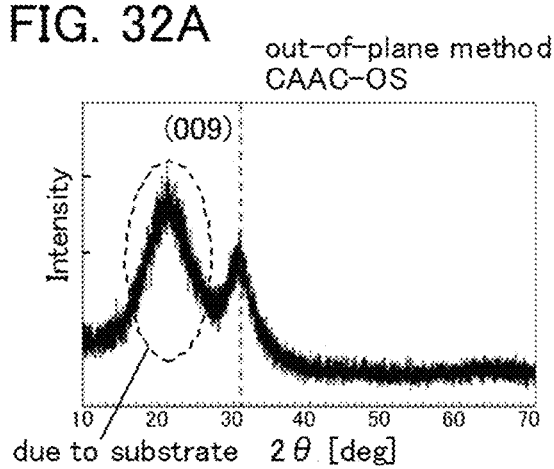
FIGS. 32A to 32C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle (2θ) of around 31° as shown in FIG. 32A. This peak is derived from the (009) plane of the $InGaZnO_4$ crystal, which indicates that crystals in the CAAC-OS have c-axis alignment, and that the c-axes are aligned in the direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. In a preferable CAAC-OS whose structure is analyzed by an out-of-plane method, a peak appears when 2θ is around 31° and no peak appears when 2θ is around 36°.

Figure 32B:
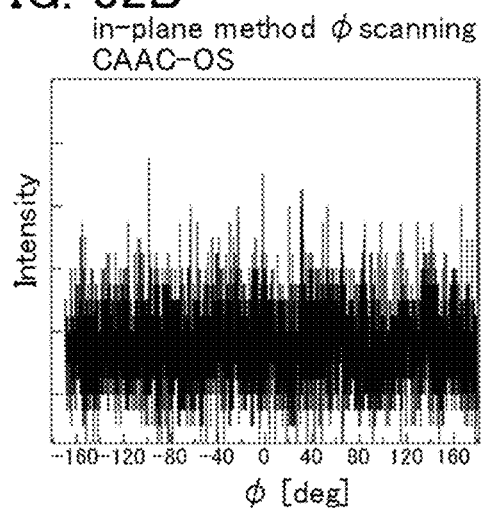
Figure 32C:
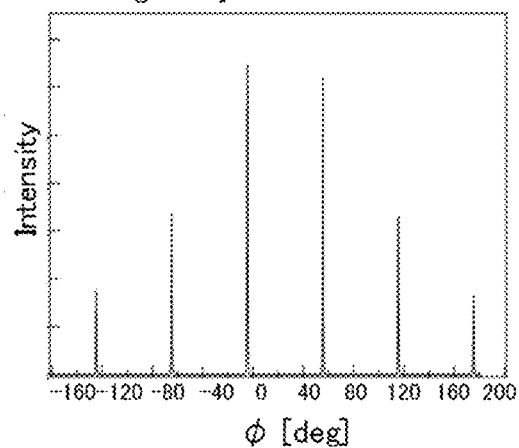

On the other hand, in structural analysis of the CAAC-OS by an in-plane method in which an X-ray is incident on a sample in the direction substantially perpendicular to the c-axis, a peak appears when 2θ is around 56°. This peak is attributed to the (110) plane of the $InGaZnO_4$ crystal. In the case of the CAAC-OS, when analysis (φ scan) is performed with 2θ fixed at around 56° and with the sample rotated using a normal vector of the sample surface as an axis (φ axis), as shown in FIG. 32B, a peak is not clearly observed. In contrast, in the case of a single crystal oxide semiconductor of $InGaZnO_4$, when φ scan is performed with 2θ fixed at around 56°, as shown in FIG. 32C, six peaks that are derived from crystal planes equivalent to the (110) plane are observed. Accordingly, the structural analysis using XRD shows that the directions of a-axes and b-axes are irregularly oriented in the CAAC-OS.

Figure 33A:
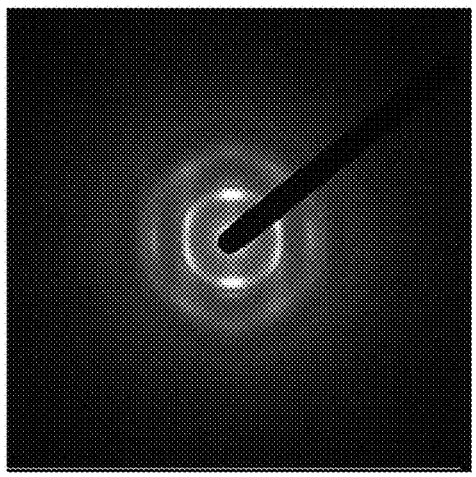
FIGS. 33A and 33B each show an electron diffraction pattern of a CAAC-OS.
Figure 33B:
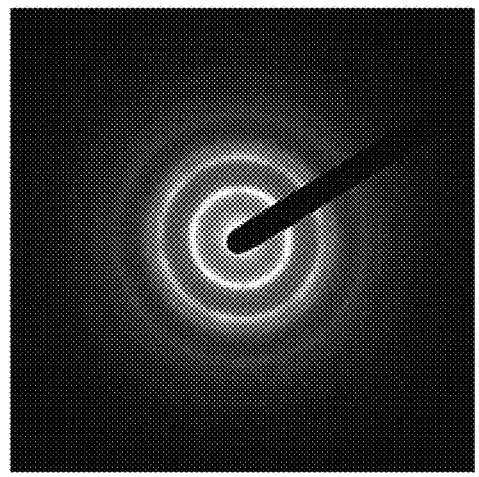

Next, a CAAC-OS analyzed by electron diffraction is described. For example, when an electron beam with a probe diameter of 300 nm is incident on a CAAC-OS including an $InGaZnO_4$ crystal in the direction parallel to the sample surface, such a diffraction pattern (also referred to as a selected-area transmission electron diffraction pattern) as is shown in FIG. 33A can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in the direction substantially perpendicular to the formation surface or the top surface of the CAAC-OS. Meanwhile, FIG. 33B shows a diffraction pattern obtained in such a manner that an electron beam with a probe diameter of 300 nm is incident on the same sample in the direction perpendicular to the sample surface. As shown in FIG. 33B, a ring-like diffraction pattern is observed. Thus, the electron diffraction also indicates that the a-axes and b-axes of the pellets included in the CAAC-OS do not have regular alignment. The first ring in FIG. 33B is probably derived from the (010) plane, the (100) plane, and the like of the $InGaZnO_4$ crystal. The second ring in FIG. 33B is probably derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. For example, the impurity contained in the oxide semiconductor might serve as a carrier trap or serve as a carrier generation source. Furthermore, oxygen vacancies in the oxide semiconductor might serve as carrier traps or serve as carrier generation sources when hydrogen is captured therein.

The CAAC-OS having small amounts of impurities and oxygen vacancies is an oxide semiconductor with low carrier density (specifically, lower than $8\times10^{11}/cm^3$, preferably lower than $1\times10^{11}/cm^3$, more preferably lower than $1\times10^{10}/cm^3$, and is higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. An oxide semiconductor including a crystal part whose size is greater than 10 nm and less than or equal to 100 nm can be referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method. For example, when the nc-OS is subjected to analysis by an out-of-plane method using an X-ray having a diameter larger than the size of a pellet, a peak that shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Furthermore, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS has a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<A-like OS>

An a-like OS has a structure between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

FIG. 34 shows change in the average size of crystal parts (at 22 points to 45 points) in each sample. Note that the crystal part size corresponds to the length of a lattice fringe. FIG. 34 indicates that the crystal part size in the a-like OS increases with an increase in the cumulative electron dose. Specifically, as shown by (1) in FIG. 34, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 34, the average size of crystal parts in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that single crystals with the same composition do not exist in some cases. In that case, single crystal oxide semiconductors with different compositions are combined at an adequate ratio, which makes it possible to estimate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stack including two or more of an amorphous oxide semiconductor, an a-like OS, an nc-OS, and a CAAC-OS, for example.

<Method for Forming CAAC-OS>

Figure 35:
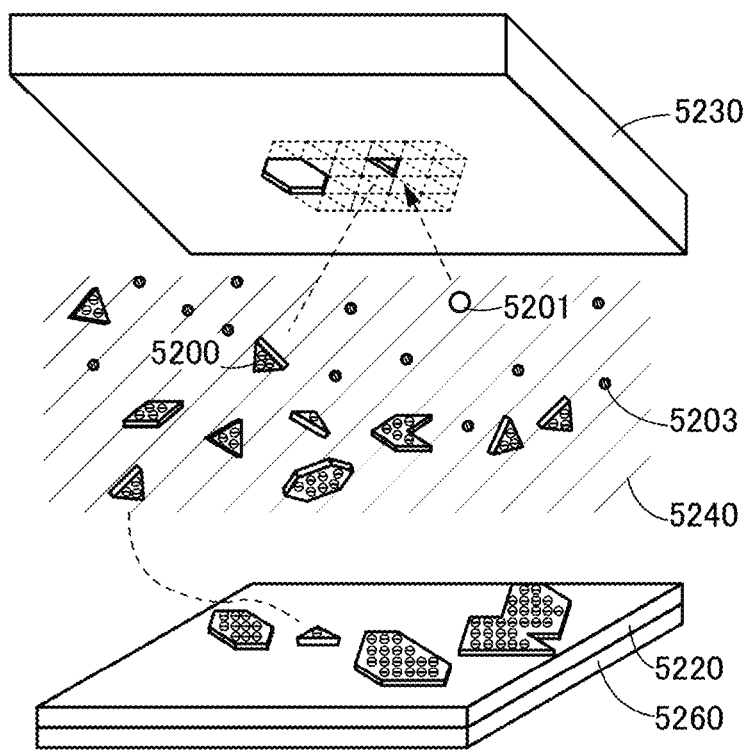
FIG. 35 illustrates a deposition method of a CAAC-OS.

An example of a method for forming a CAAC-OS film is described below. FIG. 35 is a schematic view of the inside of a deposition chamber. The CAAC-OS film can be formed by a sputtering method.

As shown in FIG. 35, a substrate 5220 and a target 5230 are arranged to face each other. Plasma 5240 is generated between the substrate 5220 and the target 5230. A heating mechanism 5260 is provided under the substrate 5220. Although not illustrated, a target 5230 is attached to a backing plate. A plurality of magnets is provided to face the target 5230 with the backing plate positioned therebetween. A sputtering method in which the deposition rate is increased by utilizing a magnetic field of magnets is referred to as a magnetron sputtering method.

The distance d between the substrate 5220 and the target 5230 (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a certain voltage or higher to the target 5230, and plasma 5240 is observed. The magnetic field forms a high-density plasma region in the vicinity of the target 5230. In the high-density plasma region, the deposition gas is ionized, so that an ion 5201 is generated. Examples of the ion 5201 include an oxygen cation ($O^+$) and an argon cation ($Ar^+$).

Figure 36A:
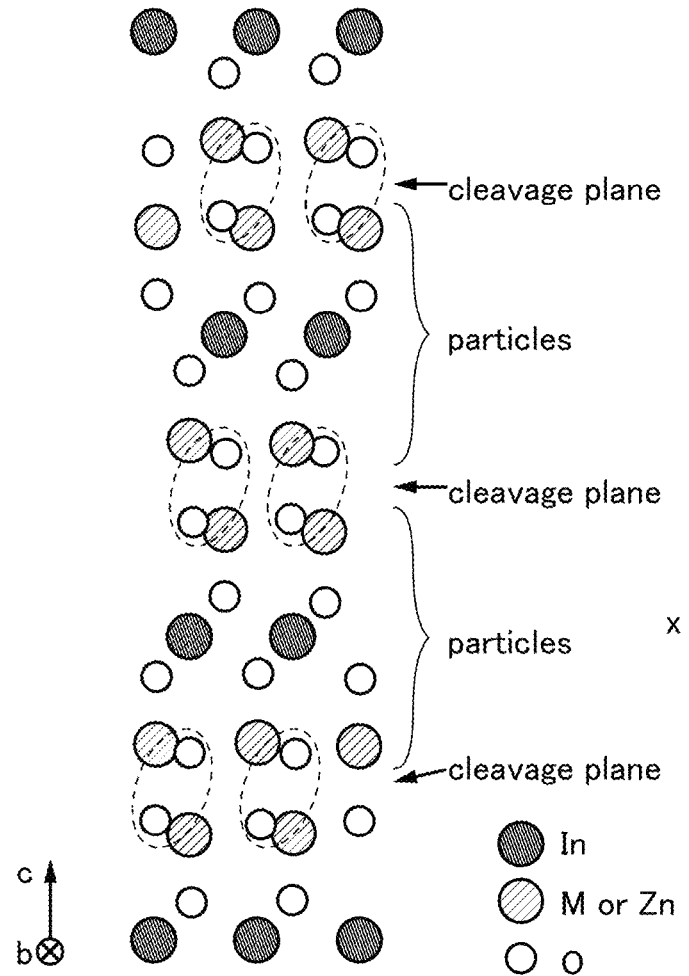
FIGS. 36A to 36C illustrate an $InMZnO_4$ crystal.
Figures 36B, 36C:
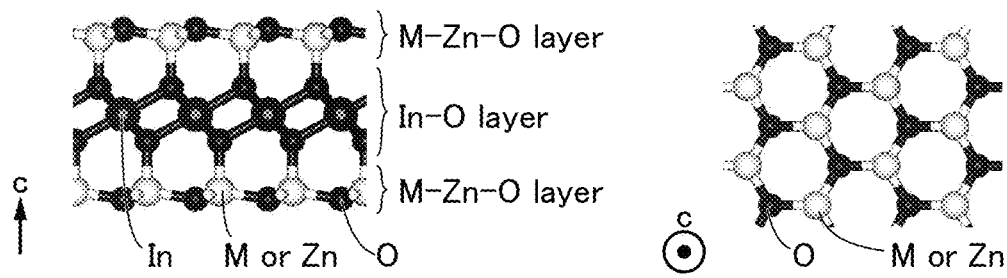

Here, the target 5230 has a polycrystalline structure with a plurality of crystal grains and in which a cleavage plane exists in any of the crystal grains. FIGS. 36A to 36C show a crystal structure of $InMZnO_4$ (the element M is Al, Ga, Y, or Sn, for example) included in the target 5230 as an example. Note that FIG. 36A illustrates the crystal structure of $InMZnO_4$ observed from the direction parallel to the b-axis. In the crystal of $InMZnO_4$, oxygen atoms are negatively charged, whereby repulsive force is generated between the two adjacent M-Zn—O layers. Thus, the $InMZnO_4$ crystal has a cleavage plane between the two adjacent M-Zn—O layers.

The ion 5201 generated in the high-density plasma region is accelerated toward the target 5230 side by an electric field, and then collides with the target 5230. At this time, a pellet 5200 that is a flat-plate-like or pellet-like sputtered particle is separated from the cleavage plane (FIG. 35). The pellet 5200 is between the two cleavage planes shown in FIG. 36A. Thus, when the pellet 5200 is observed, the cross-section thereof is as shown in FIG. 36B, and the top surface thereof is as shown in FIG. 36C. Note that the structure of the pellet 5200 may be distorted by an impact of collision of the ion 5201.

The pellet 5200 is a flat-plate-like (pellet-like) sputtered particle having a triangle plane, e.g., a regular triangle plane. Alternatively, the pellet 5200 is a flat-plate-like (pellet-like) sputtered particle having a hexagonal plane, e.g., regular hexagonal plane. The shape of the pellet 5200 is not limited to a triangle or a hexagon. For example, the flat plane may have a shape formed by combining two or more triangles. For example, a quadrangle (e.g., rhombus) may be formed by combining two triangles (e.g., regular triangles).

The thickness of the pellet 5200 is determined depending on the kind of deposition gas and the like. For example, the thickness of the pellet 5200 is greater than or equal to 0.4 nm and less than or equal to 1 nm, preferably greater than or equal to 0.6 nm and less than or equal to 0.8 nm. In addition, for example, the width of the pellet 5200 is greater than or equal to 1 nm and less than or equal to 100 nm, preferably greater than or equal to 2 nm and less than or equal to 50 nm, more preferably greater than or equal to 3 nm and less than or equal to 30 nm. For example, the ion 5201 collides with the target 5230 including the In-M-Zn oxide. Then, the pellet 5200 including three layers of an M-Zn—O layer, an In—O layer, and an M-Zn—O layer is separated. Note that along with the separation of the pellet 5200, a particle 5203 is also sputtered from the target 5230. The particle 5203 has an atom or an aggregate of several atoms. Therefore, the particle 5203 can be referred to as an atomic particle.

The surface of the pellet 5200 may be negatively or positively charged when the pellet 5200 passes through the plasma 5240. For example, the pellet 5200 may receive a negative charge from $O^{2-}$ in the plasma 5240. As a result, oxygen atoms on the surfaces of the pellet 5200 may be negatively charged. In addition, when passing through the plasma 5240, the pellet 5200 is sometimes combined with indium, the element M, zinc, oxygen, or the like in the plasma 5240 to grow up.

The pellet 5200 and the particles 5203 that have passed through the plasma 5240 reach a surface of the substrate 5220. Note that some of the particles 5203 are discharged to the outside by a vacuum pump or the like because of their smallness in mass.

Next, deposition of the pellet 5200 and the particle 5203 on the surface of the substrate 5220 is described with reference to FIGS. 37A to 37F.

First, a first pellet 5200 is deposited on the substrate 5220. Since the pellet 5200 has a flat-plate-like shape, it is deposited so that its flat plane faces the surface of the substrate 5220. At this time, charge on a surface of the pellet 5200 on the substrate 5220 side is lost through the substrate 5220.

Next, a second pellet 5200 reaches the substrate 5220. Since a surface of the first pellet 5200 and a surface of the second pellet 5200 are charged, they repel each other. As a result, the second pellet 5200 avoids being deposited on the first pellet 5200, and is deposited with its flat plane facing the surface of the substrate 5220 so as to be a little distance away from the first pellet 5200. With repetition of this, millions of the pellets 5200 are deposited on the surface of the substrate 5220 to have a thickness of one layer. A region where no pellet 5200 is deposited is generated between adjacent pellets 5200 (see FIG. 37A).

Then, the particles 5203 that have received energy from plasma reach the surface of the substrate 5220. The particles 5203 cannot be deposited on an active region such as the surfaces of the pellets 5200. For this reason, the particles 5203 move to regions where no pellet 5200 is deposited and are attached to side surfaces of the pellets 5200. Since available bonds of the particles 5203 are activated by energy received from plasma, the particles 5203 are chemically bonded to the pellets 5200 to form lateral growth portions 5202 (see FIG. 37B).

Figure 37A:
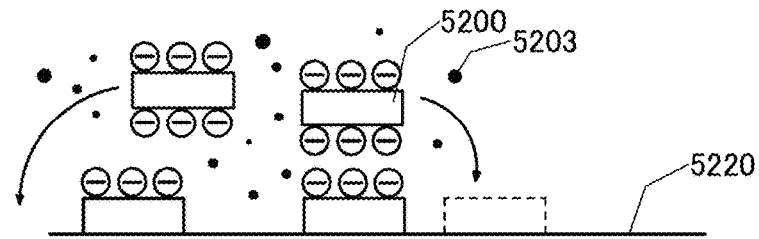
FIGS. 37A to 37F illustrate a deposition method of a CAAC-OS.
Figure 37B:
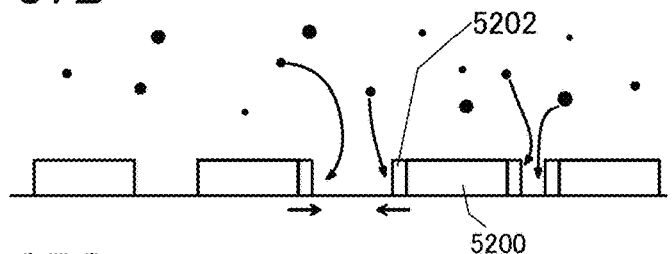
Figure 37C:
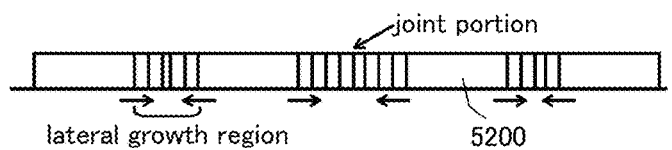

The lateral growth portions 5202 then further grow laterally so that the pellets 5200 are anchored to each other (see FIG. 37C). In this manner, the lateral growth portions 5202 are formed until they fill regions where no pellet 5200 is deposited. This mechanism is similar to a deposition mechanism for an atomic layer deposition (ALD) method.

Even when the deposited pellets 5200 are oriented in different directions, the particles 5203 cause a lateral growth to fill gaps between the pellets 5200; thus, no clear grain boundary is formed. In addition, as the particles 5203 make a smooth connection between the pellets 5200, a crystal structure different from single crystal and polycrystal structures is formed. In other words, a crystal structure including distortion between minute crystal regions (pellets 5200) is formed. Regions filling the gaps between the crystal regions are distorted crystal regions, and thus, it is probably not appropriate to say that the regions have an amorphous structure.

Figure 37D:
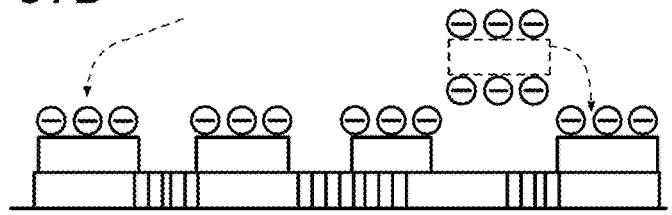
Figure 37E:
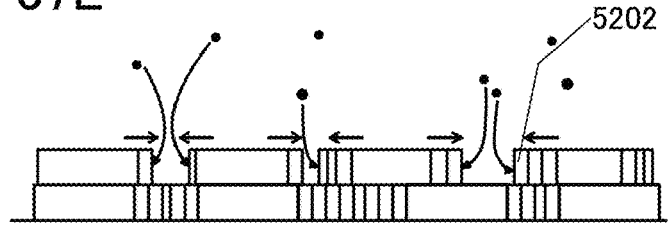
Figure 37F:
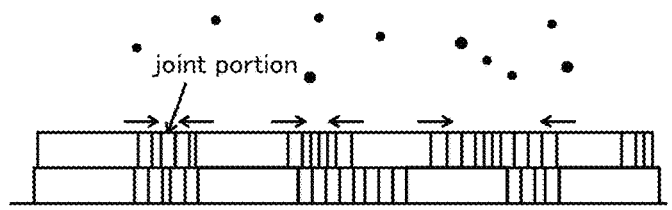

Next, new pellets 5200 are deposited with their flat planes facing the surface of the substrate 5220 (see FIG. 37D). After that, the particles 5203 are deposited so as to fill regions where no pellet 5200 is deposited, thereby forming the lateral growth portions 5202 (see FIG. 37E). In such a manner, the particles 5203 are attached to side surfaces of the pellets 5200 and the lateral growth portions 5202 cause a lateral growth so that the pellets 5200 in the second layer are anchored to each other (see FIG. 37F). Deposition continues until the m-th layer (m is an integer of two or more) is formed; as a result, a layered thin film structure is formed.

A deposition way of the pellets 5200 changes according to the surface temperature of the substrate 5220 or the like. For example, if the surface temperature of the substrate 5220 is high, migration of the pellets 5200 occurs over the surface of the substrate 5220. As a result, the proportion of the pellets 5200 that are directly connected with each other without the particles 5203 increases, whereby a CAAC-OS film with high orientation is made. The surface temperature of the substrate 5220 for formation of the CAAC-OS film is higher than or equal to room temperature and lower than 340° C., preferably higher than or equal to room temperature and lower than or equal to 300° C., more preferably higher than or equal to 100° C. and lower than or equal to 250° C., still more preferably higher than or equal to 100° C. and lower than or equal to 200° C. Therefore, even when a large-sized substrate of the 8th generation or more is used as the substrate 5220, a warp or the like due to the formation of the CAAC-OS film hardly occurs.

In contrast, if the surface temperature of the substrate 5220 is low, the migration of the pellets 5200 over the substrate 5220 does not easily occur. As a result, the pellets 5200 are stacked to form an nc-OS or the like with low orientation. In the nc-OS, the pellets 5200 are possibly deposited with certain gaps when the pellets 5200 are negatively charged. Therefore, the nc-OS has low orientation but some regularity, and thus it has a denser structure than an amorphous oxide semiconductor.

When spaces between pellets are extremely small in a CAAC-OS, the pellets may apparently form a large pellet. The large pellet has a single crystal structure. For example, the size of the large pellet may be greater than or equal to 10 nm and less than or equal to 200 nm, greater than or equal to 15 nm and less than or equal to 100 nm, or greater than or equal to 20 nm and less than or equal to 50 nm, when seen from the above.

The pellets are probably deposited on the surface of the substrate according to such a deposition model. A CAAC-OS film can be formed even when a formation surface does not have a crystal structure. This indicates that the above-described deposition model, which is a growth mechanism different from an epitaxial growth, has high validity. In addition, with the above-described deposition model, a uniform film of a CAAC-OS or an nc-OS can be formed even over a large-sized glass substrate or the like. Even when the surface of the substrate (formation surface) has an amorphous structure (e.g., amorphous silicon oxide), for example, a CAAC-OS film can be formed.

In addition, even when the surface of the substrate (formation surface) has an uneven shape, the pellets are aligned along the shape.

The above-described deposition model suggests that a CAAC-OS film with high crystallinity can be formed in the following manner: deposition is performed in a high vacuum to have a long mean free path, plasma energy is weakened to reduce damage around a substrate, and thermal energy is applied to a formation surface to repair damage due to plasma during deposition.

The above-described deposition model can be used not only for the case where a target has a polycrystalline structure of a composite oxide with a plurality of crystal grains, such as an In-M-Zn oxide, and any of the crystal grains have a cleavage plane; but also for the case where, for example, a target of a mixture containing indium oxide, an oxide of the element M, and zinc oxide is used.

Since there is no cleavage plane in a target of a mixture, atomic particles are separated from the target by sputtering. During deposition, a high electric field region of plasma is formed around a target. Because of the high electric field region of plasma, atomic particles separated from the target are anchored to each other to cause a lateral growth. For example, indium atoms, which are atomic particles, are anchored to each other and cause a lateral growth to be a nanocrystal formed of an In—O layer, and then an M-Zn—O layer is bonded above and below the nanocrystalline In—O layer so as to complement the nanocrystalline In—O layer. In this manner, a pellet can be formed even when a target of a mixture is used. Accordingly, the above-described deposition model can also be applied to the case of using a target of a mixture.

Note that in the case where a high electric field region of plasma is not formed around a target, only atomic particles separated from the target are deposited on a substrate surface. In that case, a lateral growth of an atomic particle might occur on the substrate surface. However, since the orientations of atomic particles are not the same, the crystal orientation in the resulting thin film is not uniform. As a result, an nc-OS or the like is obtained.

Embodiment 3

In this embodiment, a structure example different from that of the transistor described in Embodiment 1 is described with reference to FIGS. 38A to 38C, FIGS. 39A to 39D, FIGS. 40A and 40B, and FIGS. 41A to 41D.

Example 1 of Transistor Structure

Figure 38A:
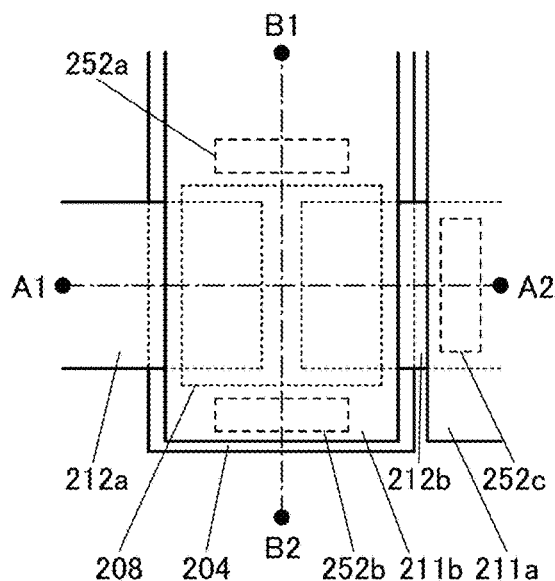
FIGS. 38A to 38C are a top view and cross-sectional views illustrating an example of a transistor.
Figure 38B:
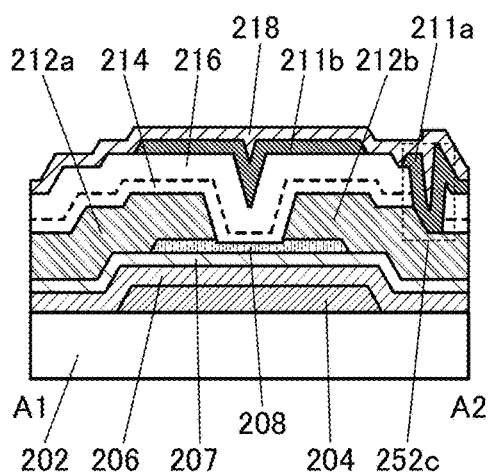
Figure 38C:
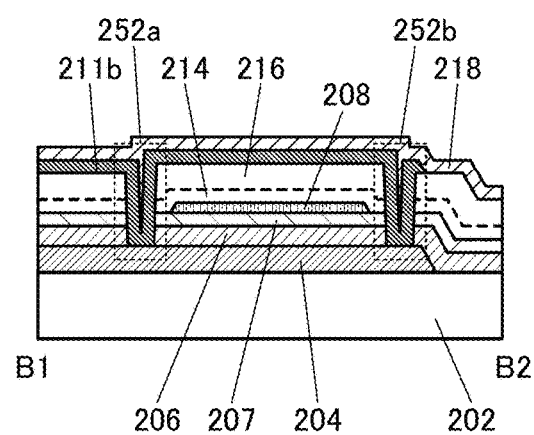

FIG. 38A is a top view of a transistor 270. FIG. 38B is a cross-sectional view taken along the dashed-dotted line A1-A2 in FIG. 38A, and FIG. 38C is a cross-sectional view taken along the dashed-dotted line B1-B2 in FIG. 38A. Note that the direction of the dashed dotted line A1-A2 may be called the channel length direction, and the direction of the dashed dotted line B1-B2 may be called the channel width direction.

The transistor 270 includes a conductive film 204 functioning as a first gate electrode over a substrate 202, an insulating film 206 over the substrate 202 and the conductive film 204, an insulating film 207 over the insulating film 206, an oxide semiconductor film 208 over the insulating film 207, a conductive film 212a functioning as a source electrode electrically connected to the oxide semiconductor film 208, a conductive film 212b functioning as a drain electrode electrically connected to the oxide semiconductor film 208, insulating films 214 and 216 over the oxide semiconductor film 208 and the conductive films 212a and 212b, and an oxide semiconductor film 211b over the insulating film 216. In addition, an insulating film 218 is provided over the oxide semiconductor film 211b.

In the transistor 270, the insulating films 214 and 216 function as a second gate insulating film of the transistor 270. An oxide semiconductor film 211a is connected to the conductive film 212b through an opening 252c provided in the insulating films 214 and 216. The oxide semiconductor film 211a functions as, for example, a pixel electrode used for a display device. The oxide semiconductor film 211b in the transistor 270 functions as a second gate electrode (also referred to as a back gate electrode).

As illustrated in FIG. 38C, the oxide semiconductor film 211b is connected to the conductive film 204 functioning as a first gate electrode through openings 252a and 252b provided in the insulating films 206, 207, 214, and 216. Accordingly, the oxide semiconductor film 211b and a conductive film 220b are supplied with the same potential.

Note that although the structure in which the openings 252a and 252b are provided so that the oxide semiconductor film 211b and the conductive film 204 are connected to each other is described in this embodiment, one embodiment of the present invention is not limited thereto. For example, a structure in which only one of the openings 252a and 252b is provided so that the oxide semiconductor film 211b and the conductive film 204 are connected to each other, or a structure in which the openings 252a and 252b are not provided and the oxide semiconductor film 211b and the conductive film 204 are not connected to each other may be employed. Note that in the case where the oxide semiconductor film 211b and the conductive film 204 are not connected to each other, it is possible to apply different potentials to the oxide semiconductor film 211b and the conductive film 204.

As illustrated in FIG. 38B, the oxide semiconductor film 208 is positioned to face each of the conductive film 204 functioning as a first gate electrode and the oxide semiconductor film 211b functioning as a second gate electrode, and is sandwiched between the two conductive films functioning as gate electrodes. The length in the channel length direction and the length in the channel width direction of the oxide semiconductor film 211b functioning as a second gate electrode are longer than that in the channel length direction and that in the channel width direction of the oxide semiconductor film 208, respectively. The whole oxide semiconductor film 208 is covered with the oxide semiconductor film 211b with the insulating films 214 and 216 positioned therebetween. Since the oxide semiconductor film 211b functioning as a second gate electrode is connected to the conductive film 204 functioning as a first gate electrode through the openings 252a and 252b provided in the insulating films 206 and 207 and the insulating films 214 and 216, a side surface of the oxide semiconductor film 208 in the channel width direction faces the oxide semiconductor film 211b functioning as a second gate electrode with the insulating films 214 and 216 positioned therebetween.

In other words, in the channel width direction of the transistor 270, the conductive film 204 functioning as a first gate electrode and the oxide semiconductor film 211b functioning as a second gate electrode are connected to each other through the openings provided in the insulating films 206 and 207 functioning as first gate insulating films and the insulating films 214 and 216 functioning as second gate insulating films; and the conductive film 204 and the oxide semiconductor film 211b surround the oxide semiconductor film 208 with the insulating films 206 and 207 functioning as the first gate insulating films and the insulating films 214 and 216 functioning as the second gate insulating films positioned therebetween.

Such a structure enables the oxide semiconductor film 208 included in the transistor 270 to be electrically surrounded by electric fields of the conductive film 204 functioning as a first gate electrode and the oxide semiconductor film 211b functioning as a second gate electrode. A device structure of a transistor, like that of the transistor 270, in which electric fields of a first gate electrode and a second gate electrode electrically surround an oxide semiconductor film where a channel region is formed, can be referred to as a surrounded channel (s-channel) structure.

Since the transistor 270 has the s-channel structure, an electric field for inducing a channel can be effectively applied to the oxide semiconductor film 208 by the conductive film 204 functioning as a first gate electrode; therefore, the current drive capability of the transistor 270 can be improved and high on-state current characteristics can be obtained. Since the on-state current can be increased, it is possible to reduce the size of the transistor 270. In addition, since the transistor 270 is surrounded by the conductive film 204 functioning as a first gate electrode and the oxide semiconductor film 211b functioning as a second gate electrode, the mechanical strength of the transistor 270 can be increased.

Example 2 of Transistor Structure

Figure 39A:
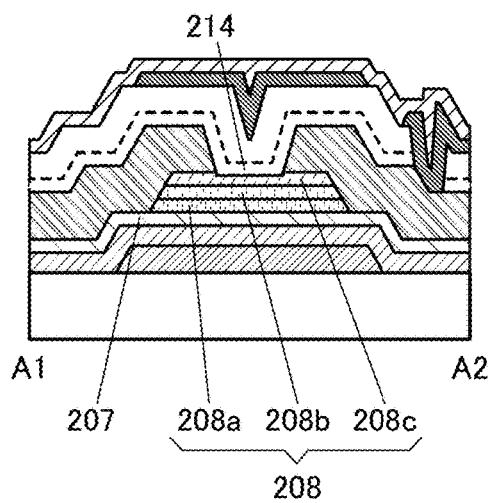
FIGS. 39A to 39D are cross-sectional views illustrating examples of a transistor.
Figure 39B:
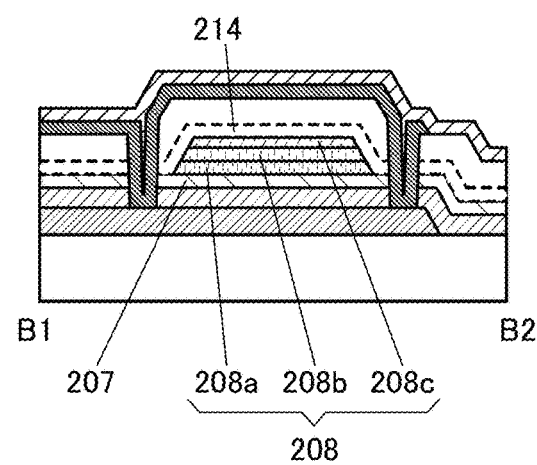
Figure 39C:
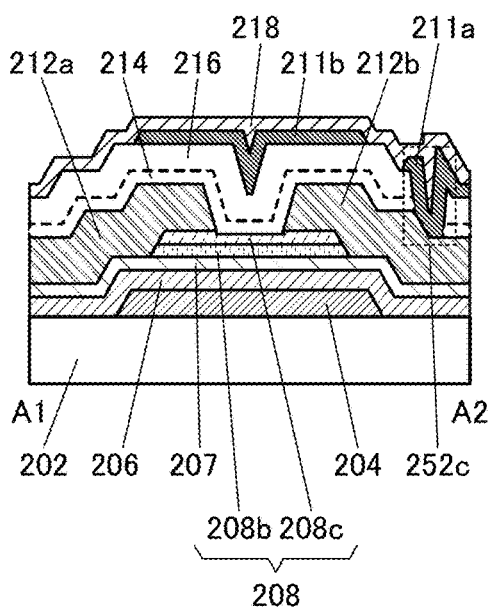
Figure 39D:
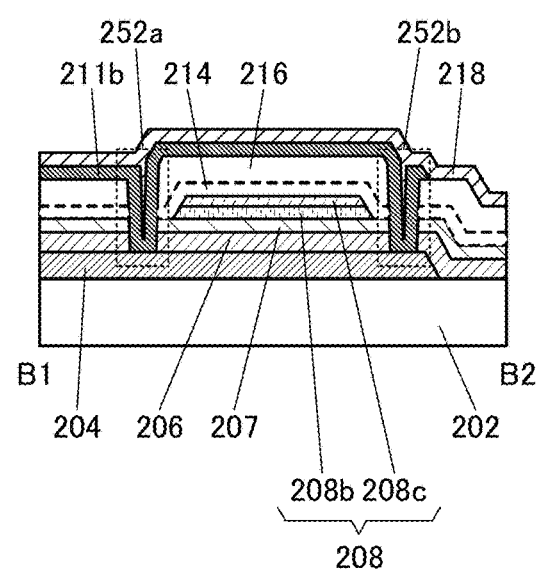

Structure examples different from that of the transistor 270 in FIGS. 38A to 38C are described with reference to FIGS. 39A to 39D. FIGS. 39A and 39B illustrate a cross-sectional view illustrating a modification example of the transistor 270 in FIGS. 38B and 38C. FIGS. 39C and 39D illustrate a cross-sectional view illustrating another modification example of the transistor 270 in FIGS. 38B and 38C.

A transistor 270A in FIGS. 39A and 39B is different from the transistor 270 in FIGS. 38B and 38C in that the oxide semiconductor film 208 has a three-layer structure. Specifically, the oxide semiconductor film 208 of the transistor 270A includes an oxide semiconductor film 208a, an oxide semiconductor film 208b, and an oxide semiconductor film 208c.

A transistor 270B in FIGS. 39C and 39D is different from the transistor 270 in FIGS. 38B and 38C in that the oxide semiconductor film 208 has a two-layer structure. Specifically, the oxide semiconductor film 208 of the transistor 270B includes the oxide semiconductor film 208b and the oxide semiconductor film 208c.

The structure of the transistor 150 described in Embodiment 1 can be referred to for the structures of the transistors 270, 270A, and 270B in this embodiment. Thus, the material and the manufacturing method of the substrate 102 can be referred to for those of the substrate 202. The material and the manufacturing method of the gate electrode 104 can be referred to for those of the conductive film 204. The materials and the manufacturing methods of the insulating films 106 and 107 can be referred to for those of the insulating films 206 and 207, respectively. The material and the manufacturing method of the oxide semiconductor film 110 can be referred to for those of the oxide semiconductor film 208. The material and the manufacturing method of the oxide semiconductor film 111 can be referred to for those of the oxide semiconductor film 211a and those of the oxide semiconductor film 211b. The material and the manufacturing method of the source electrode 112a and the drain electrode 112b can be referred to for those of the conductive film 212a and the conductive film 212b. The materials and the manufacturing methods of the insulating films 114, 116, and 118 can be referred to for those of the insulating films 214, 216, and 218, respectively.

Here, a band structure including the oxide semiconductor film 208 and insulating films in contact with the oxide semiconductor film 208 is described with reference to FIGS. 40A and 40B.

Figure 40A:
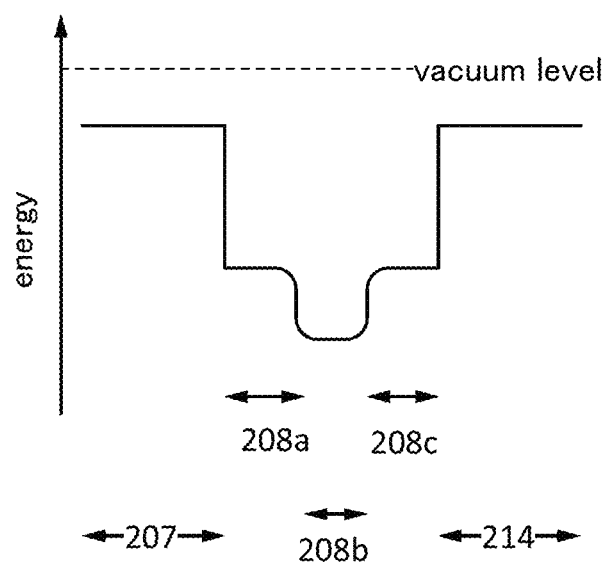
FIGS. 40A and 40B each show a band structure.

FIG. 40A shows an example of a band structure in the thickness direction of a layered structure including the insulating film 207, the oxide semiconductor films 208a, 208b, and 208c, and the insulating film 214. FIG. 40B shows an example of a band structure in the thickness direction of a layered structure including the insulating film 207, the oxide semiconductor films 208b and 208c, and the insulating film 214. For easy understanding, the energy level of the conduction band minimum (Ec) of each of the insulating film 207, the oxide semiconductor films 208a, 208b, and 208c, and the insulating film 214 is shown in the band structures.

In the band structure of FIG. 40A, a silicon oxide film is used as each of the insulating film 207 and the insulating film 214, an oxide semiconductor film formed using a metal oxide target having an atomic ratio of metal elements, In:Ga:Zn=1:1:1.2, is used as the oxide semiconductor film 208a, an oxide semiconductor film formed using a metal oxide target having an atomic ratio of metal elements, In:Ga:Zn=4:2:4.1, is used as the oxide semiconductor film 208b, and an oxide semiconductor film formed using a metal oxide target having an atomic ratio of metal elements, In:Ga:Zn=1:1:1.2, is used as the oxide semiconductor film 208c.

Figure 40B:
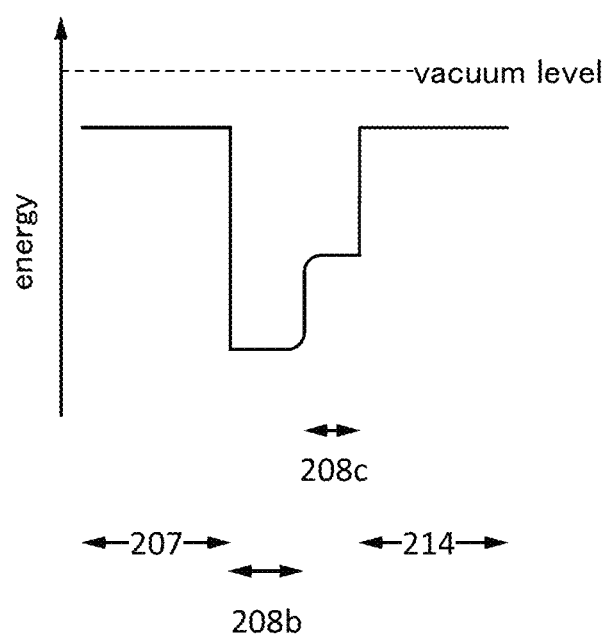

In the band structure of FIG. 40B, a silicon oxide film is used as each of the insulating film 207 and the insulating film 214, an oxide semiconductor film formed using a metal oxide target having an atomic ratio of metal elements, In:Ga:Zn=4:2:4.1, is used as the oxide semiconductor film 208b, and an oxide semiconductor film formed using a metal oxide target having an atomic ratio of metal elements, In:Ga:Zn=1:1:1.2, is used as the oxide semiconductor film 208c.

As illustrated in FIGS. 40A and 40B, the energy level of the conduction band minimum gradually changes between the oxide semiconductor film 208a and the oxide semiconductor film 208b and between the oxide semiconductor film 208b and the oxide semiconductor film 208c. In other words, the energy level of the conduction band minimum is continuously changed or continuously connected. To obtain such a band structure, there exists no impurity, which forms a defect state such as a trap center or a recombination center, at the interface between the oxide semiconductor film 208a and the oxide semiconductor film 208b or at the interface between the oxide semiconductor film 208b and the oxide semiconductor film 208c.

To form a continuous junction between the oxide semiconductor film 208a and the oxide semiconductor film 208b and between the oxide semiconductor film 208b and the oxide semiconductor film 208c, it is necessary to form the films successively without exposure to the air by using a multi-chamber deposition apparatus (sputtering apparatus) provided with a load lock chamber.

With the band structures of FIG. 40A and FIG. 40B, the oxide semiconductor film 208b serves as a well, and a channel region is formed in the oxide semiconductor film 208b in the transistor with the layered structure.

By providing the oxide semiconductor film 208a and the oxide semiconductor film 208c, the oxide semiconductor film 208b can be distanced away from trap states.

In addition, the trap states might be more distant from the vacuum level than the energy level of the conduction band minimum (Ec) of the oxide semiconductor film 208b functioning as a channel region, so that electrons are likely to be accumulated in the trap states. When the electrons are accumulated in the trap states, the electrons become negative fixed electric charge, so that the threshold voltage of the transistor is shifted in the positive direction. Therefore, it is preferable that the trap states be closer to the vacuum level than the energy level of the conduction band minimum (Ec) of the oxide semiconductor film 208b. Such a structure inhibits accumulation of electrons in the trap states. As a result, the on-state current and the field-effect mobility of the transistor can be increased.

The energy level of the conduction band minimum of each of the oxide semiconductor films 208a and 208c is closer to the vacuum level than that of the oxide semiconductor film 208b. Typically, a difference in energy level between the conduction band minimum of the oxide semiconductor film 208b and the conduction band minimum of each of the oxide semiconductor films 208a and 208c is 0.15 eV or more or 0.5 eV or more and 2 eV or less or 1 eV or less. That is, the difference between the electron affinity of each of the oxide semiconductor films 208a and 208c and the electron affinity of the oxide semiconductor film 208b is 0.15 eV or more or 0.5 eV or more and 2 eV or less or 1 eV or less.

In such a structure, the oxide semiconductor film 208b serves as a main path of a current. In other words, the oxide semiconductor film 208b serves as a channel region, and the oxide semiconductor films 208a and 208c serve as oxide insulating films. In addition, since the oxide semiconductor films 208a and 208c each include one or more metal elements included in the oxide semiconductor film 208b in which a channel region is formed, interface scattering is less likely to occur at the interface between the oxide semiconductor film 208a and the oxide semiconductor film 208b or at the interface between the oxide semiconductor film 208b and the oxide semiconductor film 208c. Thus, the transistor can have high field-effect mobility because the movement of carriers is not hindered at the interface.

To prevent each of the oxide semiconductor films 208a and 208c from functioning as part of a channel region, a material having sufficiently low conductivity is used for the oxide semiconductor films 208a and 208c. Thus, the oxide semiconductor films 208a and 208c can be referred to as oxide insulating films for such properties and/or functions. Alternatively, a material that has a smaller electron affinity (a difference in energy level between the vacuum level and the conduction band minimum) than the oxide semiconductor film 208b and has a difference in energy level in the conduction band minimum from the oxide semiconductor film 208b (band offset) is used for the oxide semiconductor films 208a and 208c. Furthermore, to inhibit generation of a difference in threshold voltage due to the value of the drain voltage, it is preferable to form the oxide semiconductor films 208a and 208c using a material whose energy level of the conduction band minimum is closer to the vacuum level than that of the oxide semiconductor film 208b. For example, a difference between the energy level of the conduction band minimum of the oxide semiconductor film 208b and the energy level of the conduction band minimum of each of the oxide semiconductor films 208a and 208c is preferably greater than or equal to 0.2 eV, more preferably greater than or equal to 0.5 eV.

It is preferable that the oxide semiconductor films 208a and 208c not have a spinel crystal structure. This is because if the oxide semiconductor films 208a and 208c have a spinel crystal structure, constituent elements of the conductive films 212a and 212b might be diffused to the oxide semiconductor film 208b at the interface between the spinel crystal structure and another region. Note that each of the oxide semiconductor films 208a and 208c is preferably a CAAC-OS film, in which case a higher blocking property against constituent elements of the conductive films 212a and 212b, for example, copper elements, can be obtained.

The thickness of each of the oxide semiconductor films 208a and 208c is greater than or equal to a thickness that is capable of inhibiting diffusion of the constituent elements of the conductive films 212a and 212b to the oxide semiconductor film 208b, and less than a thickness that inhibits supply of oxygen from the insulating film 214 to the oxide semiconductor film 208b. For example, when the thickness of each of the oxide semiconductor films 208a and 208c is greater than or equal to 10 nm, diffusion of the constituent elements of the conductive films 212a and 212b to the oxide semiconductor film 208b can be inhibited. When the thickness of each of the oxide semiconductor films 208a and 208c is less than or equal to 100 nm, oxygen can be effectively supplied from the insulating film 214 to the oxide semiconductor film 208b.

Although the example where an oxide semiconductor film formed using a metal oxide target having an atomic ratio of metal elements, In:Ga:Zn=1:1:1.2, is used as each of the oxide semiconductor films 208a and 208c is described in this embodiment, one embodiment of the present invention is not limited thereto. For example, an oxide semiconductor film formed using a metal oxide target having an atomic ratio of In:Ga:Zn=1:1:1, In:Ga:Zn=1:3:2, In:Ga:Zn=1:3:4, or In:Ga:Zn=1:3:6, may be used as each of the oxide semiconductor films 208a and 208c.

When the oxide semiconductor films 208a and 208c are formed using a metal oxide target having an atomic ratio of In:Ga:Zn=1:1:1, the oxide semiconductor films 208a and 208c have an atomic ratio of In:Ga:Zn=1:$\beta$1 ($0 \leq \beta1 \leq 2$):$\beta$2 ($0 < \beta2 \leq 3$) in some cases. When the oxide semiconductor films 208a and 208c are formed using a metal oxide target having an atomic ratio of In:Ga:Zn=1:3:4, the oxide semiconductor films 208a and 208c have an atomic ratio of In:Ga:Zn=1:$\beta$3 ($1 \leq \beta3 \leq 5$):$\beta$4 ($2 \leq \beta4 \leq 6$) in some cases. When the oxide semiconductor films 208a and 208c are formed using a metal oxide target having an atomic ratio of In:Ga:Zn=1:3:6, the oxide semiconductor films 208a and 208c have an atomic ratio of In:Ga:Zn=1:$\beta$5 ($1 \leq \beta5 \leq 5$):$\beta$6 ($4 \leq \beta6 \leq 8$) in some cases.

Figure 41A:
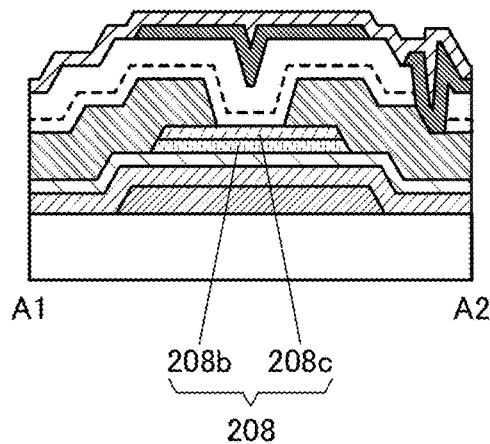
FIGS. 41A to 41D are cross-sectional views illustrating examples of a transistor.
Figure 41B:
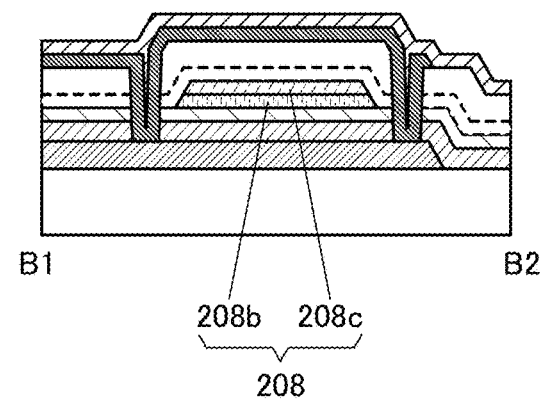

The drawings illustrate an example where the oxide semiconductor film 208 in the transistor 270 and the oxide semiconductor film 208c in the transistors 270A and 270B have a small thickness in a region that does not overlap with the conductive films 212a and 212b, that is, an example where part of the oxide semiconductor film has a depressed portion. However, one embodiment of the present invention is not limited thereto, and the oxide semiconductor film does not necessarily have a depressed region in a region that does not overlap with the conductive films 212a and 212b. FIGS. 41A and 41B illustrate examples in this case. FIGS. 41A and 41B are cross-sectional views illustrating an example of the transistor. FIGS. 41A and 41B illustrate a structure where the oxide semiconductor film 208 in the transistor 270B does not have a depressed portion.

Figure 41C:
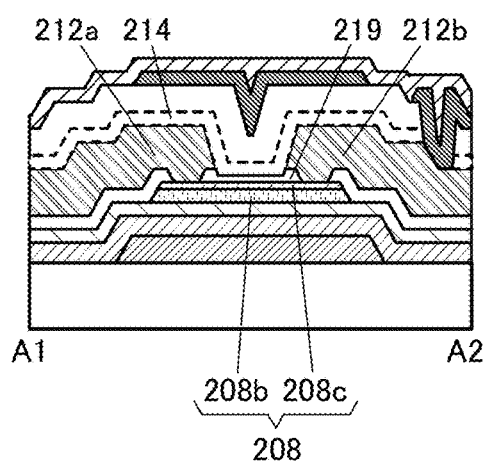
Figure 41D:
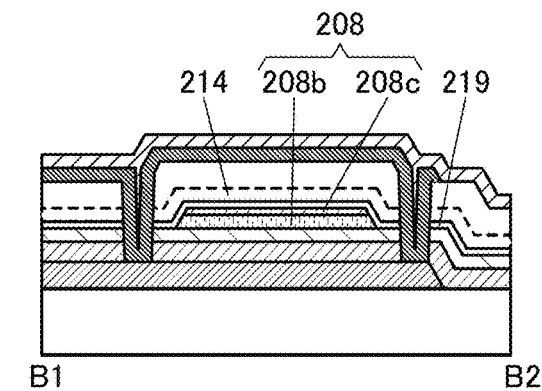

As illustrated in FIGS. 41C and 41D, the oxide semiconductor film 208c may be formed thinner than the oxide semiconductor film 208b in advance, and an insulating film 219 may further be formed over the oxide semiconductor film 208c and the insulating film 207. In that case, an opening for connecting the oxide semiconductor film 208c and the conductive films 212a and 212b is formed in the insulating film 219. The insulating film 219 can be formed with the same material and the same forming method as the insulating film 214.

The structures of the transistors of this embodiment can be freely combined with each other.

The structures, the methods, and the like described in this embodiment can be combined as appropriate with any of the structures, the methods, and the like described in the other embodiments.

Embodiment 4

In this embodiment, structure examples of a light-emitting element that can be used as the light-emitting element 280 are described. Note that an EL layer 1320 described in this embodiment corresponds to the EL layer 281 described in the other embodiments.

<Structure of Light-Emitting Element>

Figure 42A:
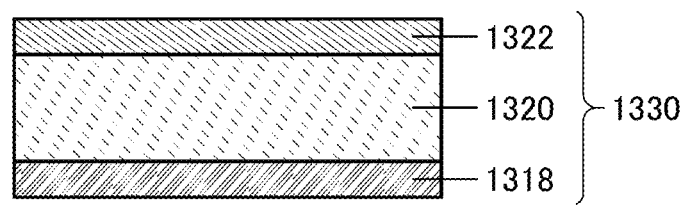
FIGS. 42A and 42B illustrate structure examples of light-emitting elements.

In a light-emitting element 1330 illustrated in FIG. 42A, the EL layer 1320 is sandwiched between a pair of electrodes (electrodes 1318 and 1322). Note that the electrode 1318 is used as an anode and the electrode 1322 is used as a cathode as an example in the following description of this embodiment.

The EL layer 1320 includes at least a light-emitting layer and may have a stacked-layer structure including a functional layer other than the light-emitting layer. As the functional layer other than the light-emitting layer, a layer containing a substance having a high hole-injection property, a substance having a high hole-transport property, a substance having a high electron-transport property, a substance having a high electron-injection property, a bipolar substance (a substance having high electron and hole transport properties), or the like can be used. Specifically, functional layers such as a hole-injection layer, a hole-transport layer, an electron-transport layer, and an electron-injection layer can be used in appropriate combination.

The light-emitting element 1330 illustrated in FIG. 42A emits light when current flows by applying a potential difference between the electrodes 1318 and 1322 and holes and electrons are recombined in the EL layer 1320. In other words, a light-emitting region is formed in the EL layer 1320.

In one embodiment of the present invention, light emitted from the light-emitting element 1330 is extracted to the outside from the electrode 1318 side or the electrode 1322 side. Thus, one of the electrodes 1318 and 1322 is formed using a light-transmitting substance.

Figure 42B:
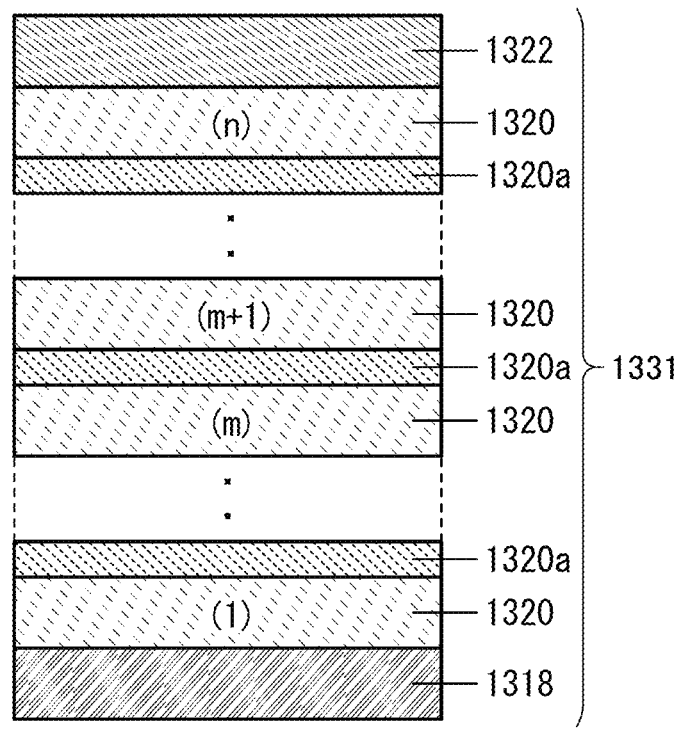

Note that a plurality of EL layers 1320 may be stacked between the electrodes 1318 and 1322 as in a light-emitting element 1331 illustrated in FIG. 42B. In the case where n (n is a natural number of 2 or more) layers are stacked, an electric charge generation layer 1320a is preferably provided between an m-th EL layer 1320 and an (m+1)th EL layer 1320. Note that m is a natural number greater than or equal to 1 and less than n. The components other than the electrodes 1318 and 1322 correspond to the EL layer 281 of the aforementioned Embodiments.

The electric charge generation layer 1320a can be formed using a composite material of an organic compound and a metal oxide. Examples of the metal oxide are vanadium oxide, molybdenum oxide, tungsten oxide, or the like. As the organic compound, a variety of compounds can be used; for example, an aromatic amine compound, a carbazole derivative, an aromatic hydrocarbon, and an oligomer, a dendrimer, and a polymer having a basic skeleton of these compounds can be used. Note that as the organic compound, it is preferable to use an organic compound that has a hole-transport property and has a hole mobility of $10^{-6}$ cm$^2$/Vs or higher. However, other substances may be used as long as their hole-transport properties are higher than their electron-transport properties. These materials used for the electric charge generation layer 1320a have excellent carrier-injection properties and carrier-transport properties; thus, the light-emitting element 1331 can be driven with low current and with low voltage. Other than the composite material, a material obtained by adding an alkali metal, an alkaline earth metal, a compound of the alkali metal, a compound of the alkaline earth metal, or the like to the composite material can be used for the electric charge generation layer 1320a.

Note that the electric charge generation layer 1320a may be formed by a combination of a composite material of an organic compound and a metal oxide with another material. For example, the electric charge generation layer 1320a may be formed by a combination of a layer containing the composite material of an organic compound and a metal oxide with a layer containing one compound selected from electron-donating substances and a compound having a high electron-transport property. Furthermore, the electric charge generation layer 1320a may be formed by a combination of a layer containing the composite material of an organic compound and a metal oxide with a transparent conductive film.

The light-emitting element 1331 having such a structure is unlikely to result in energy transfer between the neighboring EL layer 1320 and can easily realize high emission efficiency and a long lifetime. Furthermore, it is easy to obtain phosphorescence from one light-emitting layer and fluorescence from the other light-emitting layer.

The electric charge generation layer 1320a has a function of injecting holes to one of the EL layers 1320 that is in contact with the electric charge generation layer 1320a and a function of injecting electrons to the other EL layer 1320 that is in contact with the electric charge generation layer 1320a, when voltage is applied to the electrodes 1318 and 1322.

The light-emitting element 1331 illustrated in FIG. 42B can provide a variety of emission colors by changing the type of the light-emitting substance used for the EL layers 1320. In addition, a plurality of light-emitting substances having different emission colors may be used as the light-emitting substances, so that light emission having a broad spectrum or white light emission can be obtained.

In the case of obtaining white light emission using the light-emitting element 1331 in FIG. 42B, as for a combination of a plurality of EL layers, a structure for emitting white light including red light, blue light, and green light may be used. For example, the structure may include an EL layer containing a blue fluorescent substance as a light-emitting substance and an EL layer containing green and red phosphorescent substances as light-emitting substances. Alternatively, the structure may include an EL layer emitting red light, an EL layer emitting green light, and an EL layer emitting blue light. Further alternatively, with a structure including EL layers emitting light of complementary colors, white light emission can be obtained. In a stacked-layer element including two EL layers that emit lights with complementary colors, the combinations of colors are as follows: blue and yellow, blue-green and red, and the like.

Note that in the structure of the above stacked-layer element, by providing the electric charge generation layer between the stacked light-emitting layers, the element can exhibit light emission with high luminance at a low current density, and have a long lifetime.

This embodiment can be implemented in an appropriate combination with any of the structures described in the other embodiments.

Embodiment 5

In this embodiment, a display module and electronic devices that include the touch panel of one embodiment of the present invention is described with reference to FIG. 43, FIGS. 44A to 44H, and FIGS. 45A and 45B.

The touch panel of one embodiment of the present invention can be used for the touch panel 8004, for example.

Figure 43:
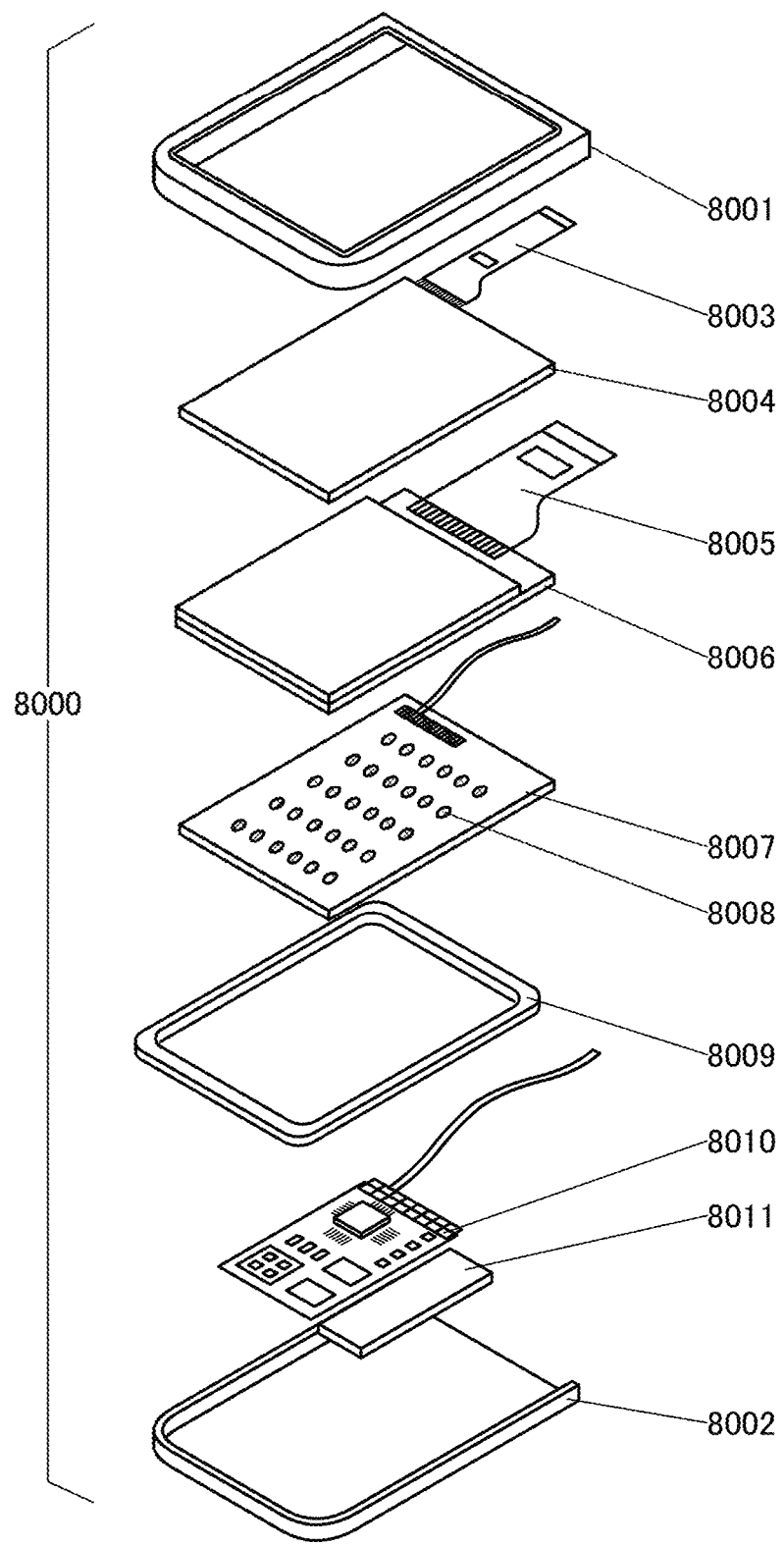
FIG. 43 illustrates a display module of one embodiment.

In a display module 8000 illustrated in FIG. 43, a touch panel 8004 connected to an FPC 8003, a display panel 8006 connected to an FPC 8005, a backlight 8007, a frame 8009, a printed board 8010, and a battery 8011 are provided between an upper cover 8001 and a lower cover 8002.

The display device of one embodiment of the present invention can be used for, for example, the display panel 8006.

The shapes and sizes of the upper cover 8001 and the lower cover 8002 can be changed as appropriate in accordance with the size of the touch panel 8004 and the display panel 8006.

The touch panel 8004 can be a resistive touch panel or a capacitive touch panel and may be formed so as to overlap with the display panel 8006. A counter substrate (sealing substrate) of the display panel 8006 can have a touch panel function. A photosensor may be provided in each pixel of the display panel 8006 so that an optical touch panel can be obtained.

The backlight 8007 includes a light source 8008. Note that although a structure in which the light source 8008 is provided over the backlight 8007 is illustrated in FIG. 43, one embodiment of the present invention is not limited to this structure. For example, a structure in which the light source 8008 is provided at an end portion of the backlight 8007 and a light diffusion plate is further provided may be employed. Note that the backlight 8007 needs not be provided in the case where a self-luminous light-emitting element such as an organic EL element is used or in the case where a reflective panel or the like is employed.

The frame 8009 protects the display panel 8006 and functions as an electromagnetic shield for blocking electromagnetic waves generated by the operation of the printed board 8010. The frame 8009 can also function as a radiator plate.

The printed board 8010 is provided with a power supply circuit and a signal processing circuit for outputting a video signal and a clock signal. As a power source for supplying electric power to the power supply circuit, an external commercial power source or a power source using the battery 8011 provided separately may be used. The battery 8011 can be omitted in the case of using a commercial power source.

The display module 8000 can be additionally provided with a component such as a polarizing plate, a retardation plate, or a prism sheet.

FIGS. 44A to 44H and FIGS. 45A and 45B illustrate electronic devices. These electronic devices can each include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone 5008, and the like.

Figure 44A:
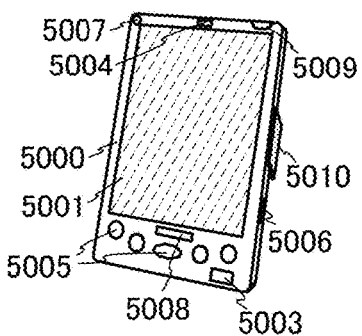
FIGS. 44A to 44H each illustrate an electronic device of one embodiment.
Figure 44B:
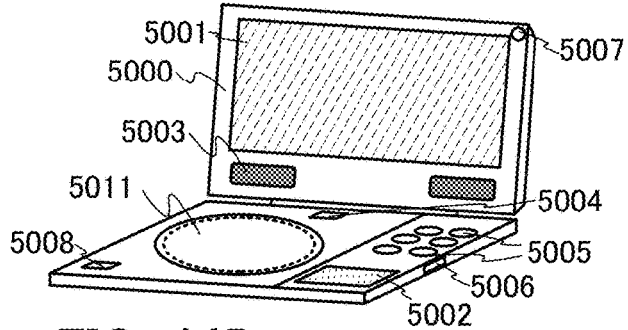
Figure 44C:
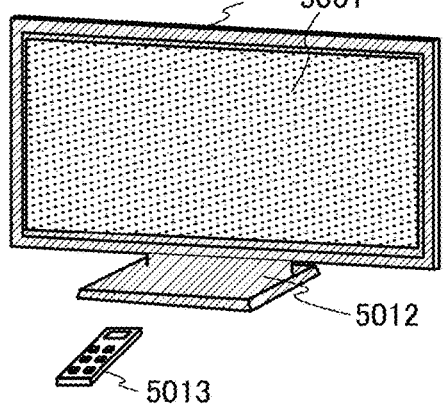
Figure 44D:
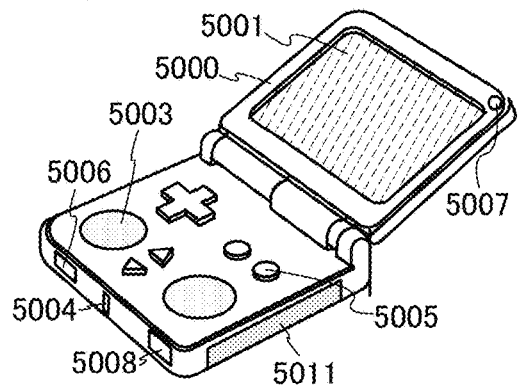
Figure 44E:
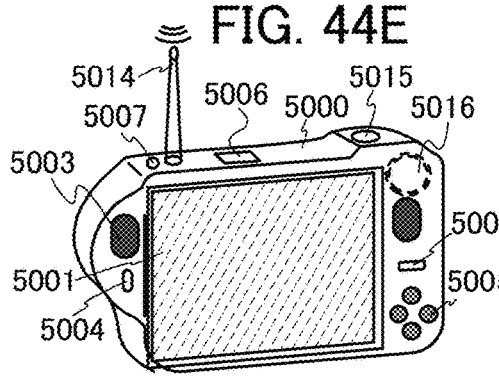
Figure 44F:
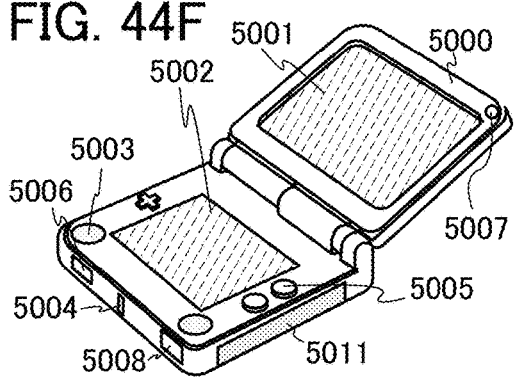
Figure 44G:
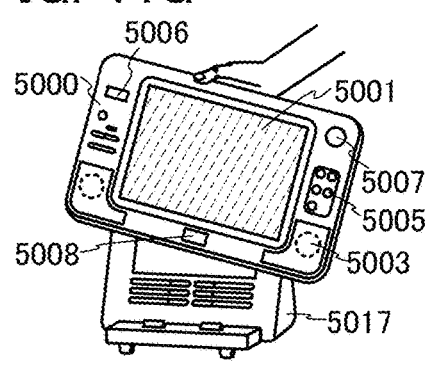
Figure 44H:
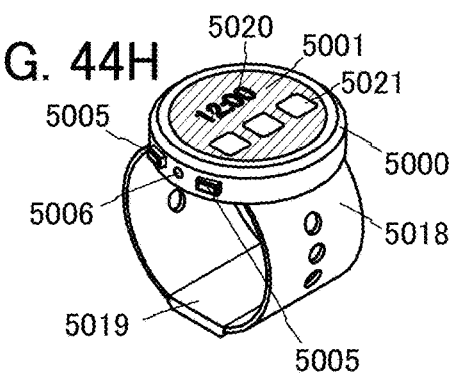
Figure 45A:
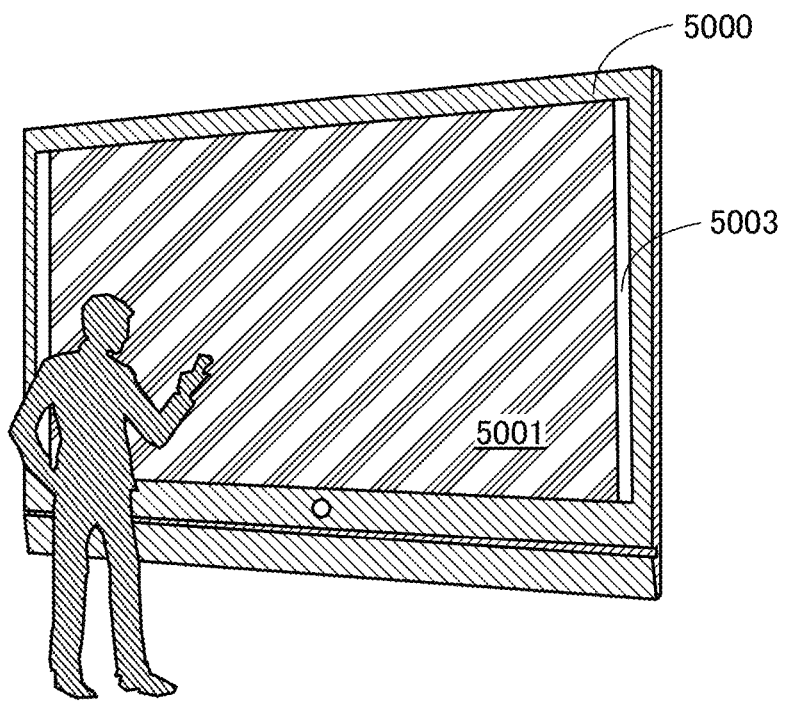
FIGS. 45A and 45B each illustrate an electronic device of one embodiment.
Figure 45B:
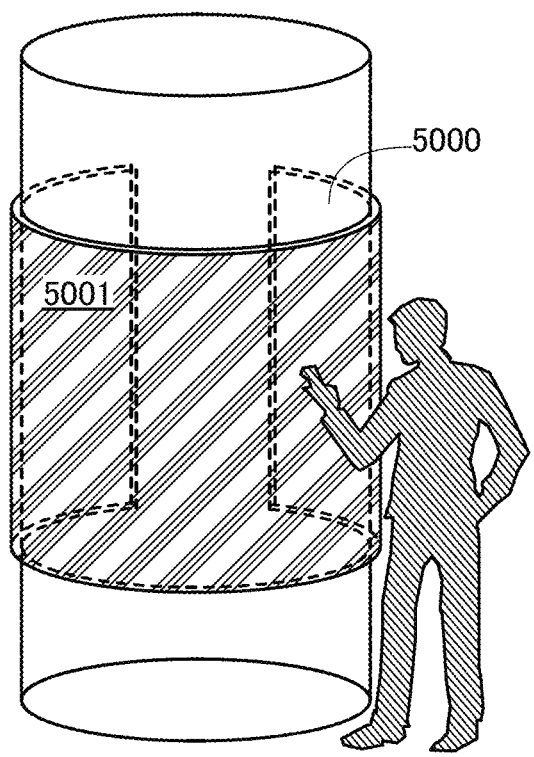

FIG. 44A illustrates a mobile computer, which can include a switch 5009, an infrared port 5010, and the like in addition to the above components. FIG. 44B illustrates a portable image reproducing device provided with a recording medium (e.g., a DVD reproducing device), which can include a second display portion 5002, a recording medium reading portion 5011, and the like in addition to the above components. FIG. 44C illustrates a television device, which can include a stand 5012 and the like in addition to the above components. The television device can be operated by an operation switch of the housing 5000 or a separate remote controller 5013. With operation keys of the remote controller 5013, channels and volume can be controlled, and images displayed on the display portion 5001 can be controlled. The remote controller 5013 may be provided with a display portion for displaying data output from the remote controller 5013. FIG. 44D illustrates a portable game machine, which can include the recording medium reading portion 5011 and the like in addition to the above components. FIG. 44E illustrates a digital camera that has a television reception function and can include an antenna 5014, a shutter button 5015, an image receiving portion 5016, and the like in addition to the above components. FIG. 44F illustrates a portable game machine, which can include the second display portion 5002, the recording medium reading portion 5011, and the like in addition to the above components. FIG. 44G illustrates a portable television receiver, which can include a charger 5017 capable of transmitting and receiving signals, and the like in addition to the above components. FIG. 44H illustrates a wrist-watch-type information terminal, which can include a band 5018, a clasp 5019, and the like in addition to the above components. The display portion 5001 mounted in the housing 5000 also serving as a bezel includes a non-rectangular display region. The display portion 5001 can display an icon 5020 indicating time, another icon 5021, and the like. FIG. 45A illustrates a digital signage. FIG. 45B illustrates a digital signage mounted on a cylindrical pillar.

The electronic devices illustrated in FIGS. 44A to 44H and FIGS. 45A and 45B can have a variety of functions, for example, a function of displaying a variety of information (e.g., a still image, a moving image, and a text image) on a display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading a program or data stored in a recording medium and displaying the program or data on a display portion. Furthermore, the electronic device including a plurality of display portions can have a function of displaying image information mainly on one display portion while displaying text information mainly on another display portion, a function of displaying a three-dimensional image by displaying images where parallax is utilized on a plurality of display portions, or the like. Furthermore, the electronic device including an image receiving portion can have a function of photographing a still image, a function of photographing a moving image, a function of automatically or manually correcting a photographed image, a function of storing a photographed image in a recording medium (an external recording medium or a recording medium incorporated in the camera), a function of displaying a photographed image on a display portion, or the like. Note that the functions of the electronic devices illustrated in FIGS. 44A to 44H and FIGS. 45A and 45B are not limited thereto, and the electronic devices can have a variety of functions.

The electronic devices in this embodiment each include a display portion for displaying some kind of information. The touch panel of one embodiment of the present invention can be used for the display portion.

At least part of this embodiment can be implemented in combination with any of the other embodiments described in this specification as appropriate.

This application is based on Japanese Patent Application serial No. 2015-081455 filed with Japan Patent Office on Apr. 13, 2015, the entire contents of which are hereby incorporated by reference.

What is claimed is:

1. A semiconductor device comprising:
   a transistor;
   a second insulating film; and
   a touch sensor,
   wherein the transistor comprises:
      a gate electrode;
      a gate insulating film in contact with the gate electrode;
      a first oxide semiconductor film that is in contact with the gate insulating film and overlaps with the gate electrode;
      a source electrode and a drain electrode that are electrically connected to the first oxide semiconductor film;
      a first insulating film over the first oxide semiconductor film, the source electrode, and the drain electrode; and
      a second oxide semiconductor film that is over the first insulating film and overlaps with the first oxide semiconductor film,
   wherein the second insulating film is over the second oxide semiconductor film so that the second oxide semiconductor film is positioned between the first insulating film and the second insulating film,
   wherein the touch sensor comprises:
      a first electrode; and
      a second electrode,
   wherein one of the first electrode and the second electrode comprises a third oxide semiconductor film, and
   wherein the second oxide semiconductor film and the third oxide semiconductor film are formed in the same layer.

2. The semiconductor device according to claim 1, wherein each thickness of the second oxide semiconductor film and the third oxide semiconductor film is greater than or equal to 30 nm and less than or equal to 70 nm.

3. The semiconductor device according to claim 1, wherein the first oxide semiconductor film, the second oxide semiconductor film, and the third oxide semiconductor film are each an In-M-Zn oxide, and
   wherein M is Al, Ti, Ga, Y, Zr, La, Ce, Nd, Sn, or Hf.

4. The semiconductor device according to claim 1,
   wherein the first insulating film comprises oxygen, and
   wherein the second insulating film comprises hydrogen.

5. The semiconductor device according to claim 1, further comprising a capacitor that comprises the second insulating film between a pair of electrodes,
   wherein the capacitor transmits visible light, and
   wherein one of the pair of electrodes of the capacitor comprises the third oxide semiconductor film.

6. The semiconductor device according to claim 5, wherein the first electrode and the second electrode each comprise the third oxide semiconductor film.

7. A touch panel comprising:
the semiconductor device according to claim 5;
a conductive film; and
a liquid crystal element,
wherein the conductive film serves as a pixel electrode,
wherein the third oxide semiconductor film serves as a common electrode, and
wherein the other of the pair of electrodes of the capacitor comprises the conductive film.

8. A touch panel comprising:
the semiconductor device according to claim 5;
a conductive film; and
a liquid crystal element,
wherein the third oxide semiconductor film serves as a pixel electrode,
wherein the conductive film serves as a common electrode, and
wherein the other of the pair of electrodes of the capacitor comprises the conductive film.

9. A touch panel comprising:
the semiconductor device according to claim 1; and
a light-emitting element,
wherein the light-emitting element comprises:
 a lower electrode;
 an upper electrode; and
 an EL layer positioned between the lower electrode and the upper electrode.

10. The touch panel according to claim 9, wherein the first electrode and the second electrode each comprise the third oxide semiconductor film.

11. The touch panel according to claim 9, wherein the other of the first electrode and the second electrode serves as the upper electrode.

12. An electronic device comprising:
the semiconductor device according to claim 1; and
a switch, a speaker, a display portion, or a housing.

13. An electronic device comprising:
the touch panel according to claim 7; and
a switch, a speaker, a display portion, or a housing.

14. A semiconductor device comprising:
a transistor comprising a gate electrode, a gate insulating film, and a first oxide semiconductor film between the gate electrode and the gate insulating film;
an insulating film over the transistor;
a touch sensor comprising a first electrode and a second electrode; and
a capacitor comprising the second electrode, a third electrode, and the insulating film between the second electrode and the third electrode,
wherein the capacitor transmits visible light, and
wherein the second electrode comprises a second oxide semiconductor film.

15. The semiconductor device according to claim 14, wherein a thickness of the second oxide semiconductor film is greater than or equal to 30 nm and less than or equal to 70 nm.

16. The semiconductor device according to claim 14, wherein the first oxide semiconductor film and the second oxide semiconductor film are each an In-M-Zn oxide, and
wherein M is Al, Ti, Ga, Y, Zr, La, Ce, Nd, Sn, or Hf.

17. The semiconductor device according to claim 14, wherein the insulating film comprises hydrogen.

18. A touch panel comprising:
the semiconductor device according to claim 14; and
a light-emitting element,
wherein the light-emitting element comprises:
 a lower electrode;
 an upper electrode; and
 an EL layer positioned between the lower electrode and the upper electrode.

19. An electronic device comprising:
the semiconductor device according to claim 14; and
a switch, a speaker, a display portion, or a housing.

* * * * *